(12) United States Patent
Onuki et al.

(10) Patent No.: US 11,101,300 B2
(45) Date of Patent: Aug. 24, 2021

(54) SEMICONDUCTOR DEVICE AND MANUFACTURING METHOD OF SEMICONDUCTOR DEVICE

(71) Applicant: Semiconductor Energy Laboratory Co., Ltd., Atsugi (JP)

(72) Inventors: Tatsuya Onuki, Atsugi (JP); Kiyoshi Kato, Atsugi (JP); Shuhei Nagatsuka, Atsugi (JP); Takanori Matsuzaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 8 days.

(21) Appl. No.: 16/628,920

(22) PCT Filed: Jul. 13, 2018

(86) PCT No.: PCT/IB2018/055176
§ 371 (c)(1),
(2) Date: Jan. 6, 2020

(87) PCT Pub. No.: WO2019/021098
PCT Pub. Date: Jan. 31, 2019

(65) Prior Publication Data
US 2020/0144310 A1     May 7, 2020

(30) Foreign Application Priority Data
Jul. 26, 2017   (JP) .............................. JP2017-144764

(51) Int. Cl.
*H01L 29/10*     (2006.01)
*H01L 27/12*     (2006.01)

(52) U.S. Cl.
CPC ...... *H01L 27/1255* (2013.01); *H01L 27/1225* (2013.01)

(58) Field of Classification Search
CPC .. H01L 27/1255; H01L 27/13; H01L 27/3265
(Continued)

(56) References Cited

U.S. PATENT DOCUMENTS

| | | |
|---|---|---|
| 6,184,549 B1 | 2/2001 | Furukawa et al. |
| 6,225,158 B1 | 5/2001 | Furukawa et al. |

(Continued)

FOREIGN PATENT DOCUMENTS

| | | |
|---|---|---|
| JP | 08-125034 A | 5/1996 |
| JP | 2007-096055 A | 4/2007 |

(Continued)

OTHER PUBLICATIONS

International Search Report (Application No. PCT/IB2018/055176) dated Oct. 23, 2018.

(Continued)

*Primary Examiner* — Tan N Tran
(74) *Attorney, Agent, or Firm* — Robinson Intellectual Property Law Office; Eric J. Robinson

(57) ABSTRACT

A semiconductor device enabling high integration is provided. The semiconductor device includes a plug, two capacitors, and two transistors sharing one oxide semiconductor. Each of the transistors includes a stacked-layer structure of a gate insulator and a gate electrode over the oxide semiconductor and an insulator in contact with a side surface of the gate electrode. An opening between the two gate electrodes exposes the insulators in contact with the side surfaces of the gate electrodes, and the plug is in the opening. The capacitor is directly provided over the oxide semiconductor. The side surface area of the capacitor is larger than the projected area of the capacitor.

7 Claims, 37 Drawing Sheets

(58) Field of Classification Search
USPC .............................................. 257/43, 59, 72
See application file for complete search history.

(56) References Cited

U.S. PATENT DOCUMENTS

| | | |
|---|---|---|
| 6,576,947 B1 | 6/2003 | Kim |
| 7,674,650 B2 | 3/2010 | Akimoto et al. |
| 8,686,486 B2 | 4/2014 | Kato et al. |
| 8,811,064 B2 | 8/2014 | Yamazaki et al. |
| 8,860,108 B2 | 10/2014 | Yamazaki et al. |
| 9,647,125 B2 | 5/2017 | Yamazaki et al. |
| 10,217,736 B2 | 2/2019 | Kato et al. |
| 10,411,013 B2 | 9/2019 | Godo et al. |
| 2002/0101754 A1 | 8/2002 | Hidaka et al. |
| 2007/0197031 A1 | 8/2007 | Uhlenbrock et al. |
| 2012/0270375 A1* | 10/2012 | Sasagawa ......... H01L 29/78603 438/270 |
| 2016/0099259 A1 | 4/2016 | Okazaki et al. |
| 2016/0260835 A1 | 9/2016 | Yamazaki et al. |
| 2017/0033111 A1 | 2/2017 | Yamazaki et al. |
| 2017/0221899 A1 | 8/2017 | Uesugi et al. |
| 2020/0126992 A1 | 4/2020 | Yamazaki et al. |

FOREIGN PATENT DOCUMENTS

| | | |
|---|---|---|
| JP | 2007-123861 A | 5/2007 |
| JP | 2011-119674 A | 6/2011 |
| JP | 2012-235103 A | 11/2012 |
| JP | 2016-072633 A | 5/2016 |
| JP | 2016-174147 A | 9/2016 |
| JP | 2017-034249 A | 2/2017 |

OTHER PUBLICATIONS

Written Opinion (Application No. PCT/IB2018/055176) dated Oct. 23, 2018.

* cited by examiner

FIG. 1A
FIG. 1C
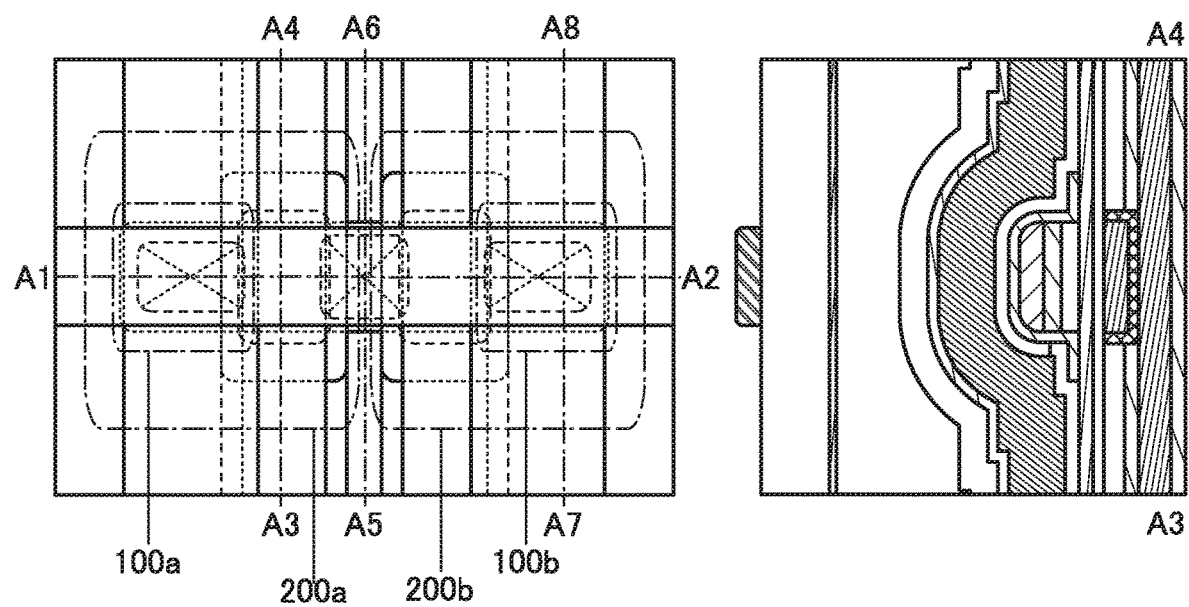
FIG. 1B
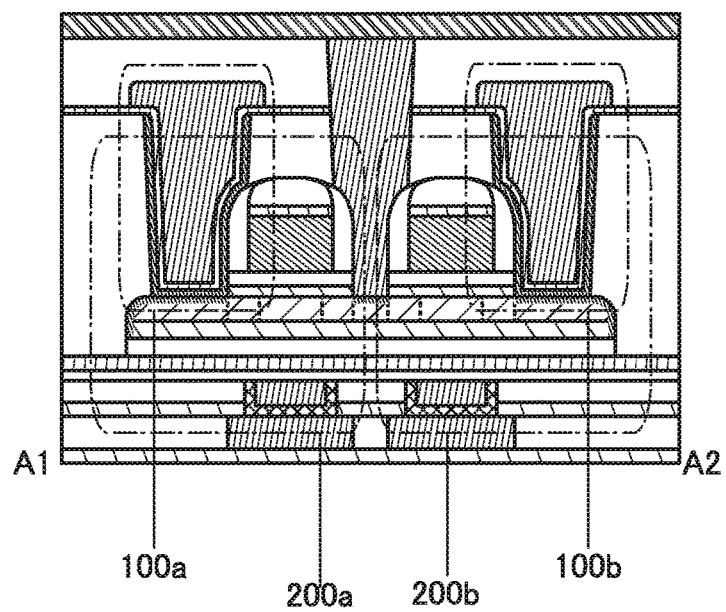

SEMICONDUCTOR DEVICE AND MANUFACTURING METHOD OF SEMICONDUCTOR DEVICE

TECHNICAL FIELD

One embodiment of the present invention relates to a semiconductor device and a driving method thereof. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

BACKGROUND ART

A technique in which a transistor is formed using a semiconductor thin film has attracted attention. The transistor is used in a wide range of electronic devices such as an integrated circuit (IC) and an image display device (also simply referred to as a display device). A silicon-based semiconductor material is widely known as a material for a semiconductor thin film applicable to the transistor; in addition, an oxide semiconductor has attracted attention as another material.

For example, techniques have been disclosed by each of which a display device is manufactured using a transistor whose active layer is formed of zinc oxide or an In—Ga—Zn-based oxide as an oxide semiconductor (see Patent Documents 1 and 2).

In recent years, a technique has been disclosed by which an integrated circuit of a memory device is manufactured using a transistor including an oxide semiconductor (see Patent Document 3). Furthermore, not only memory devices but also arithmetic devices and the like are manufactured using transistors including oxide semiconductors.

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119674

DISCLOSURE OF INVENTION

The integration of integrated circuits and miniaturization of transistors have progressed with an increase in performance and a reduction in size and weight of electronic devices. Thus, the process rule for fabricating a transistor has decreased year by year as follows: 45 nm, 32 nm, and 22 nm. Accordingly, transistors with fine structures including oxide semiconductors are required to have good electrical characteristics as designed.

An object of one embodiment of the present invention is to provide a semiconductor device that can be miniaturized or highly integrated. Another object of one embodiment of the present invention is to provide a semiconductor device having favorable electrical characteristics. Another object of one embodiment of the present invention is to provide a semiconductor device with low off-state current. Another object of one embodiment of the present invention is to provide a transistor with high on-state current. Another object of one embodiment of the present invention is to provide a highly reliable semiconductor device. Another object of one embodiment of the present invention is to provide a semiconductor device with low power consumption. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a low-power semiconductor device. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first transistor, a second transistor, a first capacitor, a second capacitor, and a plug. The first transistor includes an oxide semiconductor, a first insulator over the oxide semiconductor, a first conductor over the first insulator, and a second insulator in contact with a side surface of the first conductor. The second transistor includes the oxide semiconductor, a third insulator over the oxide semiconductor, a second conductor over the third insulator, and a fourth insulator in contact with a side surface of the second conductor. The first capacitor includes a third conductor over the oxide semiconductor and in contact with the second insulator, a fifth insulator over the third conductor, and a fourth conductor over the fifth insulator. The second capacitor includes a fifth conductor over the oxide semiconductor and in contact with the fourth insulator, the fifth insulator over the fifth conductor, and a sixth conductor over the fifth insulator. The plug is in contact with the oxide semiconductor, the second insulator, and the fourth insulator. A side surface area of the first capacitor is larger than a projected area of the first capacitor. A side surface area of the second capacitor is larger than a projected area of the second capacitor.

The above semiconductor device further includes a sixth insulator over the first transistor and the second transistor, and a seventh insulator over the first capacitor, the second capacitor, and the sixth insulator. The sixth insulator includes a first opening exposing the first insulator and a second opening exposing the third insulator. The first capacitor is in the first opening. The second capacitor is in the second opening. The sixth insulator and the seventh insulator include a third opening exposing the first insulator and the second insulator. The plug is in the third opening.

The above semiconductor device further includes a seventh conductor over the seventh insulator and the plug. The seventh conductor is electrically connected to the plug.

In the above semiconductor device, the first conductor and the second conductor extend in a direction substantially perpendicular to a channel length direction of the first transistor, and the seventh conductor extends in a direction substantially parallel to the channel length direction of the first transistor.

In the above semiconductor device, the oxide semiconductor includes In, an element M (M is Al, Ga, Y, or Sn), and Zn.

According to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device with low off-state current can be provided. According to one embodiment of the present invention, a transistor with high on-state current can be provided. According to one embodiment of the present invention, a semiconductor device with high reliability can be provided. According to one embodiment of the present invention, a semiconductor device with low power consumption can be provided. According to one embodiment of the present invention, a semiconductor device with high productivity can be provided.

A semiconductor device capable of retaining data for a long time can be provided. A semiconductor device capable of high-speed data writing can be provided. A semiconductor device with high design flexibility can be provided. A low-power semiconductor device can be provided. A novel semiconductor device can be provided.

Note that the descriptions of these effects do not disturb the existence of other effects. One embodiment of the present invention does not have to have all the effects listed above. Other effects will be apparent from and can be derived from the description of the specification, the drawings, the claims, and the like.

BRIEF DESCRIPTION OF DRAWINGS

FIGS. 1A to 1C are a top view and cross sections of a semiconductor device according to one embodiment of the present invention.

BEST MODE FOR CARRYING OUT THE INVENTION

Figure 2A:
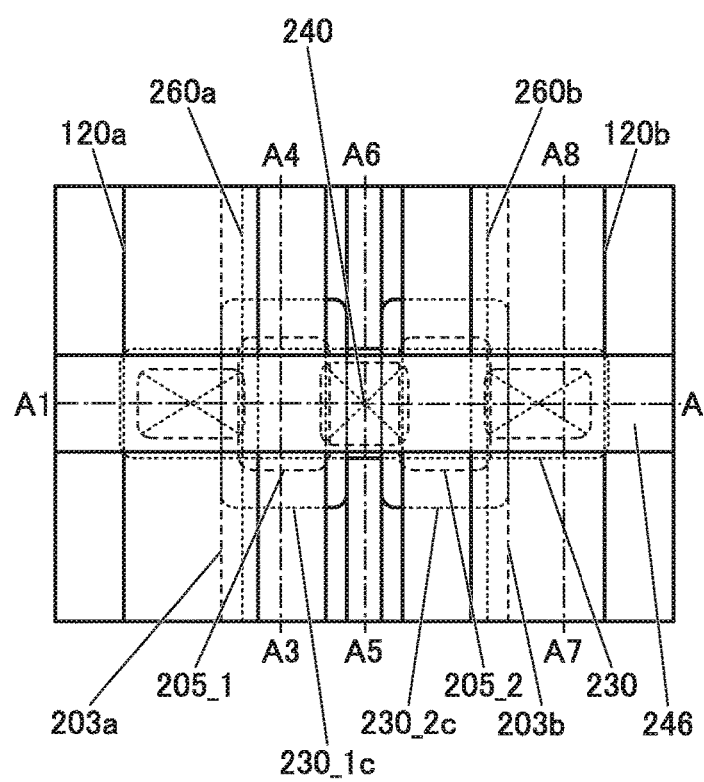
FIGS. 2A to 2C are a top view and cross sections of a semiconductor device according to one embodiment of the present invention.

Embodiments will be described below with reference to the accompanying drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. The same hatching pattern is applied to portions having similar functions, and the portions are not especially denoted by reference numerals in some cases.

Especially in a top view (also referred to as a "plan view"), a perspective view, or the like, some components might not be illustrated for easy understanding of the invention. In addition, some hidden lines and the like might not be shown.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement (e.g., over, above, under, and below) are used for convenience in describing a positional relation between components with reference to drawings. Further, the positional relation between components is changed as appropriate in accordance with a direction in which each component is described. Thus, terms for the description are not limited to those used in this specification, and the description can change appropriately depending on the situation.

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of different polarity is employed or a direction of current flow is changed in circuit operation, for example. Therefore, the terms "source" and "drain" can be switched in some cases in this specification and the like.

Note that the channel length refers to, for example, the distance between a source and a drain in a region where a semiconductor (or a portion where a current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

The channel width refers to, for example, the length of a channel formation region perpendicular to a channel length direction in a region where a semiconductor (or a portion where a current flows in a semiconductor when a transistor is on) and a gate electrode overlap with each other, or in a region where a channel is formed in a top view of the transistor. In one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in a side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is a known one. Accordingly, in the case where the shape of a semiconductor is not known accurately, it is difficult to measure an effective channel width accurately.

Thus, in this specification, an apparent channel width is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width. Note that a channel length, a channel width, an effective channel width, an apparent channel width, a surrounded channel width, and the like can be determined by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, the density of states (DOS) in a semiconductor may be increased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. For an oxide semiconductor, water also serves as an impurity in some cases. For an oxide semiconductor, entry of impurities may lead to formation of oxygen vacancies, for example. When the semiconductor is silicon, examples of an impurity which changes the characteristics of the semiconductor include oxygen, Group 1 elements except hydrogen, Group 2 elements, Group 13 elements, and Group 15 elements.

In this specification and the like, a silicon oxynitride film contains more oxygen than nitrogen. A silicon oxynitride film preferably contains, for example, oxygen, nitrogen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively. A silicon nitride oxide film contains more nitrogen than oxygen. A silicon nitride oxide film preferably contains nitrogen, oxygen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In addition, in this specification and the like, the term "insulator" can be replaced with the term "insulating film" or "insulating layer". Moreover, the term "conductor" can be replaced with the term "conductive film" or "conductive layer". Furthermore, the term "semiconductor" can be replaced with the term "semiconductor film" or "semiconductor layer."

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "Vth") is higher than 0 V.

In this specification and the like, the term "parallel" indicates that the angle formed between two straight lines is greater than or equal to −10° and less than or equal to 10°. Thus, the case where the angle is greater than or equal to −5° and less than or equal to 50 is also included. In addition, the term "substantially parallel" indicates that the angle formed between two straight lines is greater than or equal to −30° and less than or equal to 300. The term "perpendicular" indicates that the angle formed between two straight lines is greater than or equal to 800 and less than or equal to 1000. Thus, the case where the angle is greater than or equal to 85° and less than or equal to 950 is also included. In addition, the term "substantially perpendicular" indicates that the angle formed between two straight lines is greater than or equal to 600 and less than or equal to 1200.

In this specification, trigonal and rhombohedral crystal systems are included in a hexagonal crystal system.

Note that in this specification, a barrier film refers to a film having a function of inhibiting the penetration of oxygen and impurities such as hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS field effect transistor (FET) is a transistor including an oxide or an oxide semiconductor.

Embodiment 1

A semiconductor device of one embodiment of the present invention includes an oxide in a channel formation region. This embodiment will describe one embodiment of the semiconductor device with reference to FIGS. 1A to 23B.

<Structure Example of Semiconductor Device>

An example of a semiconductor device of one embodiment of the present invention including a transistor 200a, a transistor 200b, a capacitor 100a, and a capacitor 100b is described below. One embodiment of the semiconductor device is described with reference to FIGS. 1A to 20C below.

Figure 2C:
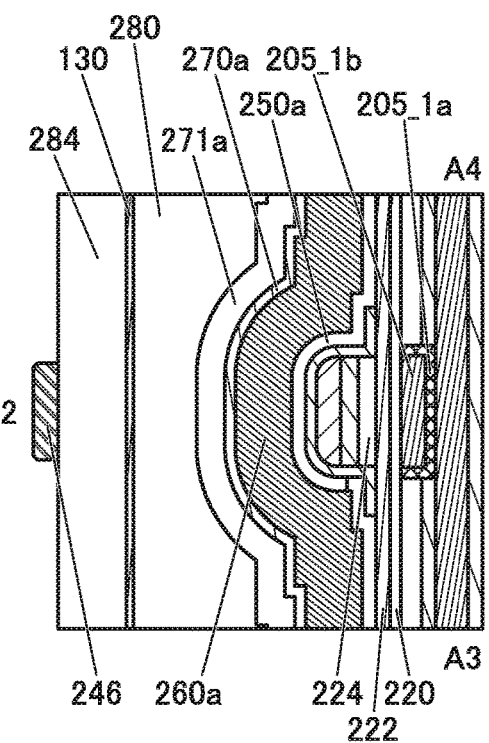
Figure 2B:
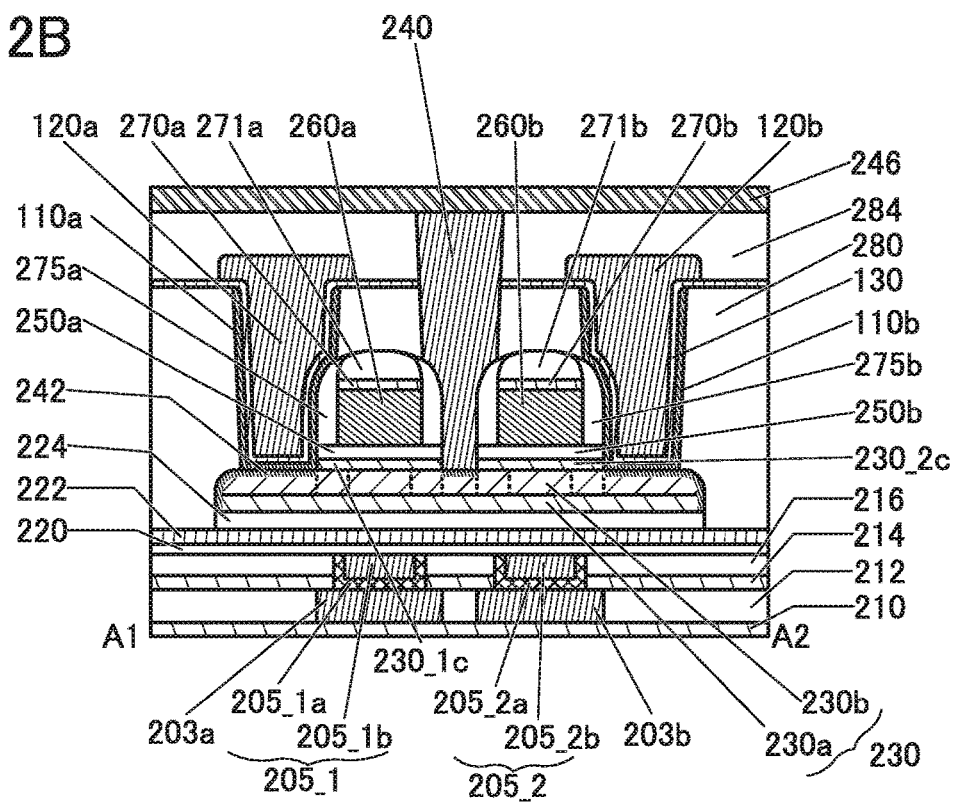

FIG. 1A and FIG. 2A are top views of the semiconductor device including the transistor 200a, the transistor 200b, the capacitor 100a, and the capacitor 100b. FIG. 1B and FIG. 2B are cross sections taken along dashed-dotted lines A1-A2 in FIG. 1A and FIG. 2A, respectively. FIG. 1C and FIG. 2C are cross sections taken along dashed-dotted lines A3-A4 in FIG. 1A and FIG. 2A, respectively. Note that some components are not illustrated in the top views of FIG. 1A and FIG. 2A for simplification of the drawings. In FIGS. 2A to 2C, the components in FIGS. 1A to 1C are denoted by reference numerals.

The semiconductor device of one embodiment of the present invention includes the transistors 200a and 200b, the capacitors 100a and 100b, and insulators 210, 212, 280, and 284 functioning as interlayer films as shown in FIGS. 1A to 1C and FIGS. 2A to 2C. Furthermore, the semiconductor device includes a conductor 203a which is electrically connected to the transistor 200a and functions as a wiring, a conductor 203b which is electrically connected to the transistor 200b and functions as a wiring, a conductor 240 which functions as a plug, and a conductor 246 which is electrically connected to the conductor 240 and functions as a wiring.

The conductors 203a and 203b are formed to be embedded in the insulator 212. Here, top surfaces of the conductors 203a and 203b can be substantially level with a top surface of the insulator 212. Note that although the conductors 203a and 203b are each illustrated as having a single layer structure, the present invention is not limited thereto. For example, the conductors 203a and 203b may each have a multilayer structure of two or more layers.

Here, the transistor 200a and the transistor 200b shown in FIG. 1A are symmetric with respect to an intersection point of the dashed-dotted line A1-A2 and a dashed-dotted line A5-A6.

Similarly, the capacitor 100a and the capacitor 100b shown in FIG. 1A are symmetric with respect to the intersection point of the dashed-dotted line A1-A2 and the dashed-dotted line A5-A6.

In the above structure, the transistor 200a and the transistor 200b can be connected to the conductor 240 functioning as a common plug. In other words, a wiring electrically connected to one of a source and a drain of the transistor 200a can also be used as a wiring electrically connected to one of a source and a drain of the transistor 200b. Thus, an area occupied by the semiconductor device including the transistor 200a, the transistor 200b, the capacitor 100a, and the capacitor 100b can be reduced.

Furthermore, the insulator 280 is preferably provided to cover the transistor 200a and the transistor 200b in the semiconductor device. The concentration of impurities such as water or hydrogen in the insulator 280 is preferably lowered.

An opening in the insulator 280 is formed to expose a side surface of an insulator 275a of the transistor 200a and a side surface of an insulator 275b of the transistor 200b. To form such a structure, the etching rates of the insulators 275a and 275b are preferably much lower than the etching rate of the insulator 280 at the time of forming the opening in the insulator 280. When the etching rates of the insulators 275a and 275b are 1, the etching rate of the insulator 280 is preferably 5 or more, further preferably 10 or more. This allows the opening to be formed in a self-aligned manner and enables the design with a small distance between the opening and a gate electrode, leading to a highly integrated semiconductor device.

Here, the conductor 240 is formed in contact with the inner wall of the opening in the insulator 280. A region 231 of an oxide 230 is positioned on at least part of a bottom portion of the opening, and thus the conductor 240 is in contact with the region 231 (see FIG. 5).

The conductor 240 may be formed after aluminum oxide is formed on a side wall portion of the opening. By forming aluminum oxide on the side wall portion of the opening, the passage of oxygen from the outside can be inhibited and oxidation of the conductor 240 can be prevented. Furthermore, impurities such as water or hydrogen can be prevented from being diffused from the conductor 240 to the outside.

The aluminum oxide can be formed by forming aluminum oxide in the opening by an ALD method or the like and then performing anisotropic etching.

The conductor 240 functions as one of a source electrode and a drain electrode of the transistor 200a and as one of a source electrode and a drain electrode of the transistor 200b. Such a structure enables a reduction in the distance between the transistors 200a and 200b adjacent to each other. Consequently, the transistors can be arranged with high density, leading to the highly integrated semiconductor device.

Figure 4A:
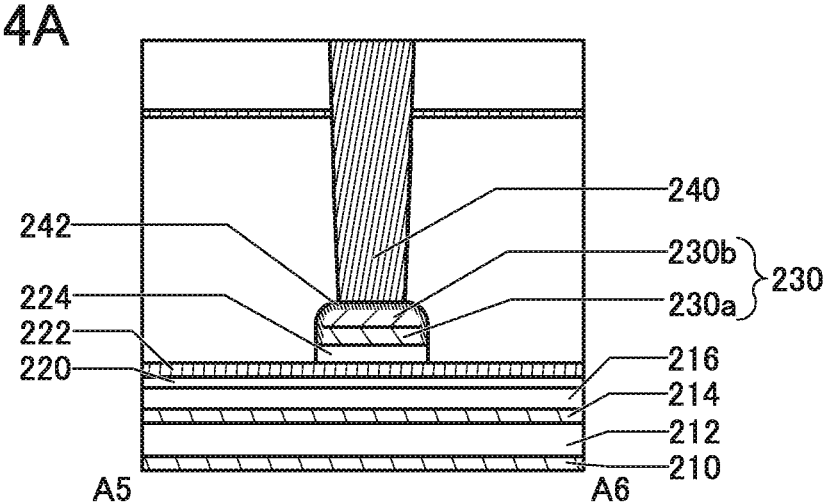
FIGS. 4A to 4C are each a cross section of a semiconductor device according to one embodiment of the present invention.
Figure 4B:
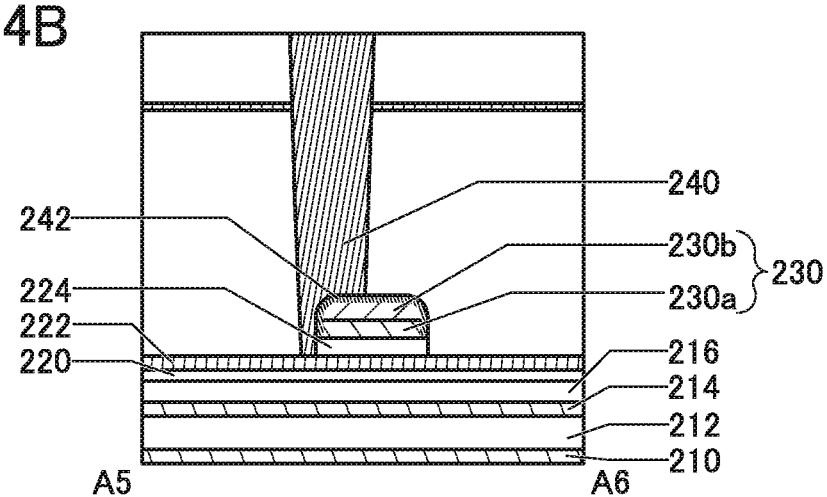
Figure 4C:
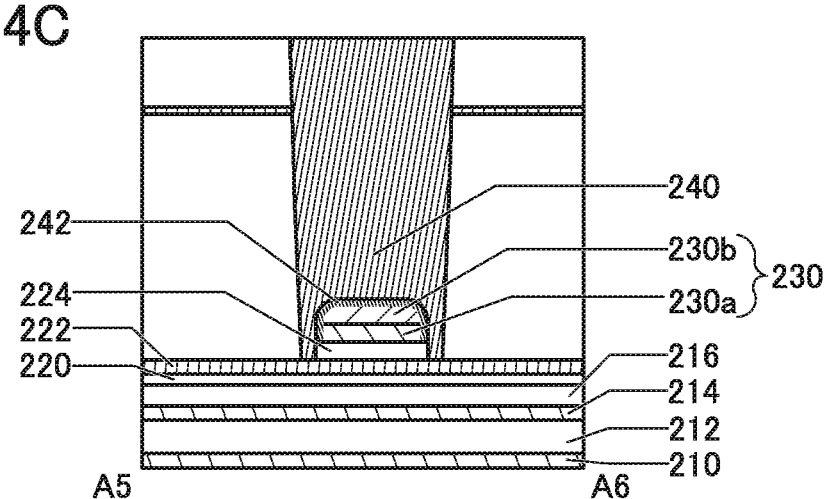

FIGS. 4A to 4C are each a cross section taken along dashed-dotted line A5-A6 in FIG. 2A. That is, they are each a cross section of a region in which the conductor 240 is in contact with the oxide 230 (oxides 230a and 230b) of the transistors 200a and 200b.

FIG. 4A illustrates an example where the conductor 240 is in contact with a top surface of the oxide 230. That is, in the channel width direction (the A5-A6 direction), a width of a surface where the conductor 240 and the oxide 230 are in contact with each other may be smaller than a width of the oxide 230.

As illustrated in FIG. 4B, the conductor 240 may be in contact with the top surface and a side surface of the oxide 230. FIG. 4B illustrates an example of a region in which the conductor 240 is in contact with a side surface of the oxide 230 on the A5 side. Note that the conductor 240 may include a region in contact with a side surface of the oxide 230 on the A6 side. With such a structure, the area of the region where the conductor 240 and the oxide 230 are in contact with each other can be increased. Thus, the contact resistance between the conductor 240 and the oxide 230 can be reduced.

In some cases, the conductor 240 may be in contact with the top surface of the oxide 230 and the both side surfaces of the oxide 230 on the A5 and A6 sides as illustrated in FIG. 4C. In other words, the region where the conductor 240 is in contact with the oxide 230 has a cross-sectional shape like a saddle (such a structure can be referred to as a saddle-surface contact). With such a structure, the area of the region where the conductor 240 is in contact with the oxide 230 can be increased. Thus, the contact resistance between the conductor 240 and the oxide 230 can be further reduced.

The other of the source and the drain of the transistor 200a and the capacitor 100a overlap with each other. Similarly, the other of the source and the drain of the transistor 200b and the capacitor 100b overlap with each other. It is particularly preferable that the side surface area of each of the capacitors 100a and 100b be larger than its bottom surface area (such a structure is also referred to as a cylinder capacitor in the following description). Thus, the capacitance per projected area of the capacitor 100a or the capacitor 100b can be large.

In the semiconductor device of one embodiment of the present invention, the transistor 200a, the transistor 200b, the capacitor 100a, and the capacitor 100b can be provided on the same layer as described above. With such a structure, the transistors and the capacitors can be arranged with high density; thus, the semiconductor device with high integration can be obtained.

One electrode of the capacitor 100a is in contact with the other of the source and the drain of the transistor 200a. Similarly, one electrode of the capacitor 100b is in contact with the other of the source and the drain of the transistor 200b. With the structure, steps for making a contact between the capacitor 100a and the transistor 200a and steps for making a contact between the capacitor 100b and the transistor 200b can be reduced in number. Accordingly, the number of steps and the manufacturing cost can be reduced.

According to one embodiment of the present invention, the plurality of capacitors, the plurality of transistors, and the plug connected to these components have the above-described structure, whereby a semiconductor device with a reduced size or higher integration can be provided.

[Transistor 200a and Transistor 200b]

As shown in FIGS. 1A to 1C and FIGS. 2A to 2C, the transistor 200a includes an insulator 214 and an insulator 216 provided over a substrate (not illustrated); a conductor 205_1 (a conductor 205_1a and a conductor 205_1b) embedded in the insulator 214 and the insulator 216; an insulator 220 provided over the conductor 205_1 and the insulator 216; an insulator 222 provided over the insulator 220; an insulator 224 provided over the insulator 222; the oxide 230 (the oxide 230a and the oxide 230b) provided over the insulator 224; an oxide 230_1c provided over the oxide 230; an insulator 250a provided over the oxide 230_1c; a conductor 260a provided over the insulator 250a; an insulator 270a provided over the conductor 260a; an insulator 271a provided over the insulator 270a; and the insulator 275a provided in contact with at least a side surface of the conductor 260a.

Furthermore, as shown in FIGS. 1A to 1C and FIGS. 2A to 2C, the transistor 200b includes the insulator 214 and the insulator 216 provided over the substrate (not illustrated); a conductor 2052 (a conductor 205_2a and a conductor 205_2b) embedded in the insulator 214 and the insulator 216; the insulator 220 provided over the conductor 205_2 and the insulator 216; the insulator 222 provided over the insulator 220; the insulator 224 provided over the insulator 222; the oxide 230 (the oxide 230a and the oxide 230b) provided over the insulator 224; an oxide 2302c provided over the oxide 230; an insulator 250b provided over the oxide 230_2c; a conductor 260b provided over the insulator 250b; an insulator 270b provided over the conductor 260b; an insulator 271b provided over the insulator 270b; and an insulator 275b provided in contact with at least a side surface of the conductor 260b.

Note that in the transistor 200a and the transistor 200b, the oxide 230a and the oxide 230b are collectively referred to as the oxide 230 in some cases. Although the transistor 200a and the transistor 200b each have a structure in which the oxide 230a and the oxide 230b are stacked, the present invention is not limited to this structure. For example, a structure in which only the oxide 230b is provided may be employed. For example, a stacked-layer structure of three or more layers may be employed.

Although the conductor 260a of the transistor 200a and the conductor 260b of the transistor 200b are each illustrated as having a single-layer structure, the present invention is not limited thereto. For example, the conductor 260a and the conductor 260b may each have a stacked-layer structure of two or more layers.

Here, as described above, the transistor 200a and the transistor 200b shown in FIG. 1A are symmetric with respect to the intersection point of the dashed-dotted line A1-A2 and the dashed dotted line A5-A6.

That is, the structure of the transistor 200b corresponds to the structure of the transistor 200a. Thus, in drawings, the corresponding components in the transistors 200a and 200b are basically denoted by the same three-digit reference numerals. Unless otherwise specified, the description for the transistor 200a can be referred to for the transistor 200b.

For example, the conductor 205_1, the oxide 230_1c, the insulator 250a, the conductor 260a, the insulator 270a, the insulator 271a, and the insulator 275a of the transistor 200a correspond to the conductor 2052, the oxide 230_2c, the insulator 250b, the conductor 260b, the insulator 270b, the insulator 271b, and the insulator 275b of the transistor 200b, respectively.

Note that the oxide 230 is shared by the transistor 200a and the transistor 200b. Thus, the oxide 230 includes a region functioning as a channel formation region of the transistor 200a, a region functioning as the other of the source and the drain of the transistor 200a, a region functioning as a channel formation region of the transistor 200b, a region functioning as the other of the source and the drain of the transistor 200b, and a region functioning as the one of the source and the drain of the transistor 200a and as the one of the source and the drain of the transistor 200b.

The transistors with the above structure can share a plug for electrical connection to the one of the source and the drain. The oxide 230 is used in common between the transistor 200a and the transistor 200b; consequently, the distance between the conductor 260a functioning as a first gate of the transistor 200a and the conductor 260b functioning as a first gate of the transistor 200b may be a minimum feature size. When the distance between the conductor 260a and the conductor 260b is set to be the minimum feature size, the area occupied by the two transistors can be reduced.

Note that the insulators 275a and 275b are formed in a self-aligned manner by anisotropic etching. The transistor 200a is provided with the insulator 275a, whereby parasitic capacitance between the transistor 200a and the capacitor 100a or between the transistor 200a and the conductor 240 can be reduced. Similarly, the transistor 200b is provided with the insulator 275b, whereby parasitic capacitance between the transistor 200b and the capacitor 100b or between the transistor 200b and the conductor 240 can be reduced. The reduction in the parasitic capacitance leads to high-speed operation of the transistor 200a and the transistor 200b.

For example, as the oxide 230, an oxide semiconductor typified by a metal oxide such as an In-M-Zn oxide (M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. An In—Ga oxide or an In—Zn oxide may be used as the oxide 230.

The transistor 200a and the transistor 200b each including an oxide semiconductor in a channel formation region has an extremely low leakage current in an off state; thus, a semiconductor device with low power consumption can be provided. An oxide semiconductor can be formed by a sputtering method or the like and thus can be used in the transistor 200a and the transistor 200b included in a highly integrated semiconductor device.

Figure 5:
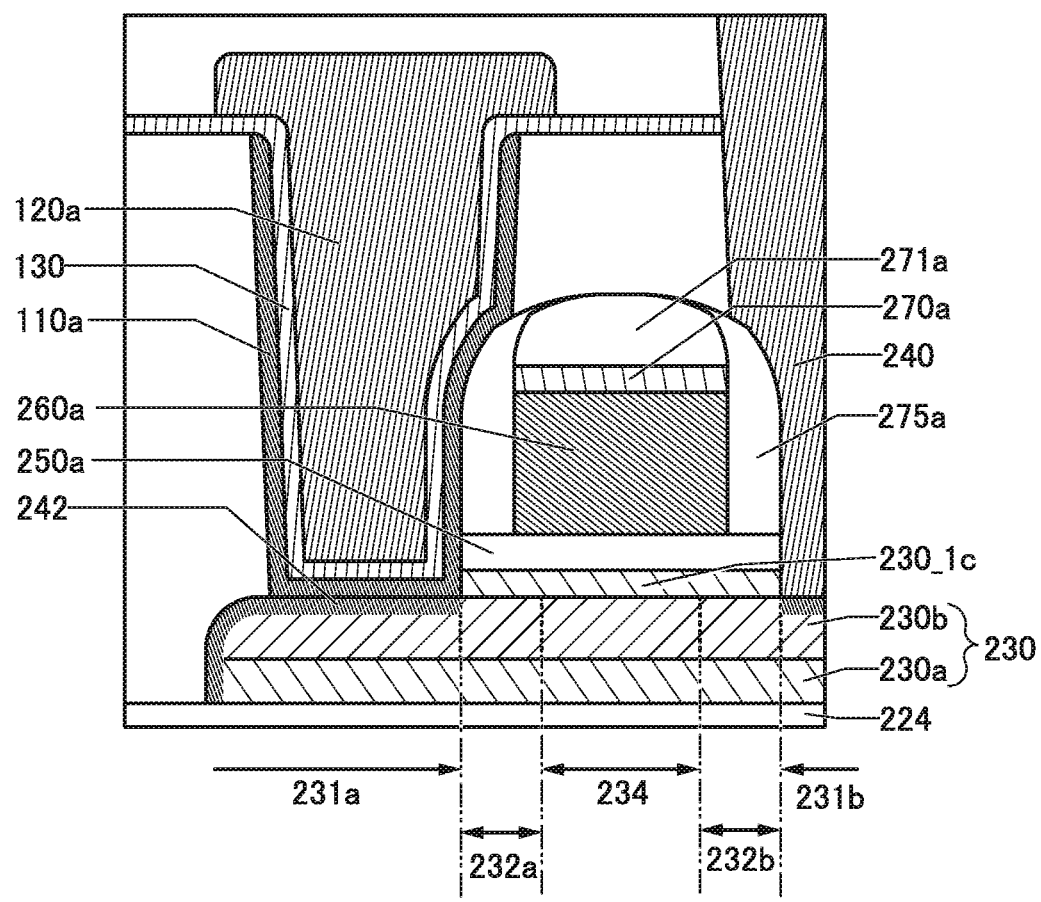
FIG. 5 is a cross section of a semiconductor device according to one embodiment of the present invention.

Here, an enlarged view of a region including a channel and a vicinity of the channel of the transistor 200a in FIG. 2B is shown in FIG. 5.

As illustrated in FIG. 5, the oxide 230 includes a region 234 functioning as a channel formation region of the transistor 200a, a region 231 (a region 231a or a region 231b) functioning as the source or the drain of the transistor 200a, and a region 232 (a region 232a or a region 232b) between the region 234 and the region 231.

The region 231 functioning as the source or the drain has a low oxygen concentration, a high carrier density, and reduced resistance. The region 234 functioning as the channel formation region has a higher oxygen concentration and a lower carrier density than the region 231 functioning as the source or the drain. The region 232 has a higher oxygen concentration and a lower carrier density than the region 231 functioning as the source or the drain and has a lower oxygen concentration and a higher carrier density than the region 234 functioning as the channel formation region.

Note that at least a surface and the vicinity of the surface of the region 231 of the oxide 230 (denoted by a region 242 in the diagram) needs to have a low resistance. In the region 231 with reduced resistance, the region 242 preferably has the lowest resistance.

The concentration of at least one of a metal element, a rare gas, and an impurity element such as hydrogen and nitrogen in the region 231 is preferably higher than that in each of the region 232 and the region 234. The concentration of at least one of the metal element, the rare gas, and the impurity element such as hydrogen and nitrogen is preferably high in the region 242 of the region 231.

In addition to the metal elements of the oxide 230, the region 231 preferably contains one or more of metal elements such as aluminum, ruthenium, titanium, tantalum, tungsten, and chromium. Addition of the metal element to the oxide 230 can reduce the resistance of the region 231. The region 231 may include a region where the metal element of the oxide 230 is alloyed with the added metal element.

The region 232 has a region overlapping with at least the insulator 275a. The concentration of at least one of metal elements such as aluminum, ruthenium, titanium, tantalum, tungsten, and chromium and impurity elements such as hydrogen and nitrogen in the region 232 is preferably higher than that in the region 234. In order to form the region 232, for example, a metal film, an oxide film containing a metal element, or a nitride film containing a metal element may be formed in contact with the region 231 of the oxide 230. In that case, the metal element in the film may be added to the oxide semiconductor and a metal compound may be formed in the oxide semiconductor in some cases. The metal compound attracts hydrogen in the oxide 230 in some cases. Thus, the hydrogen concentration of the region 232 in the vicinity of the region 231 may be increased.

One or both of the region 232a and the region 232b may have a region overlapping with the conductor 260a.

When the region 232 is provided in the transistor 200a, high-resistance regions are not formed between the region 231 functioning as the source and the drain and the region 234 where a channel is formed, so that the on-state current and the mobility of the transistor can be increased. Since the gate electrode does not overlap with the source and the drain in the channel length direction by including the region 232, formation of unnecessary capacitance can be suppressed. Leakage current in an off state can be reduced owing to the region 232.

Although the regions 234, 231, and 232 are formed in the oxide 230b in FIGS. 1A to 1C and FIGS. 2A to 2C, the present invention is not limited thereto. For example, these regions may be formed also in the oxide 230a and the oxide 230c. Although boundaries between the regions are indicated substantially perpendicularly to the top surface of the oxide 230 in FIGS. 1A to 1C and FIGS. 2A to 2C, this embodiment is not limited thereto. For example, the region 232a may project to the conductor 260a side in the vicinity of the surface of the oxide 230b, and the region 232a may recede to the capacitor 100a side in the vicinity of the bottom surface of the oxide 230b.

In the oxide 230, a boundary between the regions cannot be observed clearly in some cases. The concentration of a metal element and impurity elements such as hydrogen and nitrogen, which is detected in each region, may be gradually changed (such a change is also referred to as gradation) not only between the regions but also in each region. That is, the region closer to the channel formation region preferably has a lower concentration of a metal element and impurity elements such as hydrogen and nitrogen.

Adding the impurities or metal elements with the conductor 260a, the insulator 275a, the conductor 260b, and the insulator 275b used as masks reduces the resistance of the regions of the oxide 230 in a self-aligned manner. Therefore, in the case where a plurality of the semiconductor devices each including the transistor 200a and the transistor 200b are formed at the same time, variations in electrical characteristics between the semiconductor devices can be reduced.

The channel length of the transistor 200a and that of the transistor 200b are determined by the width of the conductor 260a and the insulator 275a and the width of the conductor 260b and the insulator 275b, respectively. When the width of the conductor 260a or the conductor 260b is a minimum feature size, the transistor 200a or the transistor 200b can be miniaturized.

The structures of the transistor 200a and the transistor 200b of one embodiment of the present invention are described in detail below. Note that also in the following description, the description of the transistor 200a can be referred to for the structure of the transistor 200b.

The conductor 205_1 functioning as a second gate electrode of the transistor 200a is provided to overlap with the oxide 230 and the conductor 260a.

Here, the conductor 260a functions as a first gate electrode of the transistor 200a in some cases.

Note that the potential applied to the conductor 205_1 may be a given potential that is different from the ground potential or the potential applied to the conductor 260a. For example, by changing the potential applied to the conductor 205_1 independently of the potential applied to the conductor 260a, the threshold voltage of the transistor 200a can be controlled. In particular, by applying a negative potential to the conductor 205_1, the threshold voltage of the transistor 200a can be higher than 0 V, and the off-state current can be reduced. Accordingly, a drain current when the potential applied to the conductor 260a is 0 V can be reduced.

The conductor 203a extends in the channel width direction in a manner similar to that of the conductor 260a, and functions as a wiring through which a potential is applied to the conductor 205_1, that is, the second gate electrode. When the conductor 205_1 is stacked over the conductor 203a functioning as the wiring for the second gate electrode so as to be embedded in the insulators 214 and 216, the insulators 214 and 216 and the like are positioned between the conductor 203a and the conductor 260a, reducing the parasitic capacitance between the conductor 203a and the conductor 260a and thereby increasing the withstand voltage.

The reduction in the parasitic capacitance between the conductor 203a and the conductor 260a can improve the switching speed of the transistor, so that the transistor can have high frequency characteristics. The increase in the withstand voltage between the conductor 203a and the conductor 260a can improve the reliability of the semiconductor device of one embodiment of the present invention. Therefore, the thicknesses of the insulator 214 and the insulator 216 are preferably large. Note that the extending direction of the conductor 203a is not limited to this example; for example, the conductor 203a may extend in the channel length direction of the transistor 200a.

The potential applied to the conductor 205_1 may be equal to the potential applied to the conductor 260a. When the potential applied to the conductor 205_1 is equal to the potential applied to the conductor 260a, the conductor 205_1 may be provided such that, in the channel width direction, the length of the conductor 205_1 is larger than that of the region 234 in the oxide 230. It is particularly preferable that the conductor 205_1 extend beyond the end portion of the region 234 of the oxide 230 in the channel width direction. That is, outside the side surface of the oxide 230 in the channel width direction, the conductor 205_1 and the conductor 260a preferably overlap with each other with the insulators positioned therebetween.

With the above structure, in the case where potentials are applied to the conductor 260a and the conductor 205_1, an electric field generated from the conductor 260a and an electric field generated from the conductor 205_1 are connected, so that a closed circuit which covers the channel formation region in the oxide 230 can be formed.

That is, the channel formation region in the region 234 can be electrically surrounded by the electric field of the conductor 260a functioning as the first gate electrode and the electric field of the conductor 205_1 functioning as the second gate electrode. In this specification, such a transistor structure in which the channel formation region is electrically surrounded by the electric fields of the first gate electrode and the second gate electrode is referred to as a surrounded channel (s-channel) structure.

In the conductor 205_1, the conductor 205_1a is formed in contact with an inner wall of an opening of the insulators 214 and 216 and the conductor 205_1b is formed further inside the opening. Here, the top surface of the conductor 205_1b can be substantially level with the top surface of the insulator 216. In addition, the top surface of the conductor 205_2b can be substantially level with the top surface of the insulator 216. Although the conductor 205_1a and the conductor 205_1b are stacked in the transistor 200a, the structure of the present invention is not limited to this structure. For example, only one of the conductor 205_1a and the conductor 205_1b may be provided.

Here, it is preferable to use a conductive material that has a function of inhibiting the passage of impurities such as water and hydrogen (that is relatively impermeable to such impurities) for the conductor 205_1a. For example, tantalum, tantalum nitride, ruthenium, ruthenium oxide, or the like is preferably used, and a single layer or stacked layers may be used. This inhibits diffusion of impurities such as hydrogen and water from a layer under the insulator 214 into an upper layer through the conductors 205_1 and 205_2. Note that it is preferable that the conductor 205_1a have a function of inhibiting the passage of at least one of impurities such as a hydrogen atom, a hydrogen molecule, a water molecule, a nitrogen atom, a nitrogen molecule, a nitrogen oxide molecule (e.g., $N_2O$, NO, or $NO_2$), and a copper atom, an oxygen atom, an oxygen molecule, and the like. In the following description, a conductive material having a function of inhibiting the passage of impurities preferably has a similar function. The conductor 205_1a with a function of inhibiting the passage of oxygen can prevent the conductor 205_1b from being oxidized and reduced in conductivity.

The conductor 205_1b is preferably formed using a conductive material including tungsten, copper, or aluminum as its main component. Although not illustrated, the conductor 205_1b may have a stacked-layer structure, and for example, stacked layers of titanium, titanium nitride, and the above-described conductive material may be formed.

Figure 3A:
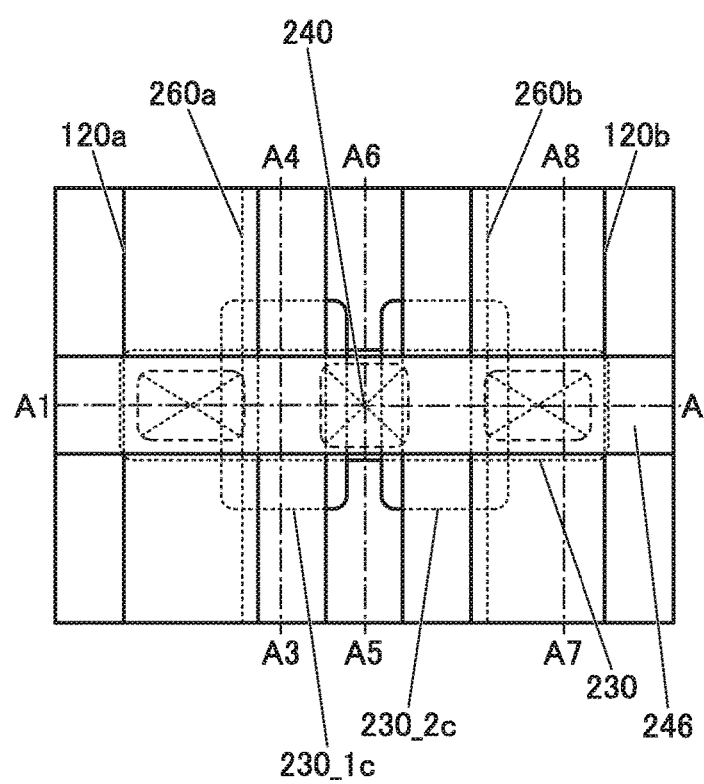
FIGS. 3A to 3C are a top view and cross sections of a semiconductor device according to one embodiment of the present invention.
Figure 3C:
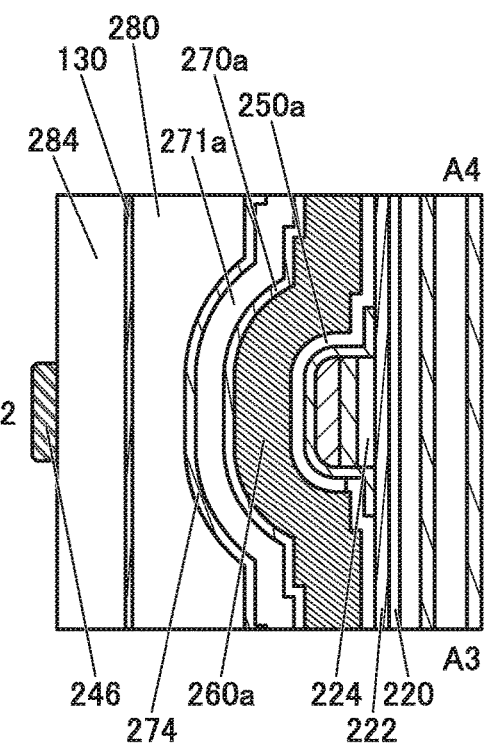
Figure 3B:
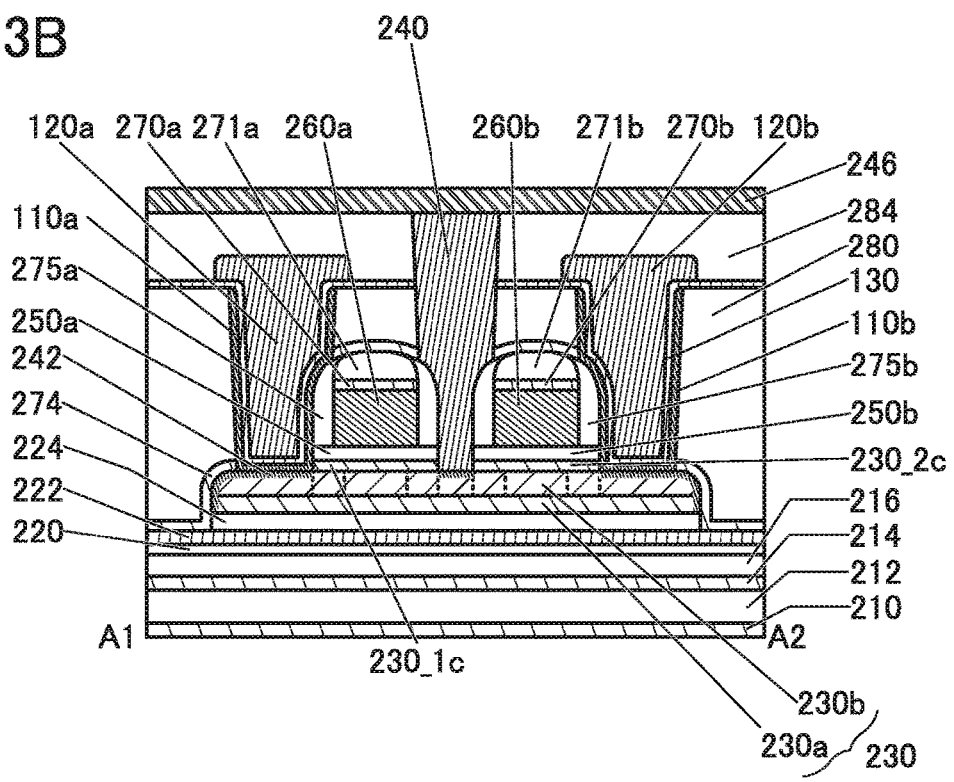

Note that as illustrated in FIGS. 3A to 3C, the conductors 203a, 203b, 2051, and 205_2 are not necessarily provided.

The insulator 214 and the insulator 222 can function as barrier insulating films that prevent impurities such as water or hydrogen from entering the transistor from a lower layer. The insulator 214 and the insulator 222 are each preferably formed using an insulating material having a function of inhibiting the passage of impurities such as water or hydrogen. For example, it is preferable that silicon nitride or the like be used for the insulator 214 and aluminum oxide, hafnium oxide, an oxide containing silicon and hafnium (hafnium silicate), an oxide containing aluminum and hafnium (hafnium aluminate), or the like be used for the insulator 222. This can suppress diffusion of impurities such as hydrogen and water to a layer positioned above the insulator 214 and the insulator 222. Note that it is preferable that the insulator 214 and the insulator 222 have a function of inhibiting the passage of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom.

Furthermore, each of the insulator 214 and the insulator 222 is preferably formed using an insulating material that is capable of inhibiting the passage of oxygen (e.g., an oxygen atom or an oxygen molecule). With this material, oxygen contained in the insulator 224 or the like can be inhibited from diffusing into lower layers.

Furthermore, the concentration of impurities such as water, hydrogen, or nitrogen oxide in the insulator 222 is preferably lowered. The amount of hydrogen released from the insulator 222, which is converted into hydrogen molecules per unit area of the insulator 222, is less than or equal to $2\times10^{15}$ molecules/cm$^2$, preferably less than or equal to $1\times10^{15}$ molecules/cm$^2$, further preferably less than or equal to $5\times10^{14}$ molecules/cm$^2$ in thermal desorption spectroscopy (TDS) in surface temperature range of the insulator 222 of 50° C. to 500° C., for example. The insulator 222 is preferably formed using an insulator from which oxygen is released by heating.

The insulator 250a can function as a first gate insulating film of the transistor 200a. The insulators 220, 222, and 224 can function as second gate insulating films of the transistor 200a. Although the insulator 220, the insulator 222, and the insulator 224 are stacked in the transistor 200a, the present invention is not limited to this structure. For example, any two of the insulators 220, 222, and 224 may be stacked, or any one of the insulators may be used.

The oxide 230 is preferably formed using a metal oxide functioning as an oxide semiconductor. The metal oxide preferably has an energy gap of 2 eV or more, preferably 2.5 eV or more. With the use of a metal oxide having such a wide energy gap, the off-state current of the transistor can be reduced.

A transistor formed using an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where the oxide semiconductor is an In-M-Zn oxide that contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

Here, when the oxide semiconductor contains a metal element such as aluminum, ruthenium, titanium, tantalum, chromium, or tungsten in addition to the constituent element of the oxide semiconductor, the oxide semiconductor becomes a metal compound to have reduced resistance in some cases. Note that aluminum, titanium, tantalum, tungsten, or the like is preferably used. To add the metal element to the oxide semiconductor, for example, a metal film containing the metal element, a nitride film containing the metal element, or an oxide film containing the metal element is provided over the oxide semiconductor. By provision of such a film, some oxygen in the oxide semiconductor at and in the vicinity of an interface between the film and the oxide semiconductor may be absorbed by the film or the like and an oxygen vacancy may be formed, so that the resistance of the oxide semiconductor at and in the vicinity of the interface may be reduced.

The periphery of an oxygen vacancy formed at the interface or in the vicinity of the interface has a distortion. When the above film is formed by a sputtering method with a sputtering gas containing a rare gas, the rare gas might enter the oxide semiconductor during the formation of the film. In the case where the rare gas enters the oxide semiconductor, a distortion or a structural disorder is caused at the interface or in the vicinity of the interface and around the rare gas. The rare gas is, for example, He, Ar, or the like. Note that Ar is preferable to He because its atomic radius is larger than that of He. When Ar enters the oxide semiconductor, a distortion or a structural disorder is suitably caused. In a region with such a distortion or a structural disorder, metal atoms bonded to a small number of oxygen may increase. When metal atoms bonded to a small number of oxygen increase, the resistance at the interface and in the vicinity of the interface and around the rare gas is reduced in some cases.

In the case where a crystalline oxide semiconductor is used as the oxide semiconductor, a region with the distortion or the structural disorder has broken crystallinity and seems like an amorphous oxide semiconductor in some cases.

After the metal film, the nitride film containing the metal element, or the oxide film containing the metal element is provided over the oxide semiconductor, heat treatment is preferably performed in an atmosphere containing nitrogen. By the heat treatment in the atmosphere containing nitrogen, the metal element is diffused from the metal film, the nitride film containing the metal element, or the oxide film containing the metal element into the oxide semiconductor; thus, the metal element can be added to the oxide semiconductor.

If hydrogen in the oxide semiconductor diffuses into a low-resistance region of the oxide semiconductor and enters an oxygen vacancy in the low-resistance region, the hydrogen becomes relatively stable. Hydrogen in an oxygen vacancy in the oxide semiconductor is released from the oxygen vacancy by heat treatment at 250° C. or higher, diffuses into a low-resistance region of the oxide semiconductor, enters an oxygen vacancy in the low-resistance region, and becomes relatively stable. Thus, by the heat treatment, the resistance of the low-resistance region tends to be further reduced, while the other region of the oxide semiconductor tends to be purified (impurities such as water or hydrogen therein tend to be reduced) and the resistance of the region tends to be increased.

An oxide semiconductor containing an impurity element such as hydrogen or nitrogen has a high carrier density. Hydrogen contained in the oxide semiconductor reacts with oxygen bonded to a metal atom to be water, and thus causes an oxygen vacancy in some cases. Entry of hydrogen into the oxygen vacancy increases carrier density. Furthermore, in some cases, bonding of part of hydrogen to oxygen bonded to a metal atom causes generation of an electron serving as a carrier. That is, the resistance of an oxide semiconductor containing nitrogen or hydrogen is reduced.

Thus, selective addition of a metal element and an impurity element such as hydrogen or nitrogen to the oxide semiconductor can form a high-resistance region and a low-resistance region in the oxide semiconductor. In other words, when the resistance of the oxide 230 is selectively reduced, a region functioning as a semiconductor having a low carrier density and low-resistance regions functioning as the source or the drain can be formed in the island-shaped oxide 230.

Here, the atomic ratio of the element M to constituent elements in a metal oxide used as the oxide 230a is preferably greater than that in a metal oxide used as the oxide 230b. Moreover, the atomic ratio of the element M to In in the metal oxide used as the oxide 230a is preferably greater than that in the metal oxide used as the oxide 230b. Moreover, the atomic ratio of In to the element M in the metal oxide used as the oxide 230b is preferably greater than that in the metal oxide used as the oxide 230a.

When using the above metal oxide as the oxide 230a, it is preferable that the conduction band minimum of the oxide 230a be higher than the conduction band minimum of the oxide 230b. In other words, the electron affinity of the oxide 230a is preferably smaller than the electron affinity of the oxide 230b.

Here, the conduction band minimum is gradually varied in the oxides 230a and 230b. In other words, the energy level of the conduction band minimum is continuously varied or continuously connected. To vary the conduction band minimum gradually, the density of defect states in a mixed layer formed at the interface between the oxides 230a and 230b is decreased.

Specifically, when the oxides 230a and 230b contain the same element (as a main component) in addition to oxygen, a mixed layer with a low density of defect states can be formed. For example, in the case where the oxide 230b is an In—Ga—Zn oxide, it is preferable to use an In—Ga—Zn oxide, a Ga—Zn oxide, gallium oxide, or the like for the oxide 230a.

At this time, a narrow-gap portion formed in the oxide 230b functions as a main carrier path. Since the density of defect states at the interface between the oxides 230a and 230b can be low, the influence of interface scattering on carrier conduction can be small and a high on-state current can be obtained.

Figure 21:
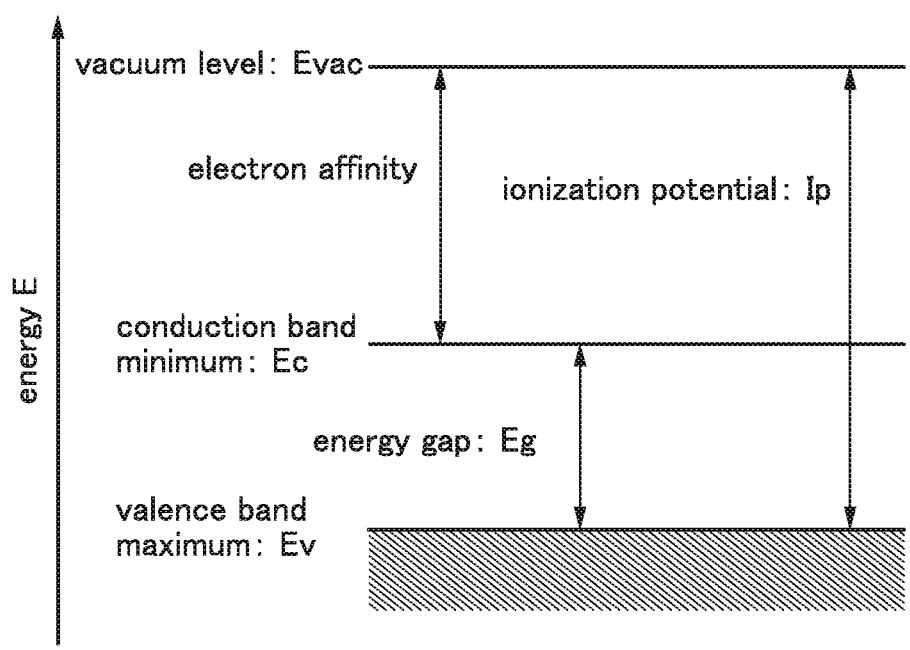
FIG. 21 illustrates an energy band structure of an oxide semiconductor.

The electron affinity or the energy level Ec of the conduction band minimum can be obtained from an energy gap Eg and an ionization potential Ip, which is a difference between the vacuum level Evac and the energy level Ev of the valence band maximum, as shown in FIG. 21. The ionization potential Ip can be measured with, for example, an ultraviolet photoelectron spectroscopy (UPS) apparatus. The energy gap Eg can be measured with, for example, a spectroscopic ellipsometer.

Furthermore, as shown in FIG. 2B, a side surface of a structure body including the conductor 260a, the insulator 270a, and the insulator 271a is preferably substantially perpendicular to the top surface of the insulator 222. Note that the semiconductor device described in this embodiment is not limited thereto. For example, an angle formed between the side surface of the structure body including the conductor 260a, the insulator 270a, and the insulator 271a and the top surface of the insulator 222 may be an acute angle.

The insulator 275a is provided in contact with at least the side surfaces of the conductor 260a and the insulator 270a. The insulator 275a is formed by forming an insulator to be the insulator 275a and then performing anisotropic etching. By the etching, the insulator 275a is formed in contact with the side surfaces of the conductor 260a and the insulator 270a.

Here, parasitic capacitance is formed between the conductor 260a and the conductor 240 in the transistor 200a in some cases. Similarly, parasitic capacitance is formed between the conductor 260b and the conductor 240 in the transistor 200b in some cases.

Accordingly, when the insulator 275a is provided in the transistor 200a and the insulator 275b is provided in the transistor 200b, the parasitic capacitance of the transistor 200a and the parasitic capacitance of the transistor 200b can be reduced. For example, silicon oxide, silicon oxynitride, silicon nitride oxide, or silicon nitride can be used for the insulator 275a and the insulator 275b. A reduction in the parasitic capacitance leads to high-speed operation of the transistor 200a and the transistor 200b.

Here, as illustrated in FIGS. 3A to 3C, an insulator 274 may be provided to cover the transistor 200a and the transistor 200b.

For example, a metal oxide containing one or more of hafnium, aluminum, gallium, yttrium, zirconium, tungsten, titanium, tantalum, nickel, germanium, magnesium, and the like can be used as the insulator 274. In particular, aluminum oxide has high barrier property; even a thin aluminum oxide film with a thickness of greater than or equal to 0.5 nm and less than or equal to 3.0 nm can inhibit diffusion of hydrogen and nitrogen.

When heat treatment is performed in a state where aluminum oxide is close to the oxide 230, the aluminum oxide extracts hydrogen from the oxide 230 in some cases. Thus, the hydrogen concentration of the oxide 230 can be reduced. When heat treatment is performed in a state where the insulator 274 and the oxide 230 are close to each other, oxygen can be supplied from the insulator 274 to the oxide 230, the insulator 224, the insulator 222, the insulator 250a, the insulator 250b, the insulator 275a, or the insulator 275b in some cases.

[Capacitor 100a and Capacitor 100b]

Figure 6A:
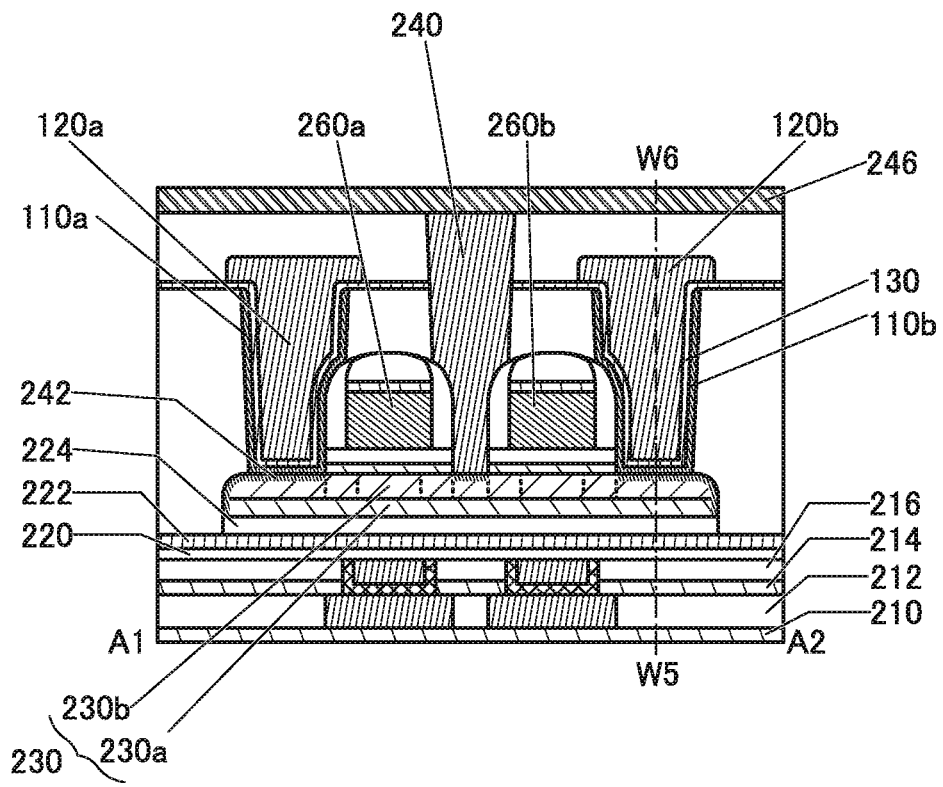
FIGS. 6A and 6B are cross sections of a semiconductor device according to one embodiment of the present invention.
Figure 6B:
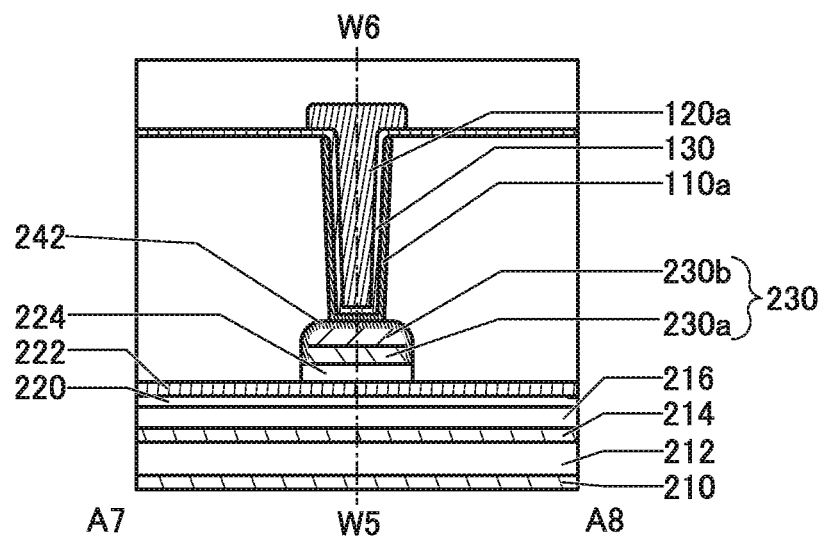

As illustrated in FIGS. 1A to 1C and FIGS. 2A to 2C, the capacitor 100a is provided in a region overlapping with the transistor 200a. Similarly, the capacitor 100b is provided in a region overlapping with the transistor 200b. FIG. 6B is a cross section taken along dashed-dotted line W5-W6 in FIG. 6A.

The structure of the capacitor 100b corresponds to the structure of the capacitor 100a. Thus, in drawings, the corresponding components in the capacitors 100a and 100b are basically denoted by the same three-digit reference numerals. Thus, unless otherwise specified, the description for the capacitor 100a can be referred to for the capacitor 100b.

The capacitor 100a includes a conductor 110a, an insulator 130, and a conductor 120a over the insulator 130. The capacitor 100b includes a conductor 110b, the insulator 130, and a conductor 120b over the insulator 130.

The capacitor 100a is provided over the transistor 200a, and the capacitor 100b is provided over the transistor 200b.

The capacitor 100a has a structure in which the conductor 110a functioning as a lower electrode and the conductor 120a functioning as an upper electrode face each other with the insulator 130 functioning as a dielectric interposed therebetween at a bottom surface and a side surface of an opening of the insulator 280. Accordingly, the capacitance per unit area can be increased.

In particular, with the deeper opening of the insulator 280, the capacitor 100a can have increased capacitance without an increase in its projected area. Therefore, the capacitor 100a preferably has a cylinder shape (i.e., the side surface area is larger than the bottom surface area).

The above structure can increase the capacitance per unit area of the capacitor 100a, which enables further miniaturization and higher integration of the semiconductor device. The capacitance value of the capacitor 100a can be set as appropriate by changing the thickness of the insulator 280. Thus, a semiconductor device with high design flexibility can be provided.

The insulator 130 is preferably formed using an insulator having a high permittivity. For example, an insulator containing an oxide of one or both of aluminum and hafnium can be used. Aluminum oxide, hafnium oxide, an oxide containing aluminum and hafnium (hafnium aluminate), or the like is preferably used for the insulator containing an oxide of one or both of aluminum and hafnium.

The insulator 130 may have a stacked-layer structure of, for example, two or more of silicon oxide, silicon oxynitride, silicon nitride oxide, silicon nitride, aluminum oxide, hafnium oxide, an oxide containing aluminum and hafnium (hafnium aluminate), and the like. For example, hafnium oxide, aluminum oxide, and hafnium oxide are preferably formed in this order by an ALD method. The thickness of each of the hafnium oxide and the aluminum oxide is greater than or equal to 0.5 nm and less than or equal to 5 nm. With such a stacked-layer structure, the capacitor 100a can have a large capacitance value and a low leakage current.

The insulator 275a is provided on the side surface of the conductor 260a that functions as the first gate electrode of the transistor 200a. Since the insulator 275a is provided between the conductor 260a and the conductor 110a, parasitic capacitance between the conductor 260a and the conductor 110a can be reduced.

Note that the conductor 110a or the conductor 120a may have a stacked-layer structure. For example, the conductor 110a or the conductor 120a may have a stacked-layer structure of a conductive material containing titanium, titanium nitride, tantalum, or tantalum nitride as its main component and a conductive material containing tungsten, copper, or aluminum as its main component. The conductor 110a or the conductor 120a may have a single-layer structure or a stacked-layer structure of three or more layers.

<Substrate>

As a substrate over which the transistors are formed, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate. As a method of providing the transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. The substrate with a small thickness may have elasticity or a property of returning to its original shape when bending or pulling is stopped, even in the case where the substrate includes glass or the like. Therefore, an impact applied to the semiconductor device over the substrate due to dropping or the like can be reduced. That is, a robust semiconductor device can be provided.

For the substrate which is a flexible substrate, metal, an alloy, resin, glass, or fiber thereof can be used, for example. The flexible substrate preferably has a lower coefficient of linear expansion because deformation due to an environment is suppressed. The flexible substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<Insulator>

Examples of an insulator include an insulating oxide, an insulating nitride, an insulating oxynitride, an insulating nitride oxide, an insulating metal oxide, an insulating metal oxynitride, and an insulating metal nitride oxide.

The transistor is surrounded by an insulator that has a function of inhibiting the passage of oxygen and impurities such as hydrogen, whereby the transistor can have stable electrical characteristics. For example, an insulator that has a function of inhibiting the passage of oxygen and impurities such as hydrogen may be used as each of the insulator 210, the insulator 214, the insulator 222, the insulator 270a, and the insulator 270b.

The insulator that has a function of inhibiting the passage of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

For example, the insulator 210, the insulator 214, the insulator 222, the insulator 270a, and the insulator 270b may be formed using a metal oxide such as aluminum oxide, magnesium oxide, gallium oxide, germanium oxide, yttrium oxide, zirconium oxide, lanthanum oxide, neodymium oxide, hafnium oxide, an oxide containing silicon and hafnium, an oxide containing aluminum and hafnium, or tantalum oxide, silicon nitride oxide, or silicon nitride. Note that, for example, the insulator 210, the insulator 214, the insulator 222, the insulator 270a, and the insulator 270b preferably contain aluminum oxide, hafnium oxide, and the like.

For example, the insulators 271a, 271b, 275a and 275b may be formed using a single layer or a stacked layer of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 271a, 271b, 275a, and 275b preferably contain silicon oxide, silicon oxynitride, or silicon nitride.

The insulators 222, 224, 250a, 250b, and 130 preferably include an insulator with a high relative permittivity. For example, the insulator 222, the insulator 224, the insulator 250a, the insulator 250b, and the insulator 130 preferably include gallium oxide, hafnium oxide, zirconium oxide, oxide containing aluminum and hafnium, oxynitride containing aluminum and hafnium, oxide containing silicon and hafnium, oxynitride containing silicon and hafnium, nitride containing silicon and hafnium, or the like.

Alternatively, the insulator 222, the insulator 224, the insulator 250a, the insulator 250b, and the insulator 130 each preferably have a stacked-layer structure of silicon oxide or silicon oxynitride and an insulator with a high relative permittivity. Because silicon oxide and silicon oxynitride have thermal stability, a combination of silicon oxide or silicon oxynitride with an insulator with a high relative permittivity allows the stacked-layer structure to be thermally stable and have a high relative permittivity. For example, when aluminum oxide, gallium oxide, or hafnium oxide in the insulator 250a or 250b is in contact with the oxide 230_1c or the oxide 230_2c, entry of silicon included in silicon oxide or silicon oxynitride into the oxide 230 can be suppressed. Furthermore, for example, when silicon oxide or silicon oxynitride in the insulator 250a or 250b is in contact with the oxide 230_1c or the oxide 230_2c, trap centers might be formed at the interface between aluminum oxide, gallium oxide, or hafnium oxide and the silicon oxide or the silicon oxynitride. The trap centers can shift the threshold voltage of the transistor in the positive direction by trapping electrons, in some cases.

The insulator 212, the insulator 216, the insulator 280, the insulator 284, the insulator 275a, and the insulator 275b preferably include an insulator with a low relative permittivity. For example, the insulator 212, the insulator 216, the insulator 280, the insulator 284, the insulator 275a, and the insulator 275b preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In some cases, each of the insulator 212, the insulator 216, the insulator 280, the insulator 284, the insulator 275a, and the insulator 275b preferably has a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide. Because silicon oxide and silicon oxynitride have thermal stability, a combination of silicon oxide or silicon oxynitride with a resin allows the stacked-layer structure to be thermally stable and have a low relative permittivity. Examples of the resin include polyester, polyolefin, polyamide (e.g., nylon or aramid), polyimide, polycarbonate, and acrylic.

<Conductor>

The conductor 203a, the conductor 203b, the conductor 205_1, the conductor 205_2, the conductor 260a, the conductor 260b, the conductor 240, the conductor 110a, the conductor 110b, the conductor 120a, and the conductor 120b can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. In some cases, a semiconductor having a high electric conductivity typified by polycrystalline silicon including an impurity element such as phosphorus, or silicide such as nickel silicide may be used.

Especially for the conductors 260a and 260b, a conductive material containing oxygen and a metal element included in a metal oxide that can be used for the oxide 230 may be used. A conductive material containing the above metal element and nitrogen may be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the oxide 230 can be captured in some cases. Hydrogen entering from an external insulator or the like can be captured in some cases.

Stacked layers of a plurality of conductive layers formed with the above materials may be used. For example, a stacked-layer structure formed using a combination of a material containing the above-described metal element and a conductive material containing oxygen may be used. Alternatively, a stacked-layer structure formed using a combination of a material containing the above-described metal element and a conductive material containing nitrogen may be used. Alternatively, a stacked-layer structure formed using a combination of a material containing the above-described metal element, a conductive material containing oxygen, and a conductive material containing nitrogen may be used.

When oxide is used for the channel formation region of the transistor, a stacked-layer structure formed using a material containing the above-described metal element and a conductive material containing oxygen is preferably used for the gate electrode. In this case, the conductive material containing oxygen is preferably formed on the channel formation region side. In that case, the conductive material containing oxygen is preferably provided on the channel formation region side so that oxygen released from the conductive material is easily supplied to the channel formation region.

<Metal Oxide>

The oxide 230 is preferably formed using a metal oxide functioning as an oxide semiconductor. A metal oxide that can be used as the semiconductor layer and the oxide 230 of one embodiment of the present invention is described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where the oxide semiconductor is an In-M-Zn oxide that contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

[Composition of Metal Oxide]

Described below is the composition of a cloud-aligned composite oxide semiconductor (CAC-OS) applicable to a transistor disclosed in one embodiment of the present invention.

In this specification and the like, "c-axis aligned crystal (CAAC)" or "CAC" might be stated. CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, CAC-OS or CAC metal oxide can be called a matrix composite or a metal matrix composite.

[Structure of Metal Oxide]

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of arrangement of oxygen atoms in the a-b plane direction, an interatomic bond distance changed by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. When indium of the In layer is replaced by the element M, the layer can also be referred to as an (In, M) layer.

The CAAC-OS is an oxide semiconductor with high crystallinity. By contrast, in the CAAC-OS, a reduction in electron mobility due to the grain boundary is less likely to occur because a clear grain boundary cannot be observed.

Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have any of various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the oxide semiconductor is used for a transistor is described.

When the oxide semiconductor is used in a transistor, the transistor can have high field-effect mobility. In addition, the transistor can have high reliability.

An oxide semiconductor with a low carrier density is preferably used for the transistor. In order to reduce the carrier density of the oxide semiconductor, the concentration of impurities in the oxide semiconductor is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8\times10^{11}/cm^3$, preferably lower than $1\times10^{11}/cm^3$, further preferably lower than $1\times10^{10}/cm^3$, and greater than or equal to $1\times10^9/cm^3$ is used.

A highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

To obtain stable electrical characteristics of the transistor, it is effective to reduce the concentration of impurities in the oxide semiconductor. In order to reduce the concentration of impurities in the oxide semiconductor, the concentration of impurities in a film which is adjacent to the oxide semiconductor is preferably reduced. As examples of the impurities, hydrogen, nitrogen, alkali metal, alkaline earth metal, iron, nickel, silicon, and the like are given.

[Impurity]

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains an alkali metal or an alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal of the oxide semiconductor. Specifically, the concentration of alkali metal or alkaline earth metal in the oxide semiconductor measured by SIMS is set lower than or equal to $1\times10^{18}$ atoms/cm$^3$, and preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally-on. Accordingly, it is preferable that hydrogen in the oxide semiconductor be reduced as much as possible. Specifically, the hydrogen concentration of the oxide semiconductor measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel formation region in a transistor, the transistor can have stable electrical characteristics.

<Method for Manufacturing Semiconductor Device>

Next, a manufacturing method of the semiconductor device of one embodiment of the present invention that includes the transistor 200a, the transistor 200b, the capacitor 100a, and the capacitor 100b is described with reference to FIGS. 7A to 7C to FIGS. 20A to 20C. FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, and FIG. 20A are top views. FIG. 7B, FIG. 8B, FIG. 9B, FIG. 10B, FIG. 11B, FIG. 12B, FIG. 13B, FIG. 14B, FIG. 15B, FIG. 16B, FIG. 17B, FIG. 18B, FIG. 19B, and FIG. 20B are cross sections taken along dashed-dotted lines A1-A2 in FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, and FIG. 20A, respectively. FIG. 7C, FIG. 8C, FIG. 9C, FIG. 10C, FIG. 11C, FIG. 12C, FIG. 13C, FIG. 14C, FIG. 15C, FIG. 16C, FIG. 17C, FIG. 18C, FIG. 19C, and FIG. 20C are cross sections taken along dashed-dotted lines A3-A4 in FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, and FIG. 20C, respectively.

First, a substrate (not illustrated) is prepared, and the insulator 210 is formed over the substrate. The insulator 210 can be formed by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

The use of a PECVD method can provide a high-quality film at a relatively low temperature. A thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of semiconductor devices can be increased. A thermal CVD method does not cause plasma damage during film formation, so that a film with few defects can be obtained.

An ALD method also causes less damage to an object. Since an ALD method does not cause plasma damage during film formation, a film with few defects can be obtained.

Unlike in a film formation method in which particles ejected from a target or the like are deposited, a film is formed by reaction at a surface of an object in a CVD method and an ALD method. Thus, a CVD method and an ALD method can provide favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low film formation rate; thus, it is sometimes preferable to combine an ALD method with another film formation method with a high film formation rate such as a CVD method.

When a CVD method or an ALD method is used, the composition of a film to be formed can be controlled with the flow rate ratio of a source gas. For example, by a CVD method or an ALD method, a film with a certain composition can be formed by adjusting the flow rate ratio of a source gas. Moreover, by changing the flow rate ratio of a source gas during film formation by a CVD method or an ALD method, a film whose composition is continuously changed can be formed. As compared to the case where the film is formed using a plurality of film formation chambers, the case where the film is formed while changing the flow rate ratio of the source gas can shorten the time taken for the film formation because the time taken for transfer and pressure adjustment is omitted. Thus, semiconductor devices can be manufactured with improved productivity in some cases.

For example, aluminum oxide is formed as the insulator 210 by a sputtering method. The insulator 210 may have a multilayer structure. For example, the multilayer structure may be formed in such a manner that an aluminum oxide is formed by a sputtering method and an aluminum oxide is formed over the aluminum oxide by an ALD method. Alternatively, the multilayer structure may be formed in such a manner that an aluminum oxide is formed by an ALD method and an aluminum oxide is formed over the aluminum oxide by a sputtering method.

Next, a conductive film to be the conductor 203a and the conductor 203b is formed over the insulator 210. The conductive film to be the conductor 203a and the conductor 203b can be formed by a sputtering method, a CVD method, an MBE method, a PLD method, an ALD method, or the like. The conductive film to be the conductor 203a and the conductor 203b may be a multilayer film. A tungsten film is formed as the conductive film to be the conductors 203a and 203b, for example.

Next, the conductive film to be the conductor 203a and the conductor 203b is processed by a lithography method to form the conductor 203a and the conductor 203b.

In the lithography method, first, a resist is exposed to light through a mask. Next, a region exposed to light is removed or left using a developing solution, so that a resist mask is formed. Then, etching with the resist mask is conducted. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. A liquid immersion technique may be employed in which a portion between a substrate and a projection lens is filled with a liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be used. In some cases, wet etching treatment can be performed after dry etching treatment. Further alternatively, dry etching treatment can be performed after wet etching treatment.

A hard mask formed of an insulator or a conductor may be used instead of the resist mask. In the case where a hard mask is used, a hard mask with a desired shape can be formed in the following manner: an insulating film or a conductive film that is the material of the hard mask is formed over the conductive film to be the conductor 203a and the conductor 203b, a resist mask is formed thereover, and then the material of the hard mask is etched. The etching of the conductive film to be the conductor 203a and the conductor 203b may be performed after or without removal of the resist mask. In the latter case, the resist mask may be removed during the etching. The hard mask may be removed by etching after the etching of the conductive film to be the conductor 203a and the conductor 203b. The hard mask does not need to be removed in the case where the material of the hard mask does not affect the following process or can be utilized in the following process.

As a dry etching apparatus, a capacitively coupled plasma (CCP) etching apparatus including parallel plate electrodes can be used. The capacitively coupled plasma etching apparatus including parallel plate electrodes may have a structure in which high-frequency power is applied to one of the parallel plate electrodes. Alternatively, different high-frequency powers are applied to one of the parallel plate electrodes. Further alternatively, high-frequency powers with the same frequency are applied to the parallel plate electrodes. Still further alternatively, high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 212 is formed over the insulator 210, the conductor 203a, and the conductor 203b. The insulating film to be insulator 212 can be formed by a sputtering method, a CVD method, an MBE method, a PLD method, an ALD method, or the like. For example, as the insulating film to be the insulator 212, silicon oxide is formed by a CVD method.

Here, the thickness of the insulating film to be the insulator 212 is preferably greater than or equal to the thickness of the conductor 203a and the thickness of the conductor 203b. For example, when each of the thickness of the conductor 203a and the conductor 203b is 1, the thickness of the insulating film to be the insulator 212 is greater than or equal to 1 and less than or equal to 3.

Next, chemical mechanical polishing (CMP) treatment is performed on the insulating film to be the insulator 212, so that part of the insulating film to be the insulator 212 is removed and a surface of the conductor 203a and a surface of the conductor 203b are exposed. Accordingly, the conductor 203a, the conductor 203b, and the insulator 212 whose top surfaces are flat can be formed (see FIGS. 7A to 7C).

Here, a method for forming the conductor 203a and the conductor 203b that is different from the above is described below.

The insulator 212 is formed over the insulator 210. The insulator 212 can be formed by a sputtering method, a CVD method, an MBE method, a PLD method, an ALD method, or the like. Then, openings are formed in the insulator 212 to reach the insulator 210. Examples of the openings include grooves and slits. A region where the opening is formed may be referred to as an opening portion. The openings can be formed by wet etching; however, dry etching is preferable for microfabrication. The insulator 210 is preferably an insulator that functions as an etching stopper film in forming the groove by etching the insulator 212. For example, in the case where a silicon oxide film is used as the insulator 212 in which the groove is to be formed, the insulator 210 is preferably a silicon nitride film, an aluminum oxide film, or a hafnium oxide film.

After formation of the openings, a conductive film to be the conductor 203a and the conductor 203b is formed. The conductive film desirably contains a conductor that has a function of inhibiting the passage of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductive film to be the conductor 203a and the conductor 203b can be formed by a sputtering method, a CVD method, an MBE method, a PLD method, an ALD method, or the like.

For example, when the conductive film to be the conductor 203a and the conductor 203b is a multilayer film, the conductive film may include a stacked-layer film, formed by a sputtering method, in which titanium nitride is stacked over tantalum nitride. Even when a metal that is easily diffused, such as copper, is used for an upper layer of the conductive film to be the conductor 203a and the conductor 203b (described below), the use of such metal nitride for a lower layer of the conductive film to be the conductor 203a and the conductor 203b can prevent diffusion of the metal to the outside from the conductor 203a and the conductor 203b.

Next, the upper layer of the conductive film to be the conductor 203a and the conductor 203b is formed. This conductive film can be formed by a plating method, a sputtering method, a CVD method, an MBE method, a PLD method, an ALD method, or the like. For example, as the conductive film of the upper layer of the conductive film to be the conductor 203a and the conductor 203b, a low-resistant conductive material such as copper is formed.

Next, by CMP treatment, the upper layer and the lower layer of the conductive film to be the conductor 203a and the conductor 203b are partly removed to expose the insulator 212. As a result, the conductive film to be the conductor 203a and the conductive film to be the conductor 203b remain only in the openings. In this way, the conductor 203a and the conductor 203b whose top surfaces are flat can be formed. Note that the insulator 212 is partly removed by the CMP treatment in some cases. The above is the description of the different formation method of the conductor 203a and the conductor 203b.

Next, the insulator 214 is formed over the conductor 203a and the conductor 203b. The insulator 214 can be formed by a sputtering method, a CVD method, an MBE method, a PLD method, an ALD method, or the like. For example, as the insulator 214, silicon nitride is formed by a CVD method. The use of an insulator through which copper is less likely to pass, such as silicon nitride, as the insulator 214 can prevent diffusion of a diffusible metal such as copper that might be included in the conductor 203a and the conductor 203b to layers above the insulator 214.

Next, the insulator 216 is formed over the insulator 214. The insulator 216 can be formed by a sputtering method, a CVD method, an MBE method, a PLD method, an ALD method, or the like. Silicon oxide is formed by a CVD method for the insulator 216, for example.

Then, depressions are formed in the insulators 214 and 216, so that the conductors 203a and 203b are exposed. Here, the depression means, for example, a hole, a slit, an opening, or the like. The depression may be formed by wet etching; however, dry etching is preferred for microfabrication.

After the formation of the depressions, a conductive film to be the conductor 205_1a and the conductor 205_2a is formed. The conductive film to be the conductor 205_1a and the conductor 205_2a desirably contains a conductor having a function of inhibiting the passage of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductive film to be the conductor 205_1a and the conductor 205_2a can be formed by a sputtering method, a CVD method, an MBE method, a PLD method, an ALD method, or the like.

Next, a conductive film to be the conductor 205_1b and the conductor 205_2b is formed over the conductive film to be the conductor 205_1a and the conductor 205_2a. The conductive film to be the conductor 205_1b and the conductor 205_2b can be formed by a sputtering method, a CVD method, an MBE method, a PLD method, an ALD method, or the like.

Next, CMP treatment is performed so that the conductive film to be the conductor 205_1a and the conductor 205_2a and the conductive film to be the conductor 205_1b and the conductor 205_2b which are over the insulator 216 are removed. As a result, the conductive film to be the conductor 205_1a and the conductor 205_2a and the conductive film to be the conductor 205_1b and the conductor 205_2b remain only in the depressions; in this way, the conductor 205_1 and the conductor 205_2 whose top surfaces are flat can be formed (see FIGS. 7A to 7C).

Next, the insulator 220 is formed over the insulator 216, the conductor 2051, and the conductor 205_2. The insulator 220 can be formed by a sputtering method, a CVD method, an MBE method, a PLD method, an ALD method, or the like.

Then, the insulator 222 is formed over the insulator 220. The insulator 222 can be formed by a sputtering method, a CVD method, an MBE method, a PLD method, an ALD method, or the like.

Then, the insulator 224 is formed over the insulator 222. The insulator 224 can be formed by a sputtering method, a CVD method, an MBE method, a PLD method, an ALD method, or the like.

Next, first heat treatment is preferably performed. The first heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The first heat treatment is performed in a nitrogen atmosphere, an inert gas atmosphere, or an atmosphere containing an oxidizing gas at 10 ppm or more, 1% or more, or 10% or more. The first heat treatment may be performed under a reduced pressure. In some cases, the first heat treatment may be performed in such a manner that heat treatment is performed in a nitrogen atmosphere or an inert gas atmosphere, and then other heat treatment is performed in an atmosphere containing an oxidizing gas at 10 ppm or more, 1% or more, or 10% or more in order to compensate for released oxygen. By the first heat treatment, impurities such as hydrogen and water included in the insulator 224 can be removed, for example. In some cases, in the first heat treatment, plasma treatment using oxygen may be performed under a reduced pressure. The plasma treatment containing oxygen is preferably performed using an apparatus including a power source for generating high-density plasma using microwaves, for example. In some cases, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 224. After plasma treatment using an inert gas with the apparatus, plasma treatment using oxygen may be performed to compensate for released oxygen. Note that first heat treatment is not necessarily performed in some cases.

This heat treatment can also be performed after the formation of the insulator 220, after the formation of the insulator 222, and after the formation of the insulator 224. Although this heat treatment can be performed under the above conditions, the heat treatment after the formation of the insulator 220 is preferably performed in an atmosphere containing nitrogen.

For example, the first heat treatment is performed in a nitrogen atmosphere at 400° C. for one hour after the formation of the insulator 224.

Figure 7A:
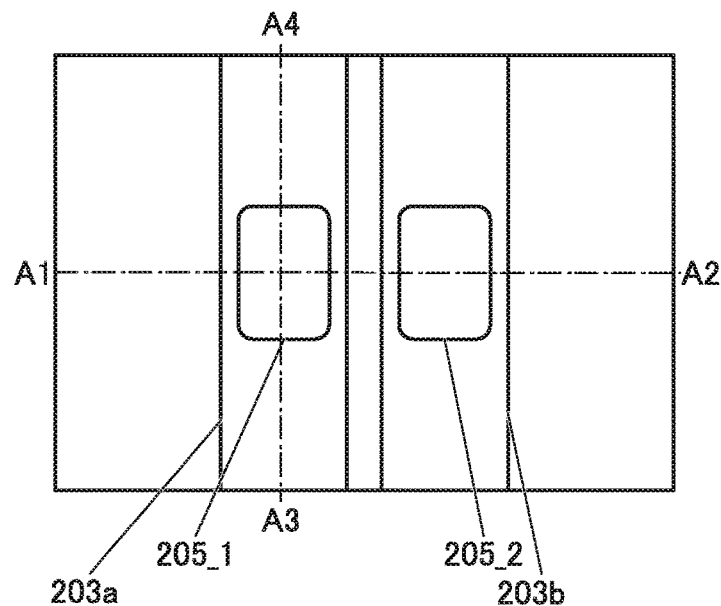
FIGS. 7A to 7C are a top view and cross sections illustrating a method for manufacturing a semiconductor device according to one embodiment of the present invention.
Figure 7C:
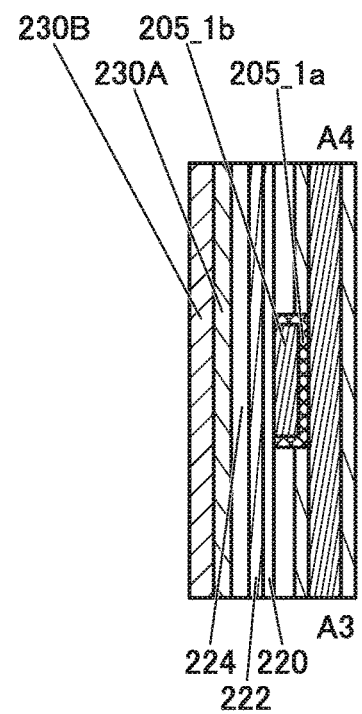
Figure 7B:
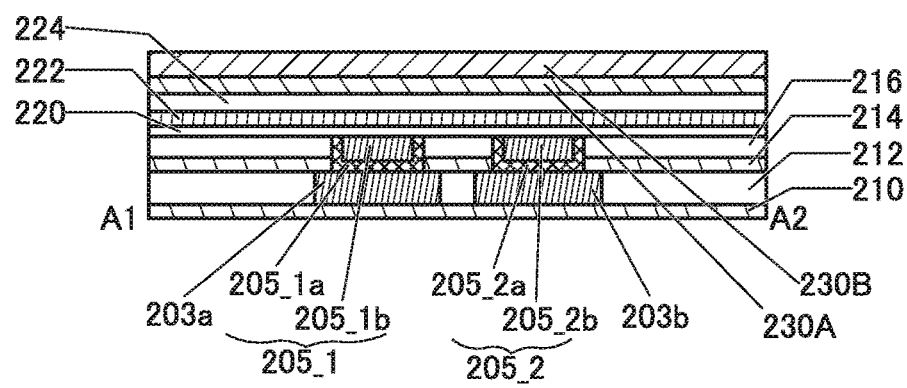
Figure 8A:
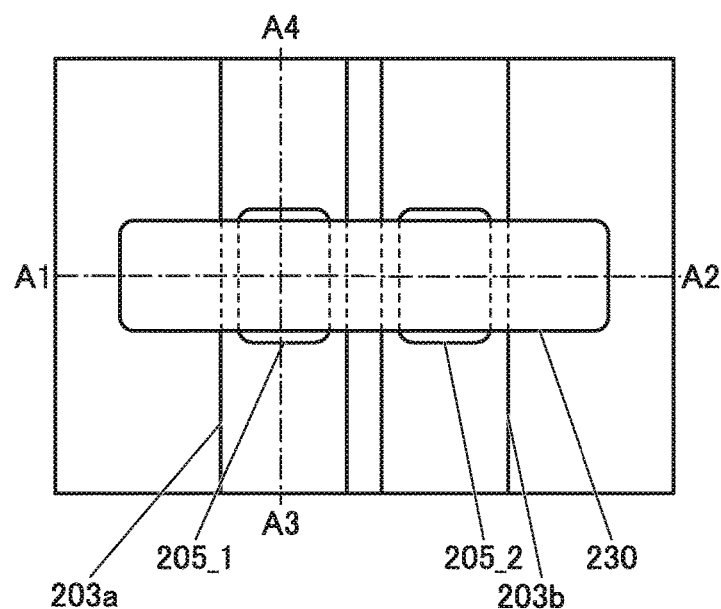
FIGS. 8A to 8C are a top view and cross sections illustrating a method for manufacturing a semiconductor device according to one embodiment of the present invention.
Figure 8C:
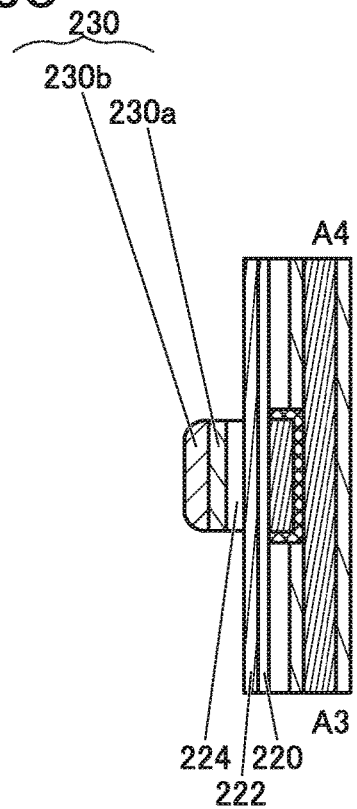
Figure 8B:
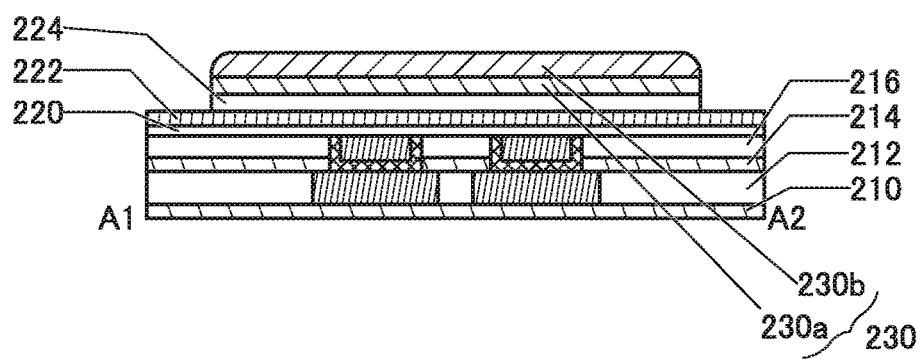

Next, an oxide film 230A and an oxide film 230B are formed in this order over the insulator 224 (see FIGS. 7A to 7C). Note that it is preferable to form the oxide film 230A and the oxide film 230B successively without exposure to the air. Formation of the oxide films without exposure to the air can prevent attachment of impurities or moisture from the air onto the oxide film 230A, so that an interface between the oxide films 230A and 230B and the vicinity of the interface can be kept clean.

The oxide film 230A and the oxide film 230B can be formed by a sputtering method, a CVD method, an MBE method, a PLD method, an ALD method, or the like.

In the case where the oxide films 230A and 230B are formed by a sputtering method, for example, oxygen or a mixed gas of oxygen and a rare gas is used as a sputtering gas. By increasing the proportion of oxygen in the sputtering gas, the amount of excess oxygen in the oxide films can be increased. In the case where the oxide films 230A and 230B are formed by a sputtering method, an In-M-Zn oxide target can be used.

In particular, in formation of the oxide film 230A, part of oxygen contained in the sputtering gas is supplied to the insulator 224, in some cases.

Note that the proportion of oxygen in the sputtering gas for formation of the oxide film 230A is 70% or higher, preferably 80% or higher, and further preferably 100%.

In the case where the oxide film 230B is formed by a sputtering method and the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have relatively high field-effect mobility.

Note that when an oxygen-deficient oxide semiconductor is used as the oxide film 230B, an oxide film containing excess oxygen is preferably used as the oxide film 230A. Oxygen doping treatment may be performed after the formation of the oxide film 230A.

For example, the oxide film 230A is formed by a sputtering method using a target containing In, Ga, and Zn at an atomic ratio of 1:3:4, and the oxide film 230B is formed by a sputtering method using a target containing In, Ga, and Zn at an atomic ratio of 4:2:4.1.

After that, second heat treatment may be performed. For the second heat treatment, the conditions for the first heat treatment can be used. By the second heat treatment, impurities such as hydrogen and water contained in the oxide films 230A and 230B can be removed, for example. For example, treatment at 400° C. in a nitrogen atmosphere for one hour and treatment at 400° C. in an oxygen atmosphere for one hour are successively performed in this order.

Next, the oxide film 230A and the oxide film 230B are processed into island shapes to form the oxide 230 (the oxide 230a and the oxide 230b). At this time, the insulator 224 in a region that does not overlap with the oxide 230a and the oxide 230b is etched and the surface of the insulator 222 is exposed in some cases (see FIGS. 8A to 8C).

Here, the oxide 230 is formed to at least partly overlap with the conductor 205. A side surface of the oxide 230 is preferably substantially perpendicular to a top surface of the insulator 222. When the side surface of the oxide 230 is substantially perpendicular to the top surface of the insulator 222, a plurality of transistors 200 can be provided in a small area with high density. Note that an angle formed between the side surface of the oxide 230 and the top surface of the insulator 222 may be an acute angle. In that case, a larger angle formed between the side surface of the oxide 230 and the top surface of the insulator 222 is preferable.

The oxide 230 may have a curved surface between its top and side surfaces. That is, an end portion of the side surface and an end portion of the top surface are preferably curved (such a curved shape is also referred to as a rounded shape).

The radius of curvature of the curved surface at an end portion of the oxide 230b is greater than or equal to 3 nm and less than or equal to 10 nm, preferably greater than or equal to 5 nm and less than or equal to 6 nm. When the end portions are not angular, the coverage of films formed later in the film formation process can be improved.

Note that the oxide films may be processed by a lithography method. The processing can be performed by a dry etching method or a wet etching method. A dry etching method is suitable for microfabrication.

Instead of a resist mask, a hard mask formed of an insulator or a conductor may be used as an etching mask. In the case where a hard mask is used, a hard mask with a desired shape can be formed in the following manner: an insulating film or a conductive film that is the material of the hard mask is formed over the oxide film 230B, a resist mask is formed thereover, and then the material of the hard mask is etched. The etching of the oxide films 230A and 230B may be performed after or without removal of the resist mask. In the latter case, the resist mask may be removed during the etching. The hard mask may be removed by etching after the etching of the oxide films 230A and 230B. The hard mask does not need to be removed in the case where the material of the hard mask does not affect the following process or can be utilized in the following process.

In some cases, treatment such as dry etching performed in the above process causes the attachment or diffusion of impurities due to an etching gas or the like to a surface or an inside of the oxide 230a, the oxide 230b, or the like. Examples of the impurities include fluorine and chlorine.

In order to remove the impurities, cleaning is performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which oxalic acid, phosphoric acid, hydrofluoric acid, or the like is diluted with carbonated water or pure water. In some cases, ultrasonic cleaning using pure water or carbonated water may be performed.

Next, third heat treatment may be performed. For the third heat treatment, the conditions for the first heat treatment can be used.

Figure 9A:
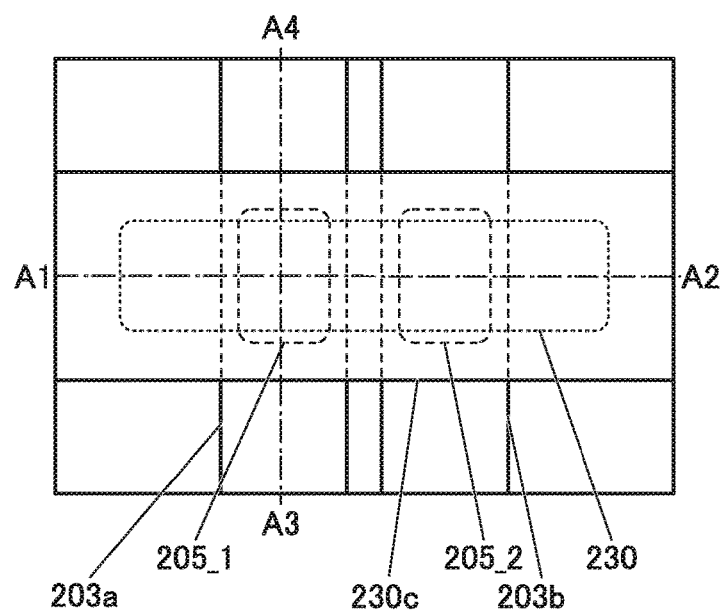
FIGS. 9A to 9C are a top view and cross sections illustrating a method for manufacturing a semiconductor device according to one embodiment of the present invention.
Figure 9C:
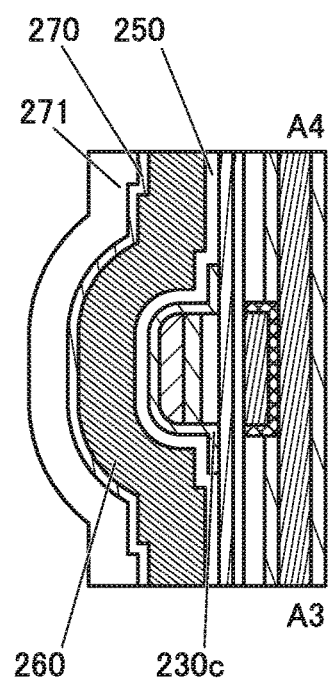
Figure 9B:
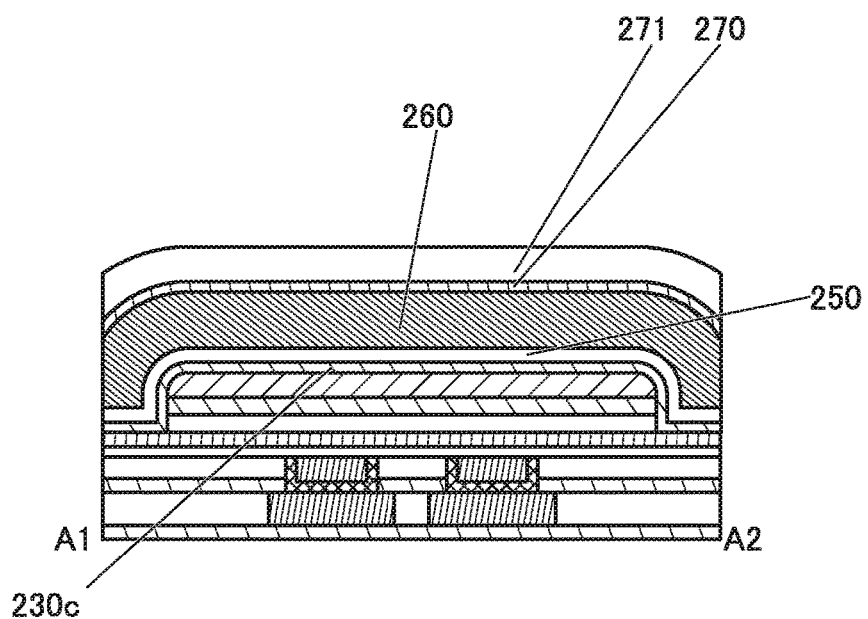
Figure 10A:
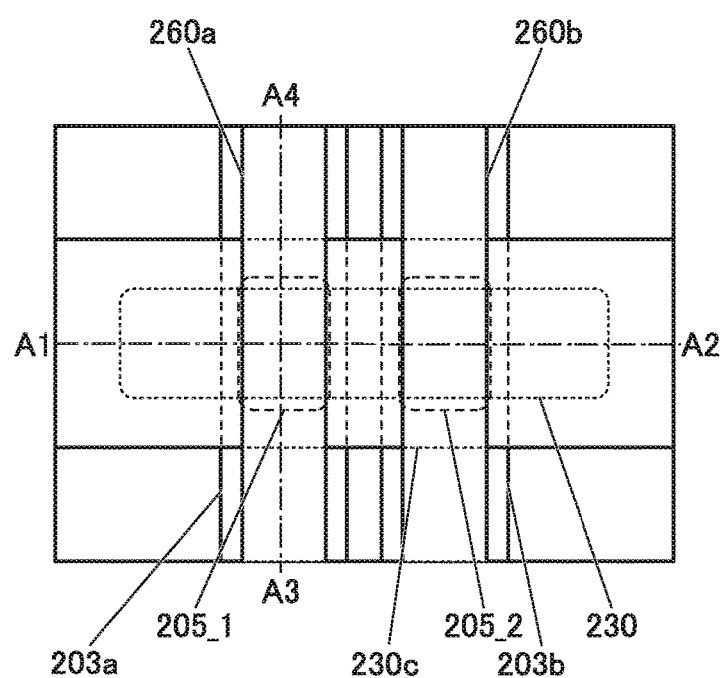
FIGS. 10A to 10C are a top view and cross sections illustrating a method for manufacturing a semiconductor device according to one embodiment of the present invention.
Figure 10C:
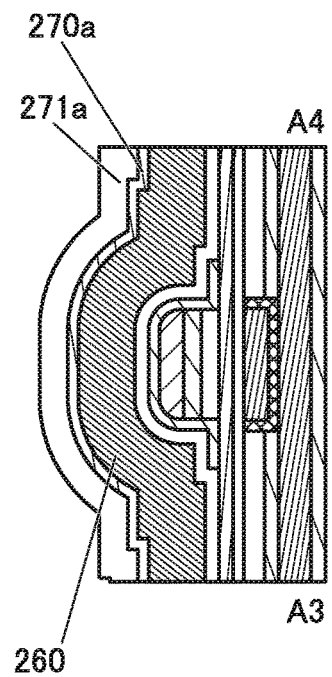
Figure 10B:
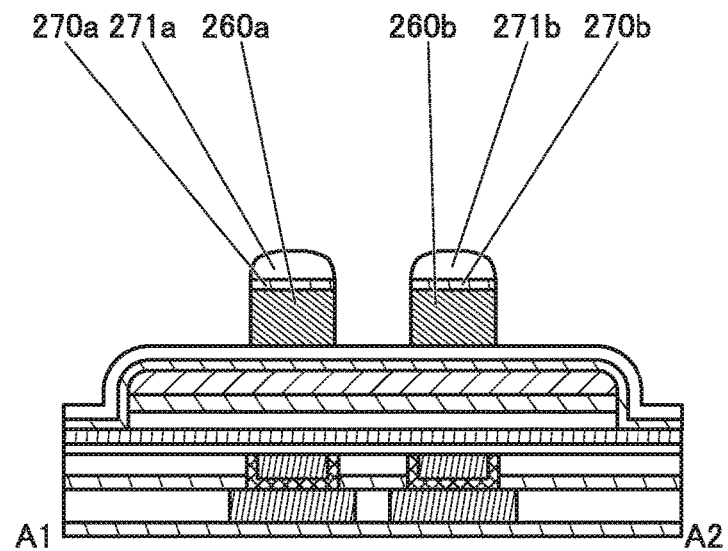
Figure 11A:
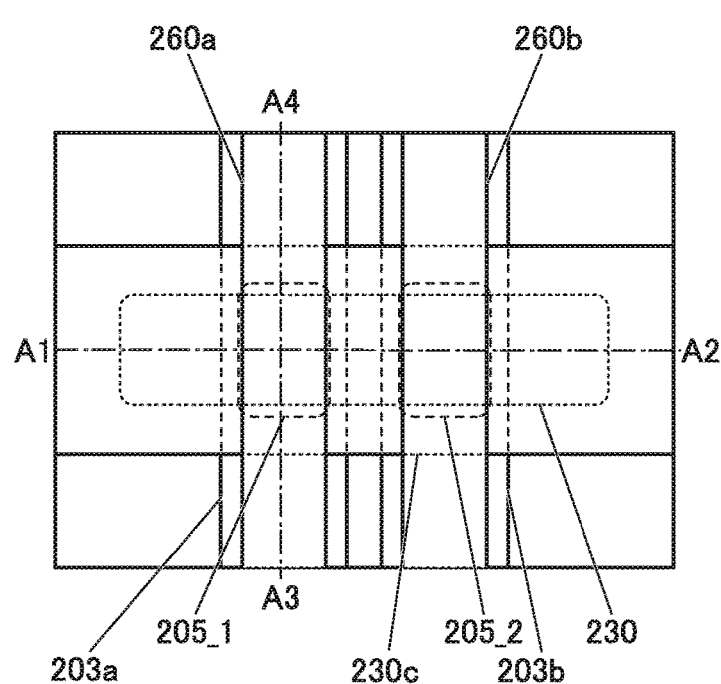
FIGS. 11A to 11C are a top view and cross sections illustrating a method for manufacturing a semiconductor device according to one embodiment of the present invention.
Figure 11C:
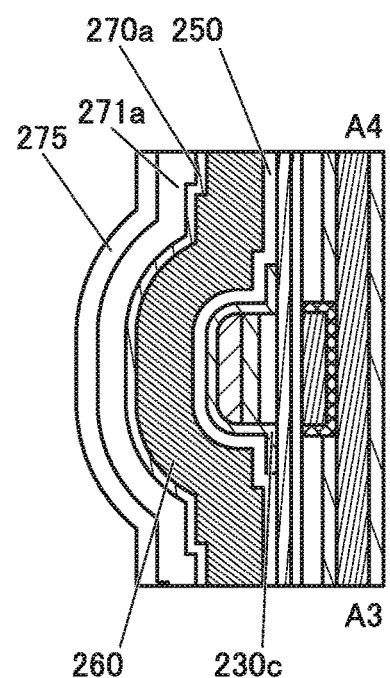
Figure 11B:
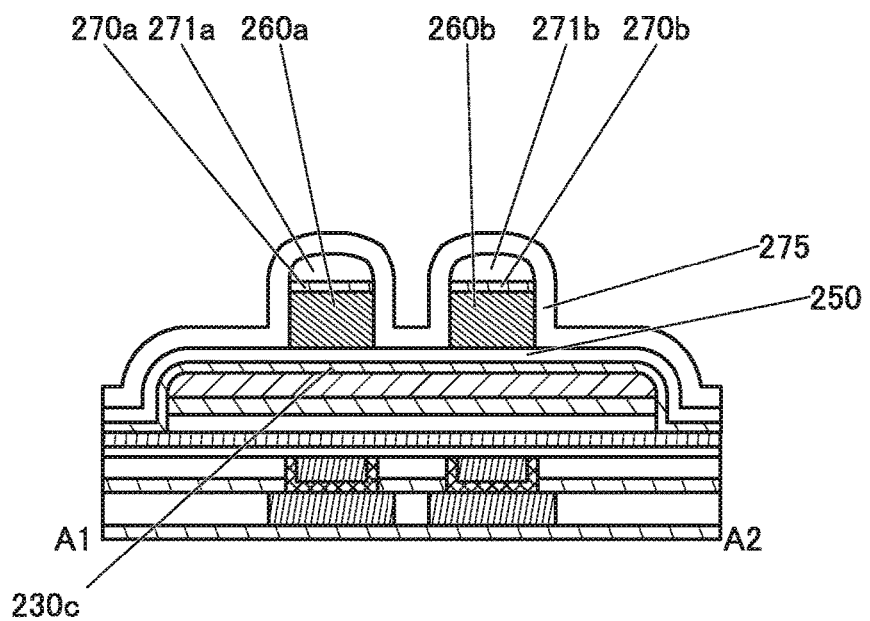
Figure 12A:
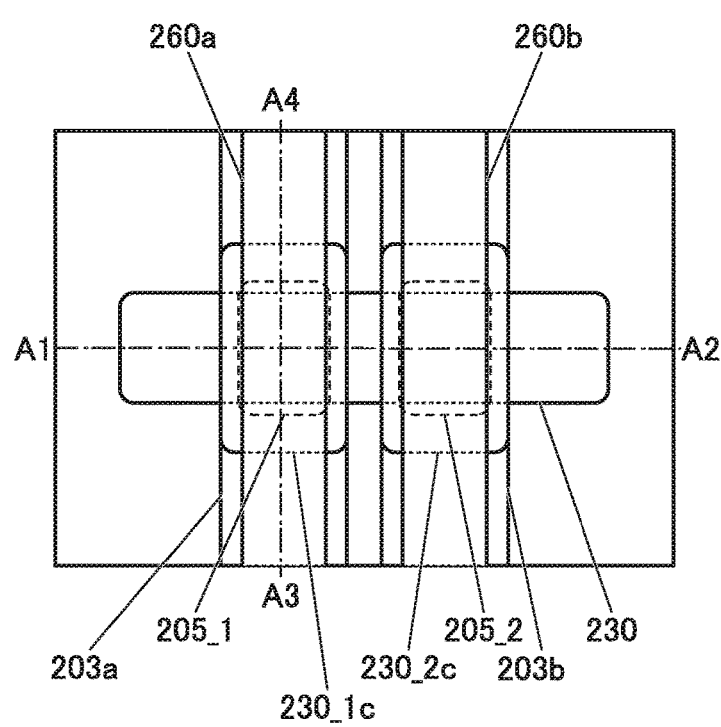
FIGS. 12A to 12C are a top view and cross sections illustrating a method for manufacturing a semiconductor device according to one embodiment of the present invention.
Figure 12C:
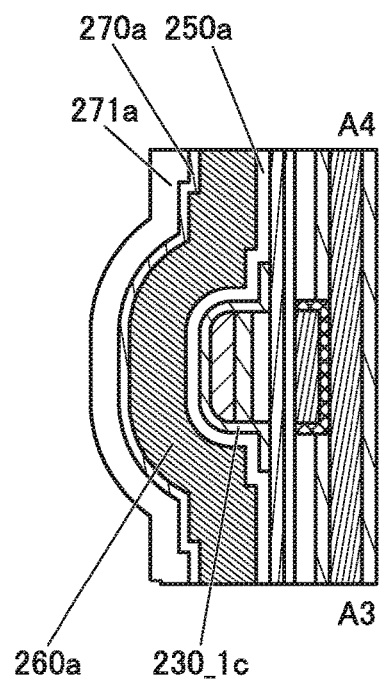
Figure 12B:
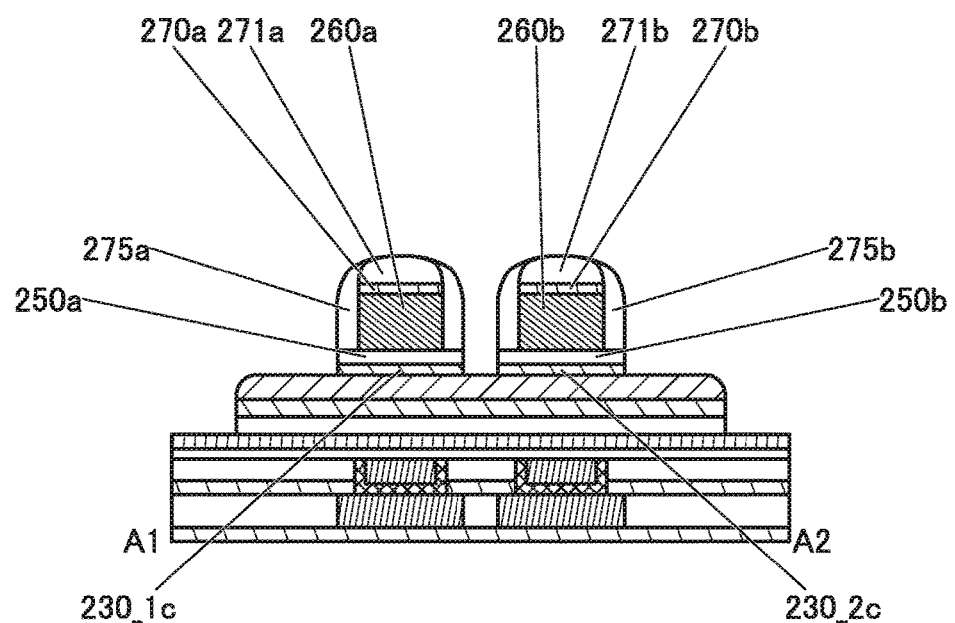

Next, an oxide film to be the oxide 230c is formed over the insulator 222 and the oxide 230 (see FIGS. 9A to 9C). The oxide film to be the oxide 230c can be formed by a sputtering method, a CVD method, an MBE method, a PLD method, an ALD method, or the like.

The oxide film to be the oxide 230c may be processed into an island shape to form the oxide 230c. When the oxide film to be the oxide 230c is processed into an island shape before the formation of the insulator 250a, the insulator 250b, the conductor 260a, and the conductor 260b, part of the oxide film to be the oxide 230c positioned below the insulator 250a, the insulator 250b, the conductor 260a, and the conductor 260b, which are formed in a later process, can be removed. Thus, the oxide films to be the oxides 230c for adjacent cells are separated and the leakage current between the cells can be prevented, which is preferable. In this embodiment, the oxide film to be the oxide 230c is processed to form the oxide 230c.

The oxide film to be the oxide 230c can be processed by a dry etching method or a wet etching method.

Next, an insulating film 250, a conductive film 260, an insulating film 270, and an insulating film 271 are formed in this order over the insulator 222 and the oxide 230c (see FIGS. 9A to 9C).

The insulating film 250 can be formed by a sputtering method, a CVD method, an MBE method, a PLD method, an ALD method, or the like. The insulating film 250 may have a stacked-layer structure. For example, in the case where the insulating film 250 has a two-layer structure, a second layer of the insulating film 250 is formed by a sputtering method in an atmosphere containing oxygen, whereby oxygen can be added to a first layer of the insulating film 250.

Here, fourth heat treatment may be performed. For the fourth heat treatment, the conditions for the first heat treatment can be used. The fourth heat treatment can reduce the moisture concentration and the hydrogen concentration in the insulating film 250.

The conductive film 260 can be formed by a sputtering method, a CVD method, an MBE method, a PLD method, an ALD method, or the like.

The insulating film 270 and the insulating film 271 can be formed by a sputtering method, a CVD method, an MBE method, a PLD method, an ALD method, or the like. In particular, the insulating film 270 is preferably formed by an ALD method. When the insulating film 270 is formed by an ALD method, the film thickness can be approximately 0.5 nm to 10 nm inclusive, preferably approximately 0.5 nm to 3 nm inclusive. Note that the formation of the insulating film 270 can be omitted.

The insulating film 271 can be used as a hard mask in processing the conductive film 260. The insulating film 271 can have a stacked-layer structure. For example, silicon oxynitride and silicon nitride over the silicon oxynitride may be provided.

Here, fifth heat treatment may be performed. For the fifth heat treatment, the conditions for the first heat treatment can be used.

Next, the insulating film 271 is etched by a lithography method to form the insulator 271a and the insulator 271b. Next, the conductive film 260 and the insulating film 270 are etched using the insulator 271a and the insulator 271b as hard masks, so that the conductor 260a, the insulator 270a, the conductor 260b, and the insulator 270b are formed (see FIGS. 10A to 10C).

Here, it is preferable that the cross-sectional shapes of the conductor 260a and the insulator 270a should not be tapered wherever possible. Similarly, it is preferable that the cross-sectional shapes of the conductor 260b and the insulator 270b should not be tapered wherever possible. An angle formed between the bottom surface of the oxide 230 and each of the side surfaces of the conductor 260a and the insulator 270a is preferably greater than or equal to 800 and less than or equal to 1000. Similarly, the angle formed between the bottom surface of the oxide 230 and each of the side surfaces of the conductor 260b and the insulator 270b is preferably greater than or equal to 800 and less than or equal to 1000. In that case, the insulator 275a and the insulator 275b are likely to be left in a later formation step of the insulator 275a and the insulator 275b.

Note that an upper portion of the insulating film 250 in a region not overlapping with the conductor 260a or 260b may be etched by the above etching. In that case, the thicknesses of regions of the insulating film 250 overlapping with the conductors 260a and 260b are larger than the thickness of the region not overlapping with the conductor 260a or 260b.

Here, the region 231 and the region 232 may be formed by an ion implantation method, an ion doping method by which an ionized source gas is added without mass separation, a plasma immersion ion implantation method, or the like. The ions cannot reach the oxide 230 in the regions overlapping with the conductor 260a and the conductor 260b, whereas the ions can reach the oxide 230 in the region not overlapping with the conductor 260a and the conductor 260b; thus, the region 231 and the region 232 can be formed in a self-aligned manner. Furthermore, damage to the oxide 230 during the implantation can be reduced by performing the above-described method through the insulating film 250 and the oxide 230c.

In the case where mass separation is performed in an ion doping method, a plasma immersion ion implantation method, or the like, ion species to be added and its concentration can be controlled accurately. On the other hand, in the case of not performing mass separation, ions at a high concentration can be added in a short time. In some cases, an ion doping method in which atomic or molecular clusters are generated and ionized may be employed. Instead of the term "dopant", the term "ion", "donor", "acceptor", "impurity", "element", or the like may be used.

As the dopant, an element that can form an oxygen vacancy, an element that can be bonded to an oxygen vacancy, or the like is used. Typical examples of such an element are hydrogen, boron, carbon, nitrogen, fluorine, phosphorus, sulfur, chlorine, titanium, and a rare gas element. Typical examples of the rare gas element are helium, neon, argon, krypton, and xenon.

Next, the insulating film 275 is formed to cover the insulating film 250, the conductor 260a, the insulator 270a, the insulator 271a, the conductor 260b, the insulator 270b, and the insulator 271b. The insulating film 275 can be formed by a sputtering method, a CVD method, an MBE method, a PLD method, an ALD method, or the like. For example, as the insulating film 275, silicon oxide is preferably formed by a CVD method (see FIGS. 11A to 11C).

Next, the insulating film 275 is subjected to anisotropic etching, whereby the oxide 230c, the insulating film 250, and the insulating film 275 are processed into the oxide 230_1c, the insulator 250a, the insulator 275a, the oxide 230_2c, the insulator 250b, and the insulator 275b. The insulator 275a is formed in contact with at least the conductor 260a and the insulator 271a, and the insulator 275b is formed in contact with at least the conductor 260b and the insulator 271b. Dry etching is preferably performed as the anisotropic etching. In this manner, the oxide 230c, the insulating film 250, and the insulating film 275 in regions on a plane substantially parallel to the substrate surface can be removed, so that the oxide 230_1c, the oxide 230_2c, the insulator 250a, the insulator 250b, the insulator 275a, and the insulator 275b can be formed in a self-aligned manner (see FIGS. 12A to 12C).

Figure 13A:
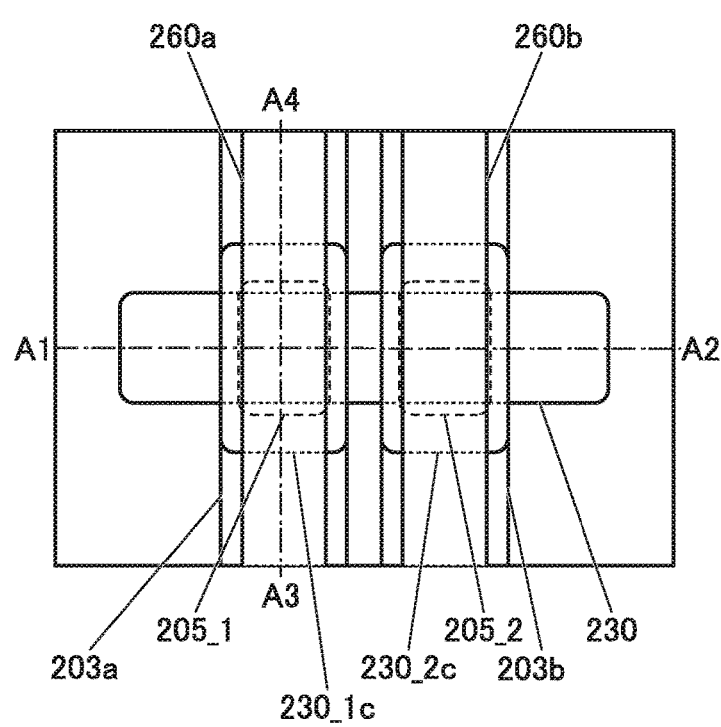
FIGS. 13A to 13C are a top view and cross sections illustrating a method for manufacturing a semiconductor device according to one embodiment of the present invention.
Figure 13C:
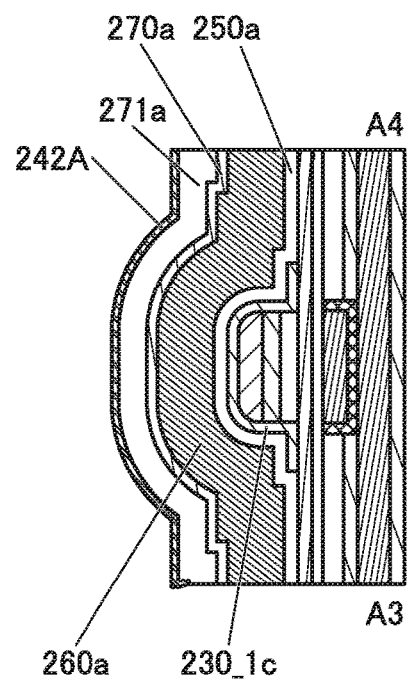
Figure 13B:
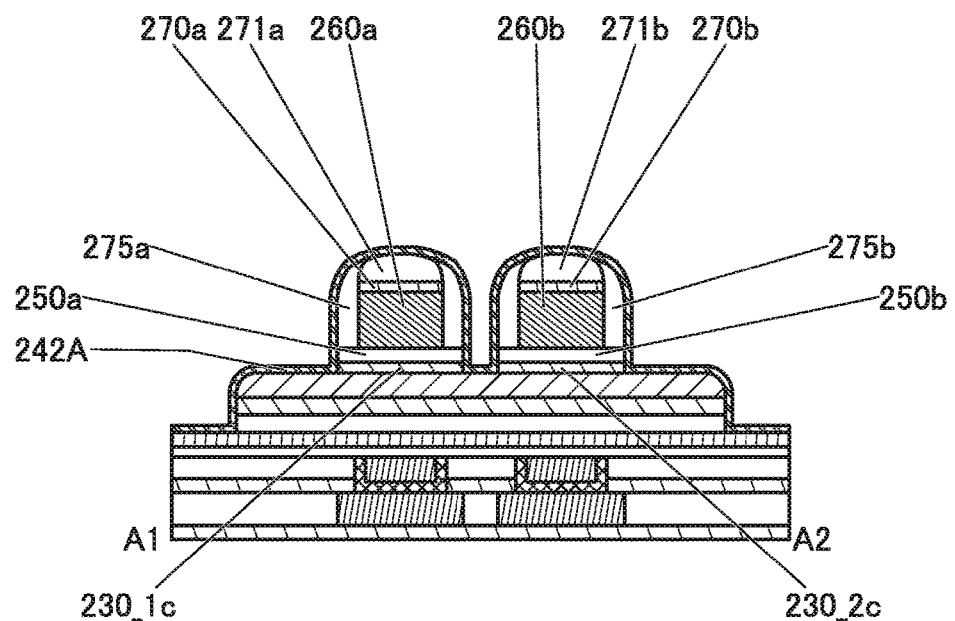
Figure 14A:
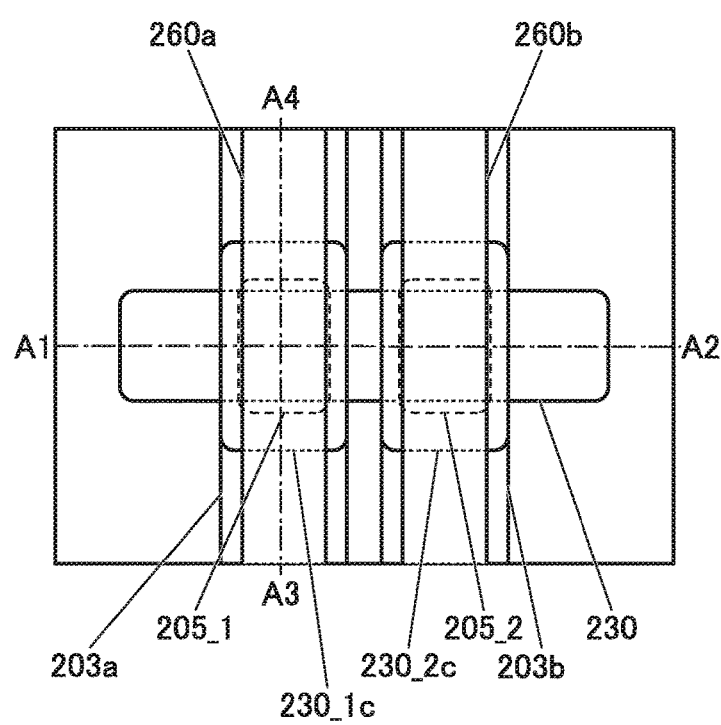
FIGS. 14A to 14C are a top view and cross sections illustrating a method for manufacturing a semiconductor device according to one embodiment of the present invention.
Figure 14C:
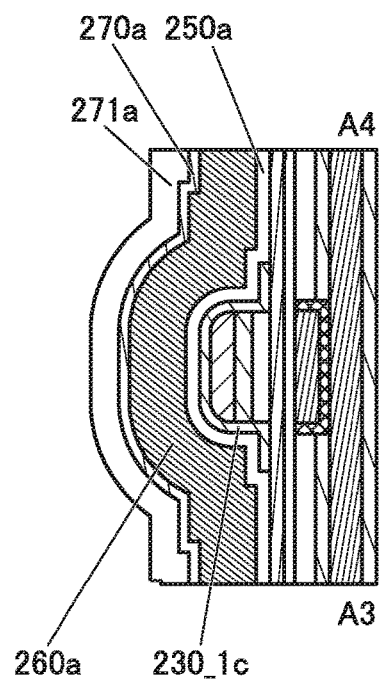
Figure 14B:
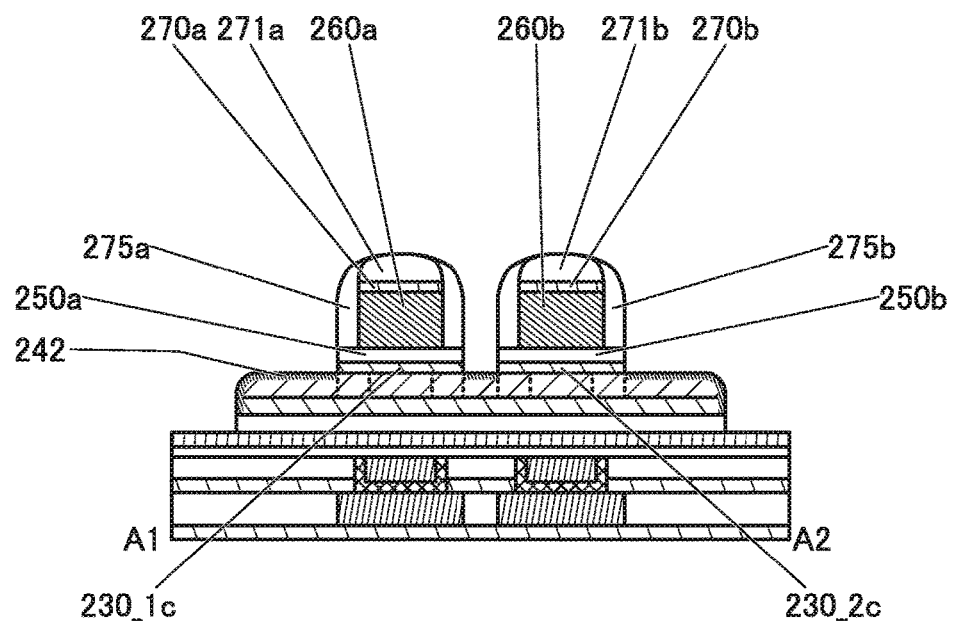

Then, a film 242A is formed over the insulator 224 and the oxide 230 so that the oxide 230_1c, the insulator 250a, the conductor 260a, the insulator 270a, the insulator 271a, the insulator 275a, the oxide 230_2c, the insulator 250b, the conductor 260b, the insulator 270b, the insulator 271b, and the insulator 275b are between the oxide 230 and the film 242A (see FIGS. 13A to 13C).

The film 242A is a metal film, a nitride film containing a metal element, or an oxide film containing a metal element. For example, the film 242A is a film containing a metal element such as aluminum, ruthenium, titanium, tantalum, tungsten, or chromium. The film 242A can be formed by a sputtering method, a CVD method, an MBE method, a PLD method, an ALD method, or the like.

Then, heat treatment is performed. By heat treatment in an atmosphere containing nitrogen, a metal element that is a component of the film 242A is diffused into the oxide 230, or a metal element that is a component of the oxide 230 is diffused into the film 242A. As a result, the region 242 with reduced resistance can be formed on the surface of the oxide 230. After that, the film 242A may be removed (see FIGS. 14A to 14C).

The heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere or an inert gas atmosphere. The heat treatment may be performed under a reduced pressure.

Heat treatment may be performed in a nitrogen atmosphere or an inert gas atmosphere, and then another heat treatment may be performed in an atmosphere containing an oxidizing gas at 10 ppm or more, 1% or more, or 10% or more. The heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C.

Here, when a metal compound is formed with a metal element of the film 242A and a metal element of the oxide 230, the region 242 with reduced resistance is formed. Note that the region 242 is a layer including a metal compound containing a component from the film 242A and a component from the oxide 230. For example, the region 242 may include a layer in which a metal element of the oxide 230 is alloyed with a metal element of the film 242A. In the alloy layer, the metal elements become relatively stable, so that a highly reliable semiconductor device can be provided.

If hydrogen in the oxide 230 diffuses into the region 231 and enters an oxygen vacancy in the region 231, the hydrogen becomes relatively stable. Hydrogen in an oxygen vacancy in the region 234 is released from the oxygen vacancy by heat treatment at 250° C. or higher, diffuses into the region 231, enters an oxygen vacancy in the region 231, and becomes relatively stable. Thus, by the heat treatment, the region 231 has further reduced resistance while the region 234 is purified (impurities such as water or hydrogen therein are reduced) and has further increased resistance.

In the formation step of the region 242 or the heat treatment, an oxygen vacancy may be formed in the region 231 and the region 232 due to absorption of oxygen in the region 231 and the region 232 adjacent to the region 231 of the oxide 230 by the region 242. Entry of hydrogen in the oxide 230 to the oxygen vacancy increases the carrier density of the regions 231 and 232. Therefore, the region 231 and the region 232 of the oxide 230 become n-type low-resistance regions.

With the above structure, the regions of the oxide 230 can be formed in a self-aligned manner. Thus, miniaturized or highly integrated semiconductor devices can be manufactured with high yield.

Thus, by appropriately determining the areas of the regions, a transistor having electrical characteristics required in the circuit design can be easily provided.

Next, the insulator 280 is formed. The insulator 280 can be formed by a sputtering method, a CVD method, an MBE method, a PLD method, an ALD method, or the like. In some cases, the insulator 280 can be formed by a spin coating method, a dipping method, a droplet discharging method (such as an ink-jet method), a printing method (such as screen printing or offset printing), a doctor knife method, a roll coater method, a curtain coater method, or the like. In this embodiment, silicon oxynitride is used for the insulator 280.

The insulator 280 is preferably formed to have a flat top surface. For example, the insulator 280 may have a flat top surface right after the formation. In some cases, the insulator 280 may be planarized by removing the insulator or the like from the top surface side after the formation so that the top surface becomes parallel to a reference surface such as a rear surface of the substrate. Such treatment is referred to as planarization treatment. As the planarization treatment, for example, chemical mechanical polishing (CMP) treatment, dry etching treatment, or the like can be performed. In this embodiment, CMP treatment is used as planarization treatment.

By adjusting the thickness of the insulator 280, the capacitance of the capacitor 100a and that of the capacitor 100b can be determined. Therefore, the thickness of the insulator 280 may be set as appropriate depending on the capacitance required for the capacitor 100a and the capacitor 100b.

Here, the insulator 280 has a single-layer structure in drawings, but may have a stacked-layer structure of two or more layers. For example, to prevent the warpage of the substrate, a layer having compressive stress and a layer having tensile stress may be stacked to cancel the internal stress.

Figure 15A:
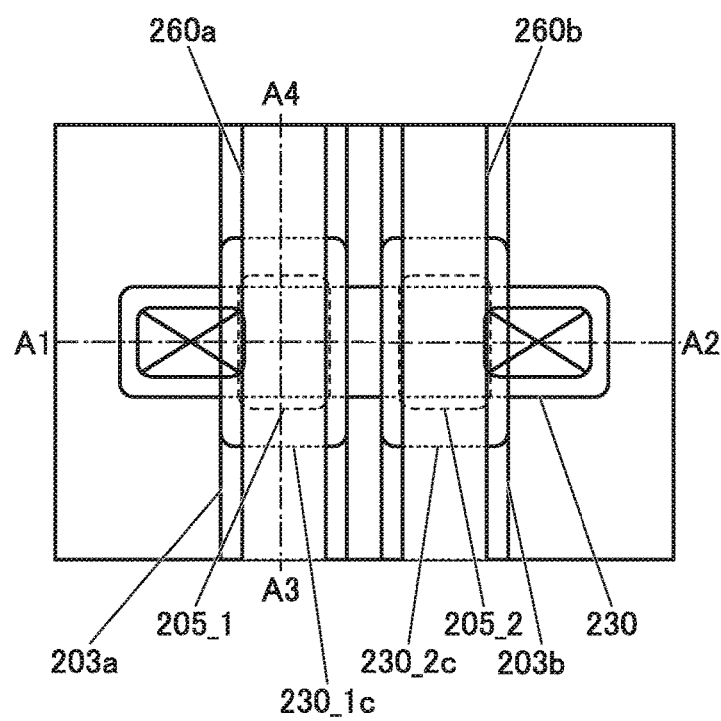
FIGS. 15A to 15C are a top view and cross sections illustrating a method for manufacturing a semiconductor device according to one embodiment of the present invention.
Figure 15C:
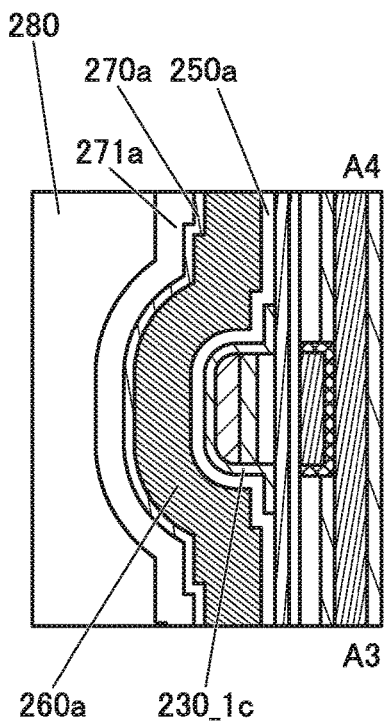
Figure 15B:
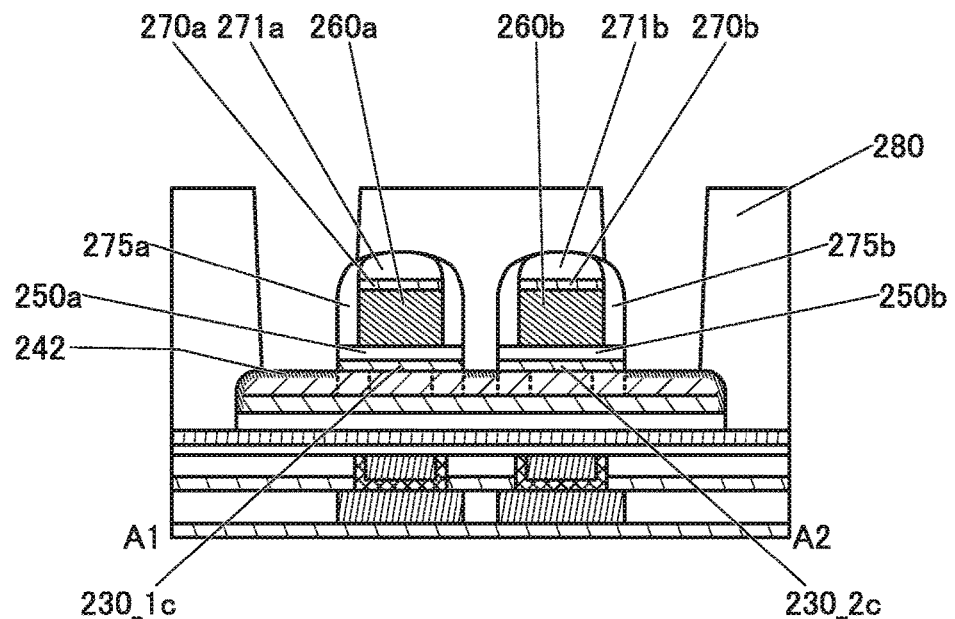

Next, openings reaching the region 231 of the oxide 230 are formed in the insulator 280 (see FIGS. 15A to 15C). Since the openings should have a high aspect ratio, anisotropic etching with a hard mask is preferably performed in this step. Note that dry etching is preferable for the anisotropic etching for forming the opening with a high aspect ratio.

Note that the openings provided in the insulator 280 are preferably provided such that one or both of the insulator 275a and the insulator 275b are exposed. Thus, one or both of the conductor 110a and the conductor 110b are provided in contact with a side surface (side surfaces) of the corresponding insulator (the insulator 275a and/or the insulator 275b).

Thus, the openings are preferably formed under a condition where the insulator 275a and the insulator 275b are hardly etched; in other words, the etching rate of the insulator 280 is preferably higher than that of the insulator 275a and the insulator 275b. When the etching rate of the insulator 275a and the insulator 275b is set to 1, the etching rate of the insulator 280 is preferably set to 5 or more, further preferably 10 or more. With such an opening condition, the opening can be positioned near the region 231 in a self-aligned manner; thus, a miniaturized transistor can be manufactured. In addition, tolerance of misalignment of the conductor 260a, the conductor 260b, and the opening can be extended in a lithography process; thus, the yield should be improved.

Here, the region 231 may be subjected to ion implantation by an ion implantation method, an ion doping method by which an ionized source gas is added without mass separation, a plasma immersion ion implantation method, or the like. Ions cannot reach the oxide 230 because of the insulator 280, except through the opening. In other words, ions can be implanted into the opening in a self-aligned manner. This ion implantation can increase the carrier density of the region 231 in the opening, and thus the contact resistance between the conductors 110a and 110b and the region 231 can be reduced in some cases.

In the case where mass separation is performed in an ion doping method, a plasma immersion ion implantation method, or the like, ion species to be added and its concentration can be controlled accurately. On the other hand, in the case of not performing mass separation, ions at a high concentration can be added in a short time. In some cases, an ion doping method in which atomic or molecular clusters are generated and ionized may be employed. Instead of the term "dopant", the term "ion", "donor", "acceptor", "impurity", "element", or the like may be used.

As the dopant, an element that can form an oxygen vacancy, an element that can be bonded to an oxygen vacancy, or the like is used. Typical examples of such an element are hydrogen, boron, carbon, nitrogen, fluorine, phosphorus, sulfur, chlorine, titanium, and a rare gas element. Typical examples of the rare gas element are helium, neon, argon, krypton, and xenon.

Next, a conductive film to be the conductors 110a and 110b is formed to cover the openings in the insulator 280. The conductors 110a and 110b are each formed in contact with the inner wall and the bottom surface of the corresponding opening. Thus, the conductive film to be the conductors 110a and 110b is preferably formed by a method that enables favorable coverage, such as an ALD method or a CVD method. In this embodiment, the conductive film is titanium nitride deposited by an ALD method, for example.

Then, a filler is formed over the conductive film to be the conductors 110a and 110b to fill the openings in the insulator 280. The filler fills the openings in the insulator 280 to the degree allowing CMP treatment in a later step to be successfully performed. Thus, the filler does not need to completely fill the openings in the insulator 280. The filler may be an insulator or a conductor.

Next, the layer above the insulator 280 is removed by CMP treatment, so that the conductors 110a and 110b are formed. For example, the insulator 280 may be used as a stopper for the CMP treatment.

Figure 16A:
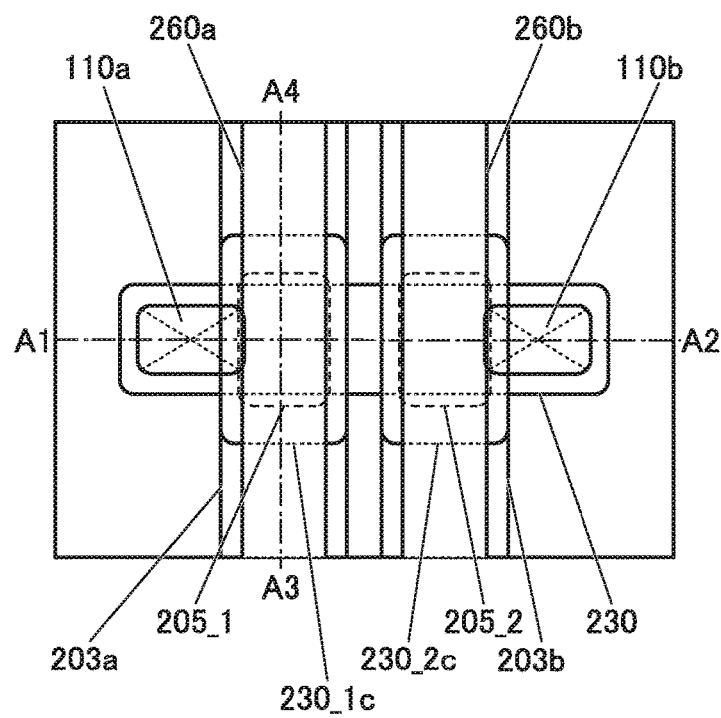
FIGS. 16A to 16C are a top view and cross sections illustrating a method for manufacturing a semiconductor device according to one embodiment of the present invention.
Figure 16C:
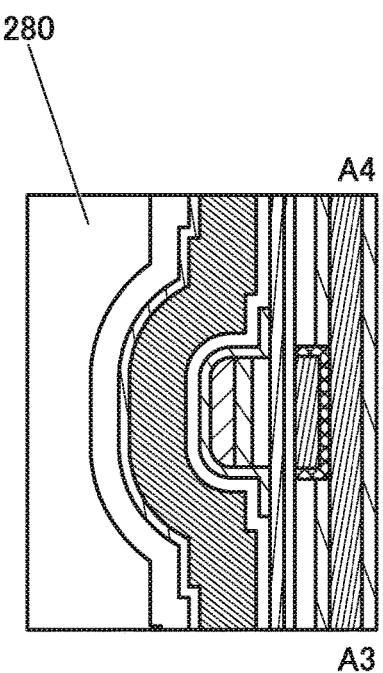
Figure 16B:
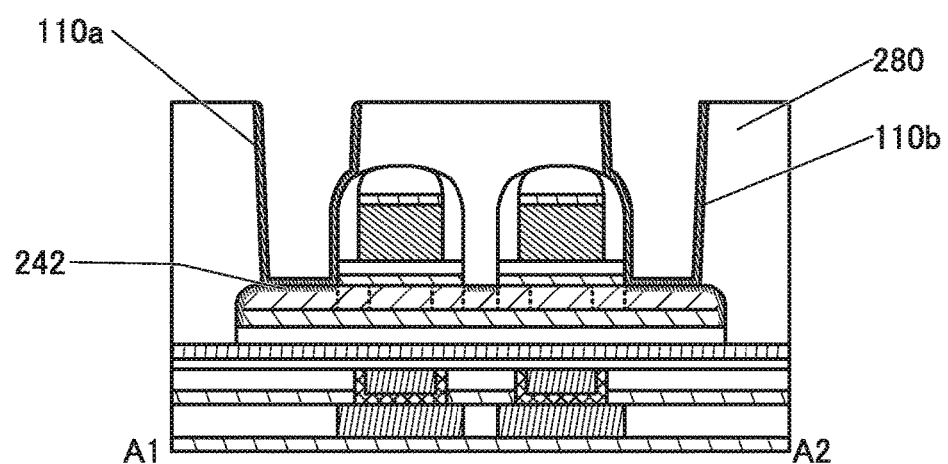

Next, the filler in the openings of the insulator 280 is removed by etching (see FIGS. 16A to 16C). Either wet etching or dry etching may be used. For example, the filler can be easily removed by wet etching with an etchant of a hydrofluoric acid-based solution or the like.

Figure 17A:
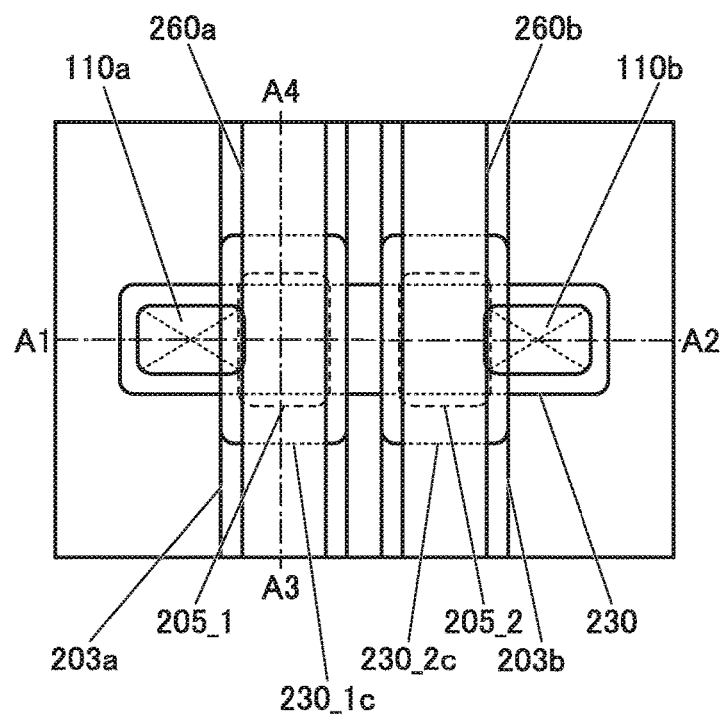
FIGS. 17A to 17C are a top view and cross sections illustrating a method for manufacturing a semiconductor device according to one embodiment of the present invention.
Figure 17C:
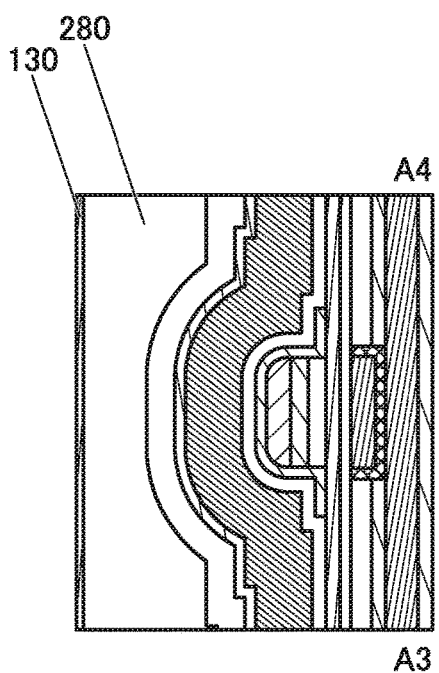
Figure 17B:
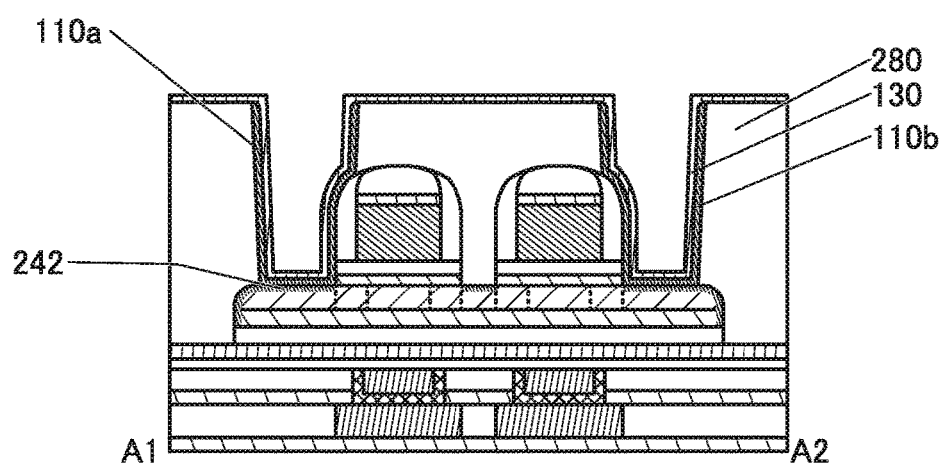

Next, the insulator 130 is formed over the conductors 110a and 110b and the insulator 280 (see FIGS. 17A to 17C). Inside the openings that are provided in the insulator 280 and have a high aspect ratio, the insulator 130 is formed over the conductors 110a and 110b. Thus, the insulator 130 is preferably formed by a film formation method that offers favorable coverage such as an ALD method or a CVD method.

When the insulator 130 is formed by a film formation method such as an ALD method to cover the conductor 110 favorably, a short circuit between the upper electrode and the lower electrode of the capacitor 100 can be prevented.

In the case where the above high-k material, in particular, an oxide containing hafnium is used for the insulator 130, heat treatment may be performed so that the insulator 130 can have a crystal structure and an increased relative permittivity.

The insulator 130 may have a stacked-layer structure of, for example, two or more of silicon oxide, silicon oxynitride, silicon nitride oxide, silicon nitride, aluminum oxide, hafnium oxide, an oxide containing aluminum and hafnium (hafnium aluminate), and the like. In this embodiment, hafnium oxide, aluminum oxide, and hafnium oxide are formed in this order by an ALD method.

Next, a conductive film to be the conductor 120a and the conductor 120b is formed over the insulator 130. The conductive film to be the conductor 120a and the conductor 120b is preferably formed over the conductor 110a or 110b and the insulator 130 inside each of the openings with a high aspect ratio that are provided in the insulator 280. For this reason, the conductive film to be the conductor 120a and the conductor 120b is preferably formed by a film formation method providing favorable coverage such as an ALD method, a CVD method, or the like. In particular, the conductive film to be the conductor 120a and the conductor 120b is preferably formed by a film formation method providing high embeddability, such as a CVD method; for example, a tungsten film is formed by a CVD method.

Although the conductive film to be the conductors 120a and 120b has a single-layer structure in drawings, the conductive film may have a stacked-layer structure of two or more layers.

Figure 18A:
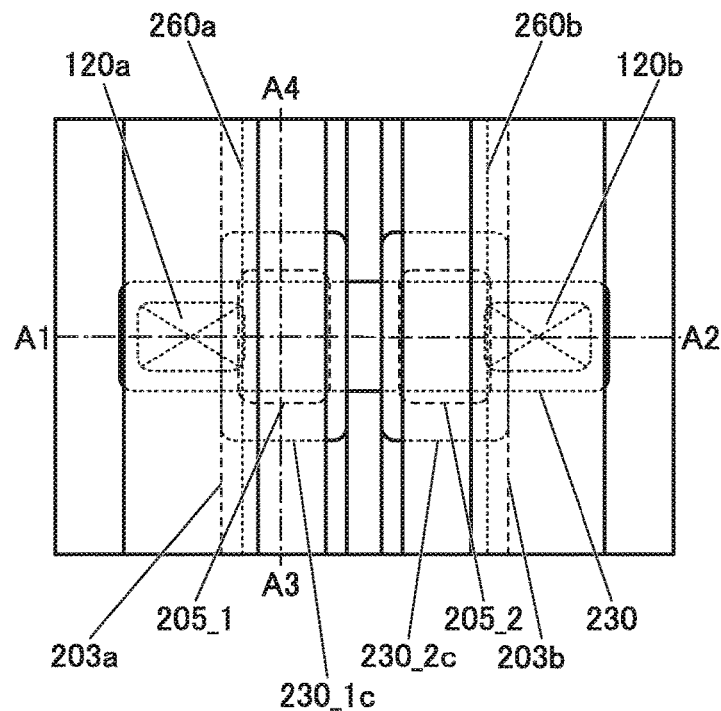
FIGS. 18A to 18C are a top view and cross sections illustrating a method for manufacturing a semiconductor device according to one embodiment of the present invention.
Figure 18C:
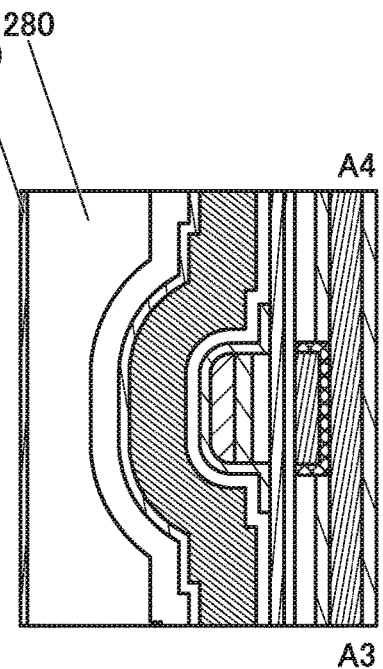
Figure 18B:
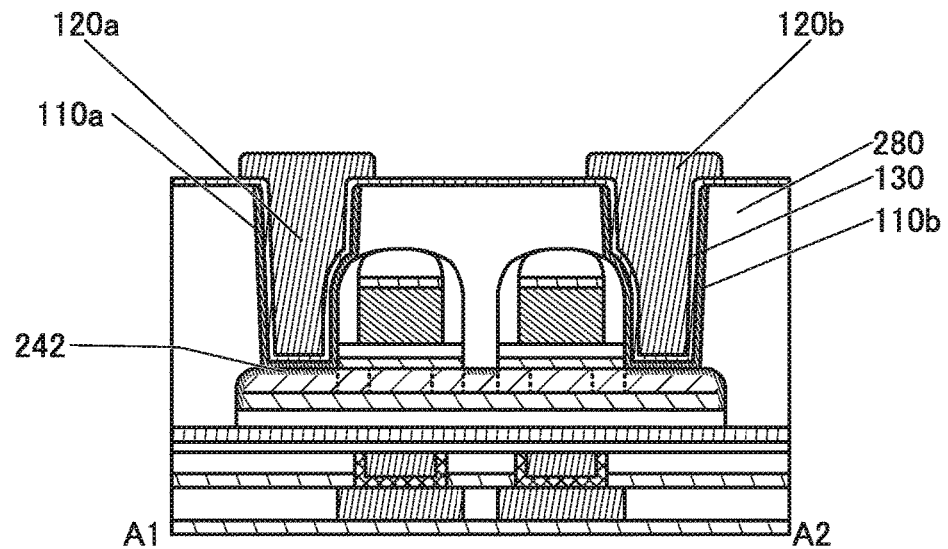
Figure 19A:
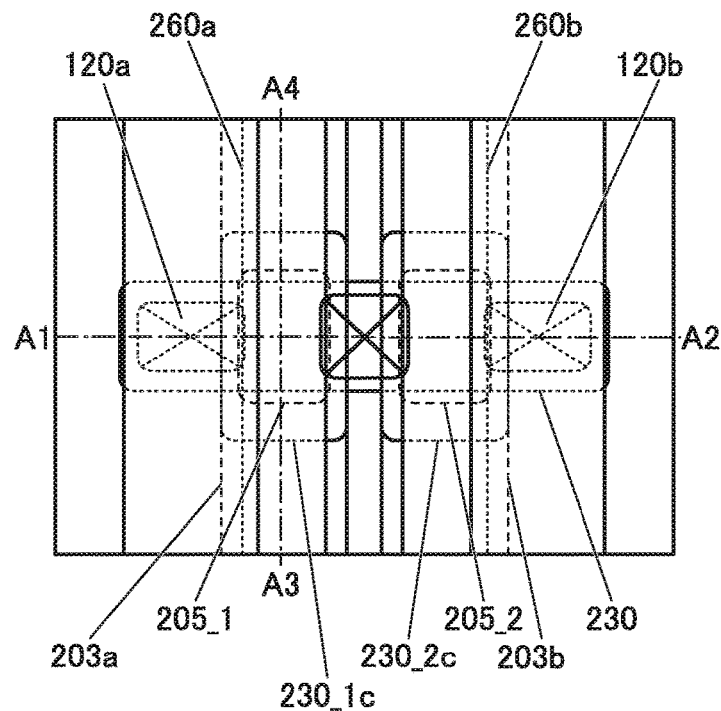
FIGS. 19A to 19C are a top view and cross sections illustrating a method for manufacturing a semiconductor device according to one embodiment of the present invention.
Figure 19C:
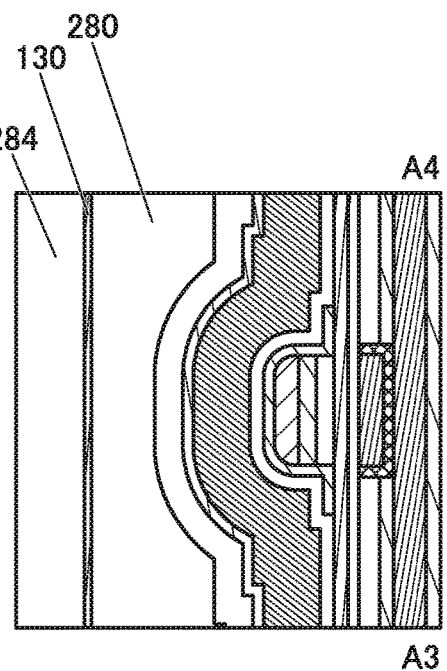
Figure 19B:
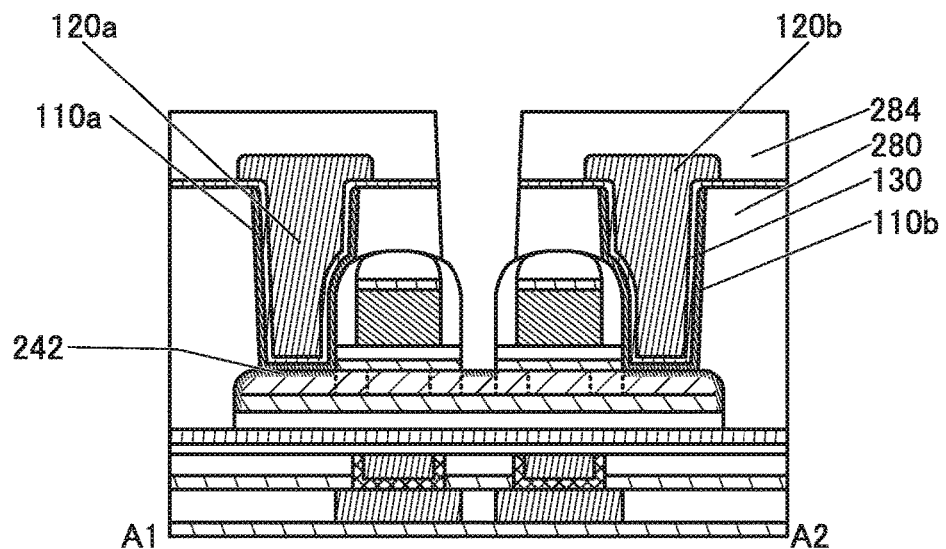
Figure 20A:
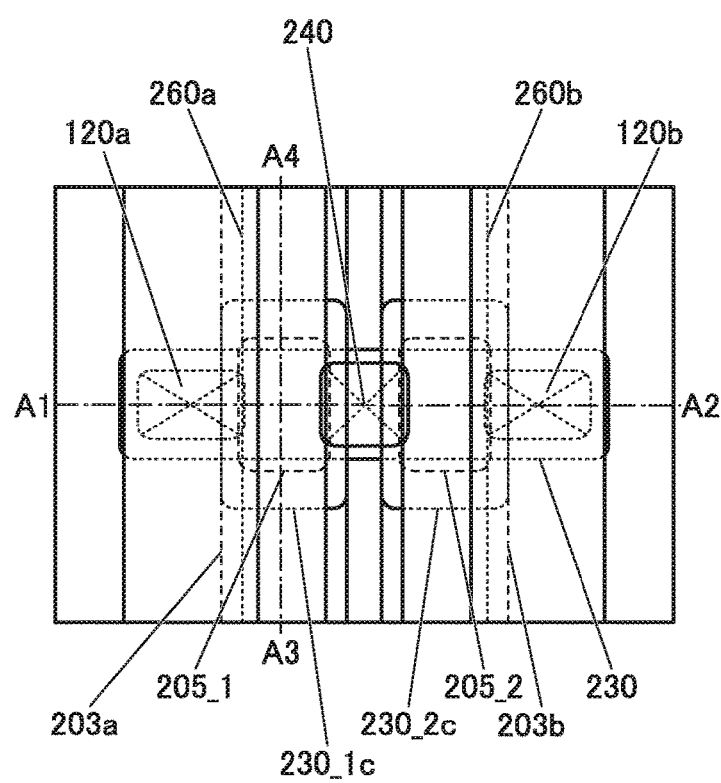
FIGS. 20A to 20C are a top view and cross sections illustrating a method for manufacturing a semiconductor device according to one embodiment of the present invention.
Figure 20C:
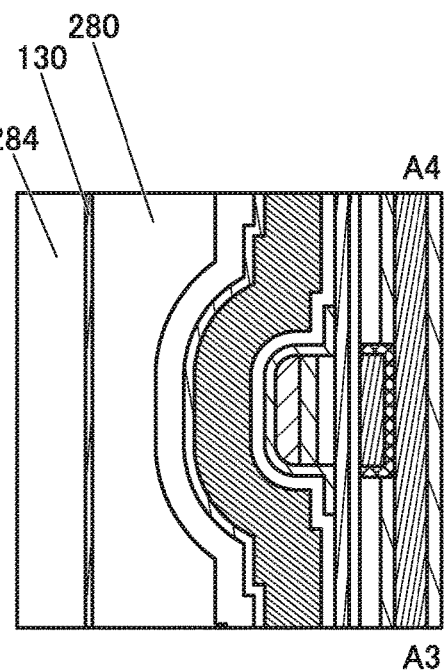
Figure 20B:
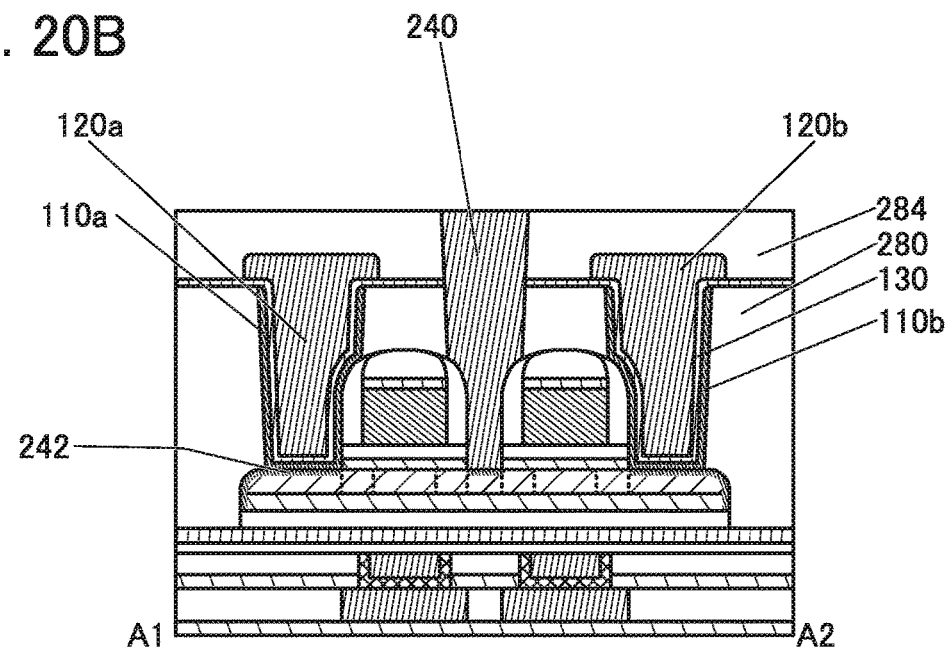

Subsequently, the conductive film to be the conductors 120a and 120b is processed to form the conductors 120a and 120b (see FIGS. 18A to 18C).

Next, the insulator 284 is formed over the conductor 120a, the conductor 120b, and the insulator 130. Subsequently, an opening that reaches the region 231 of the oxide 230 is formed in the insulator 280, the insulator 130, and the insulator 284 (see FIGS. 19A to 19C). Since the opening has a high aspect ratio, anisotropic etching is preferably performed. Note that the opening provided in the insulators 280, 130, and 284 may be formed by etching in a manner similar to that for forming the openings in the insulator 280.

The opening provided in the insulators 280, 130, and 284 is preferably provided such that one or both of the insulators 275a and 275b are exposed. Accordingly, the conductor 240 is provided in contact with one or both of the side surfaces of the insulators 275a and 275b.

Thus, the opening is preferably formed under a condition where the insulator 275a or the insulator 275b is hardly etched; in other words, the etching rate of the insulator 280 is preferably higher than that of the insulator 275a or the insulator 275b. When the etching rate of the insulator 275a or the insulator 275b is set to 1, the etching rate of the insulator 280 is preferably set to 5 or more, further preferably 10 or more. With such an opening condition, the opening can be positioned near the region 231 in a self-aligned manner; thus, a miniaturized transistor can be manufactured. In addition, tolerance of misalignment of the conductor 260a, the conductor 260b, and the opening can be extended in a lithography process; thus, the yield should be improved.

Here, the region 231 may be subjected to ion implantation by an ion implantation method, an ion doping method by which an ionized source gas is added without mass separation, a plasma immersion ion implantation method, or the like. Ions cannot reach the oxide 230 because of the insulator 280, except through the opening. In other words, ions can be implanted into the opening in a self-aligned manner. This ion implantation can increase the carrier density of the region 231 in the opening, and thus the contact resistance between the conductor 240 and the region 231 can be reduced in some cases.

Next, a conductive film to be the conductor 240 is formed. The conductive film to be the conductor 240 desirably has a stacked-layer structure which includes a conductor having a function of inhibiting the passage of impurities such as water or hydrogen. For example, a stacked-layer structure of tantalum nitride, titanium nitride, or the like and tungsten, molybdenum, copper, or the like can be employed. The conductive film to be the conductor 240 can be formed by a sputtering method, a CVD method, an MBE method, a PLD method, an ALD method, or the like.

Next, CMP treatment is performed to remove the conductive film to be the conductor 240 that is over the insulator 284. As a result, the conductive film remains only in the opening, so that the conductor 240 having a flat top surface can be formed (see FIGS. 20A to 20C).

The conductor 240 may be formed after aluminum oxide is formed on a side wall portion of the opening. By forming aluminum oxide on the side wall portion of the opening, the passage of oxygen from the outside can be inhibited and oxidation of the conductor 240 can be prevented. Furthermore, impurities such as water or hydrogen can be prevented from being diffused from the conductor 240 to the outside. The aluminum oxide can be formed by forming aluminum oxide in the opening by an ALD method or the like and then performing anisotropic etching.

Next, a conductive film to be the conductor 246 is formed over the insulator 284 and the conductor 240. The conductive film to be the conductor 246 desirably has a stacked-layer structure. For example, a stacked-layer structure of tantalum nitride, titanium, titanium nitride, or the like and aluminum, tungsten, molybdenum, copper, or the like can be employed. The conductive film to be the conductor 246 can be formed by a sputtering method, a CVD method, an MBE method, a PLD method, an ALD method, or the like.

Next, the conductive film to be the conductor 246 is processed by a lithography method, so that the conductor 246 is formed.

Through the above steps, the semiconductor device including the transistor 200a, the transistor 200b, the capacitor 100a, and the capacitor 100b illustrated in FIGS. 1A to 1C can be manufactured.

<Modification Example of Semiconductor Device>

Figure 22A:
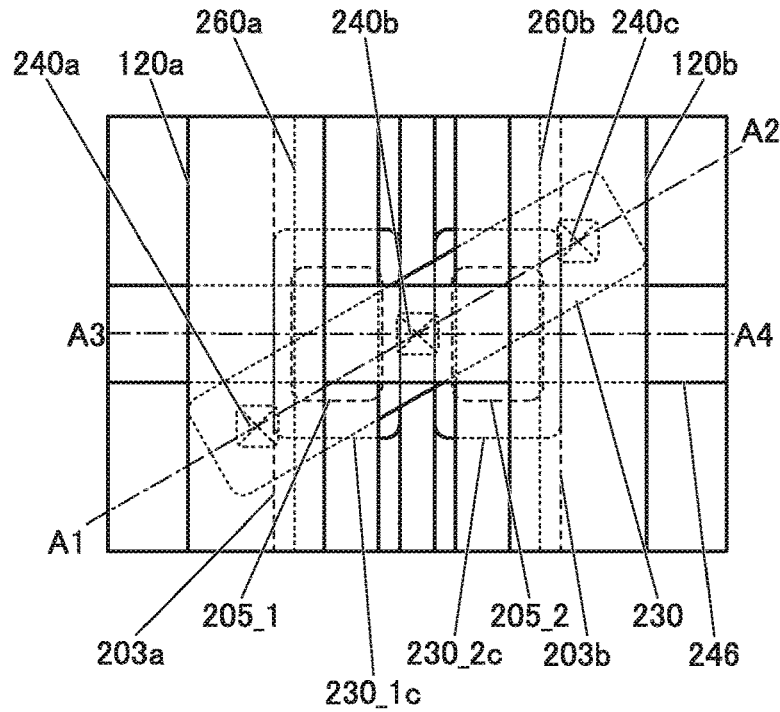
FIGS. 22A and 22B are a top view and a cross section of a semiconductor device according to one embodiment of the present invention.
Figure 22B:
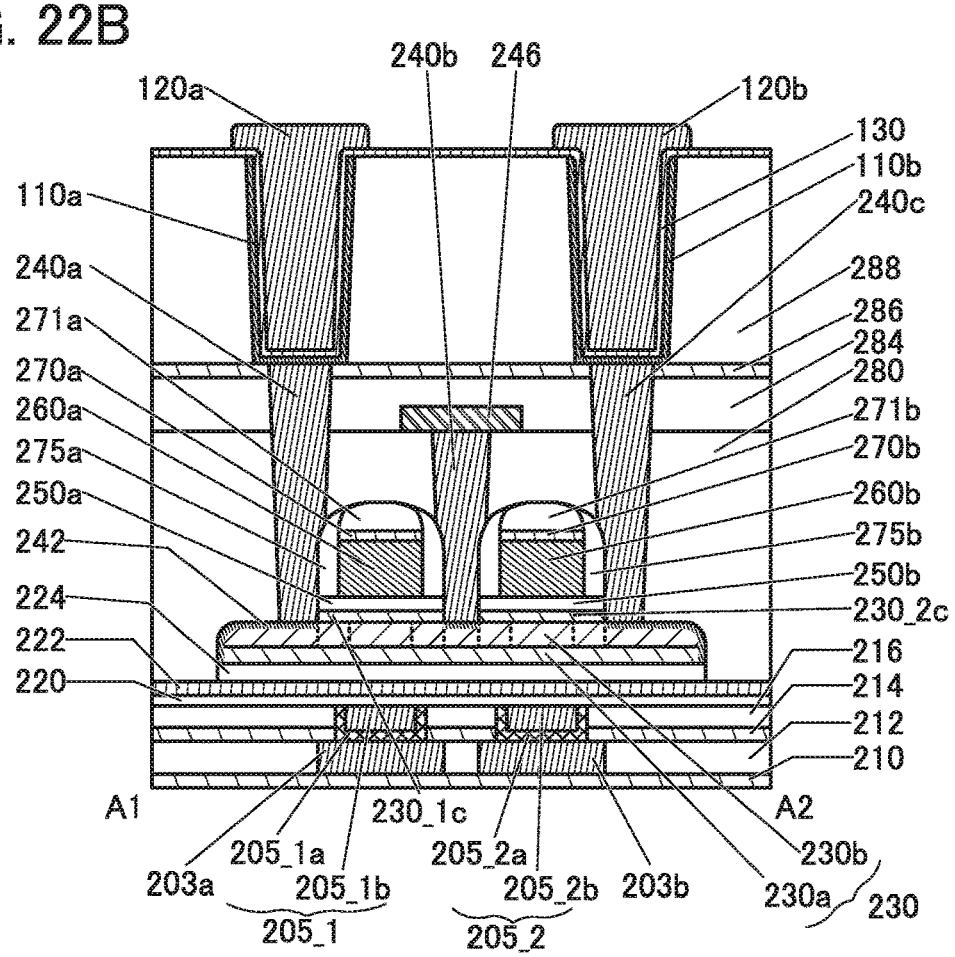
Figure 23A:
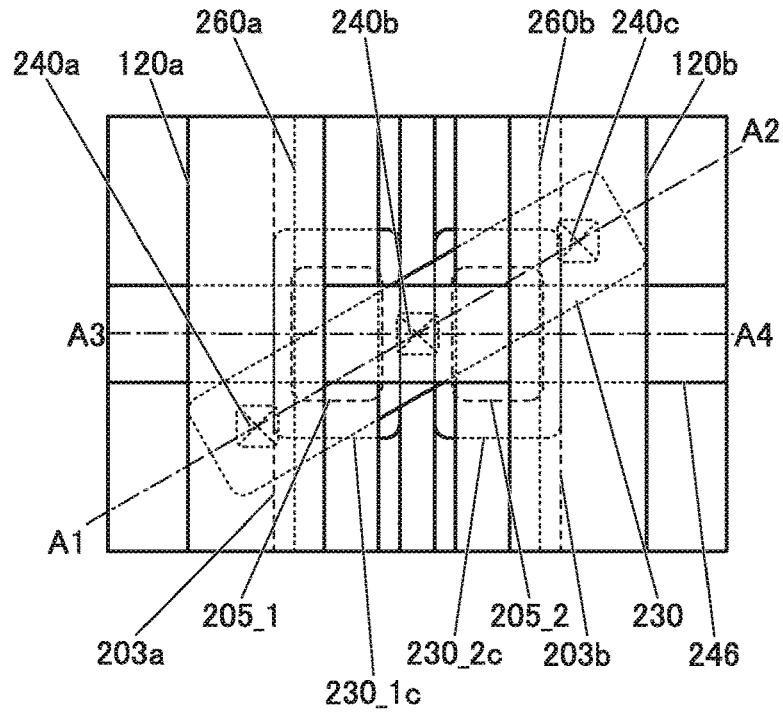
FIGS. 23A and 23B are a top view and a cross section of a semiconductor device according to one embodiment of the present invention.
Figure 23B:
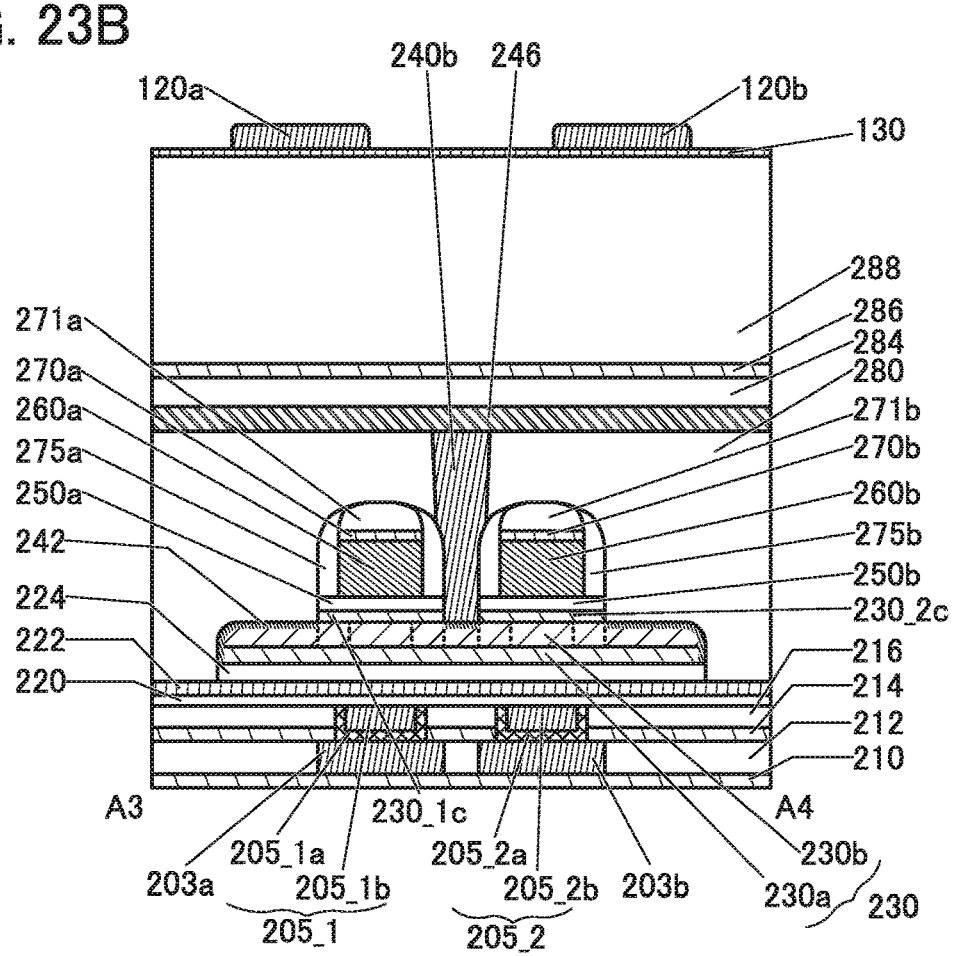

FIGS. 22A and 22B and FIGS. 23A and 23B illustrate an example of a semiconductor device including the capacitor 100a, the capacitor 100b, the transistor 200a, and the transistor 200b. FIG. 22A and FIG. 23A are each a top view of the semiconductor device. For simplification of the drawings, some films are omitted in FIG. 22A and FIG. 23A. FIG. 22B is a cross section taken along dashed-dotted line A1-A2 illustrated in FIG. 22A. FIG. 23B is a cross section taken along dashed-dotted line A3-A4 illustrated in FIG. 23A.

Note that in the semiconductor device illustrated in FIGS. 22A and 22B and FIGS. 23A and 23B, components having the same functions as the components in the semiconductor device illustrated in FIGS. 1A to 1C and FIGS. 2A to 2C are denoted by the same reference numerals.

The structure illustrated in FIGS. 22A and 22B and FIGS. 23A and 23B is different from the structure in FIGS. 1A to 1C and FIGS. 2A to 2C in that a conductor 240a for making a contact is provided between the capacitor 100a and the transistor 200a and a conductor 240c for making a contact is provided between the capacitor 100b and the transistor 200b. The conductors 240a and 240c are formed in openings provided in the insulator 280, the insulator 284, and an insulator 286.

The insulator 286 and an insulator 288 are provided over the insulator 284, and the capacitor 100a and the capacitor 100b are provided in openings provided in the insulator 288. The insulator 286 may function as an etching stopper film at the time of forming the openings in the insulator 288.

That is, unlike in the structure of FIGS. 1A to 1C and FIGS. 2A to 2C, the capacitor 100a and the capacitor 100b are provided in another layer in the structure of FIGS. 22A and 22B and FIGS. 23A and 23B. In other words, the structures of the conductor 240a, a conductor 240b, and the conductor 240c do not depend on the design values of the capacitor 100a and the capacitor 100b; thus, design flexibility is improved. With such a structure, the design flexibility of the capacitors 100a and 100b is also improved.

Another different point is that the conductor 240b for making a contact with the transistor 200a and the transistor 200b is formed in an opening provided in the insulator 280. Thus, the conductor 246 is provided over the insulator 280 and the insulator 284 is provided over the conductor 246.

The conductor 240a and the conductor 240c can be formed at the same time. Thus, the structure illustrated in FIGS. 22A and 22B and FIGS. 23A and 23B can be manufactured without a large increase in the number of steps.

In the structure illustrated in FIGS. 1A to 1C and FIGS. 2A to 2C, the oxide 230 is provided such that the long side of the oxide 230 is substantially perpendicular to the extending direction of the conductor 260a or 260b. In contrast, in the structure illustrated in FIGS. 22A and 22B and FIGS. 23A and 23B, the oxide 230 is provided such that the long side of the oxide 230 is inclined with respect to the extending direction of the conductor 260a or 260b.

For example, the oxide 230 may be provided such that an angle formed between the long side of the oxide 230 and the extending direction of the conductor 260a or 260b is more than or equal to 20° and less than or equal to 70°, preferably more than or equal to 30° and less than or equal to 60°.

With the structure where the oxide 230 is obliquely provided, an area occupied by the cell array can be made small.

<Application Example of Semiconductor Device>

Figure 24:
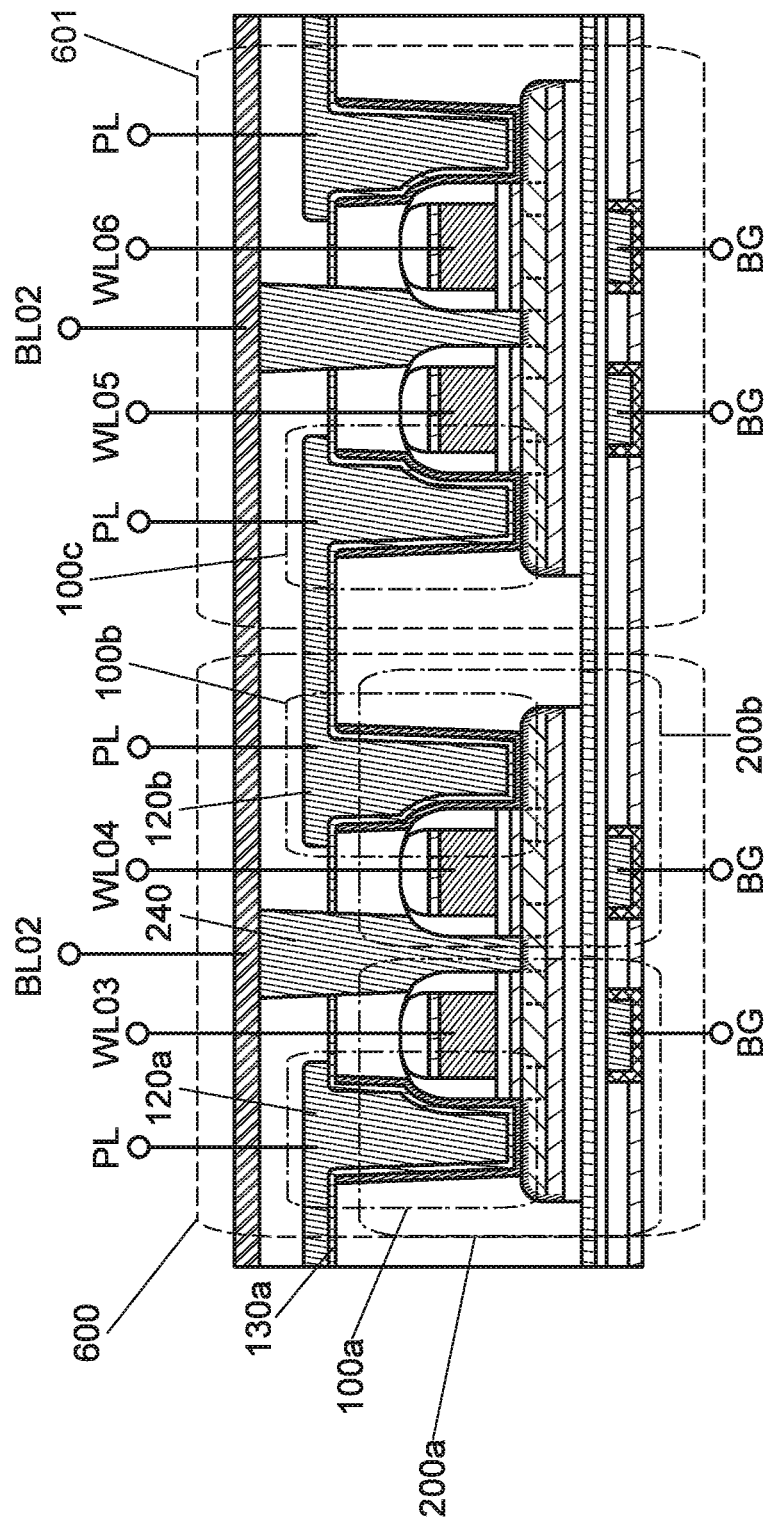
FIG. 24 is a cross section of a semiconductor device according to one embodiment of the present invention.

In the above description, the semiconductor device including the transistor 200a, the transistor 200b, the capacitor 100a, and the capacitor 100b is given as a structural example; however, the semiconductor device according to this present embodiment is not limited to this example. For example, as illustrated in FIG. 24, a structure in which a cell 600 and a cell 601 having a structure similar to that of the cell 600 are connected through a capacitor portion may be employed. Note that in this specification, the semiconductor device including the transistor 200a, the transistor 200b, the capacitor 100a, and the capacitor 100b is referred to as a cell. The above descriptions for the transistor 200a, the transistor 200b, the capacitor 100a, and the capacitor 100b can be referred to for the structures of the transistor 200a, the transistor 200b, the capacitor 100a, and the capacitor 100b.

FIG. 24 is a cross section of the cell 600 including the transistor 200a, the transistor 200b, the capacitor 100a, and the capacitor 100b and the cell 601 having a structure similar to that of the cell 600 that are connected through a capacitor portion.

As shown in FIG. 24, the conductor 120b that functions as the other electrode of the capacitor 100b included in the cell 600 also functions as the other electrode of a capacitor 100c included in the cell 601. Furthermore, the conductor 120a that functions as the other electrode of the capacitor 100a included in the cell 600 also functions as the other electrode of a capacitor included in the adjacent cell on the left side of the cell 600, although not shown. The same applies to the cell on the right side of the cell 601. Thus, a cell array can be formed. With this structure of the cell array, the distance between the adjacent cells can be reduced; thus, the projected area of the cell array can be reduced and high integration can be achieved.

When the transistor 200a, the transistor 200b, the capacitor 100a, and the capacitor 100b are formed to have the structures described above in this embodiment, the area of the cell can be reduced and the semiconductor device can be miniaturized or highly integrated.

[Configuration of Cell Array]

Figure 25:
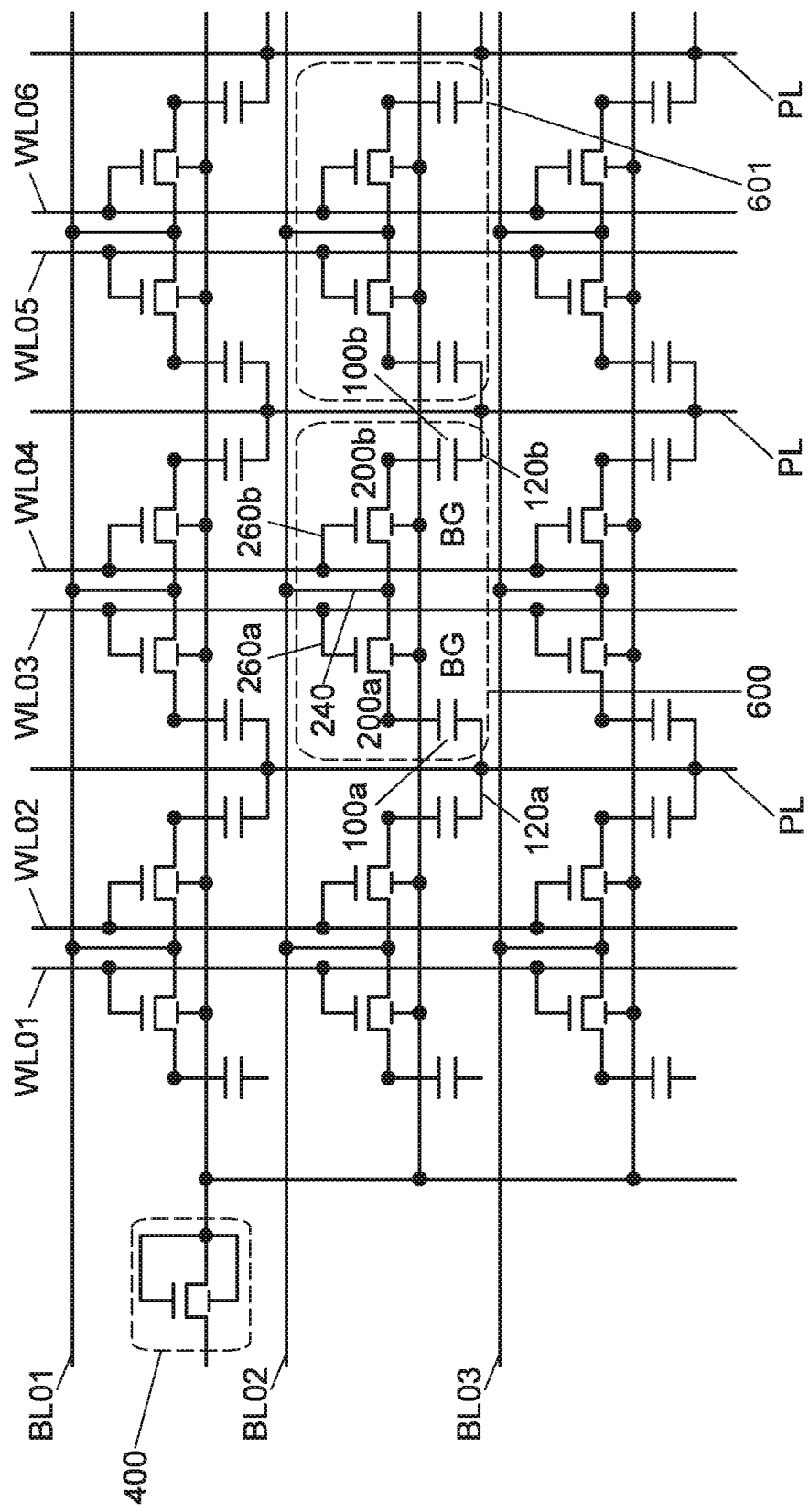
FIG. 25 is a circuit diagram of a semiconductor device according to one embodiment of the present invention.

FIG. 25 illustrates an example of a cell array of this embodiment. For example, the cells each having the structure illustrated in FIG. 24 can be arranged in a matrix to form a cell array.

FIG. 25 is a circuit diagram showing an embodiment in which the cells each having the structure in FIG. 24 are arranged in a matrix. In the cell array shown in FIG. 25, wirings BL extend in a row direction and wirings WL extend in a column direction.

As illustrated in FIG. 25, one of the source and the drain of each of the transistor 200a and the transistor 200b which are included in the cell is electrically connected to the common wiring BL (BL01, BL02, or BL03). Furthermore, the wiring BL is also electrically connected to one of the source and the drain of each of the transistors 200a and 200b included in the cells arranged in the row direction. The first gate of the transistor 200a and the first gate of the transistor 200b which are included in the cell are electrically connected to different wirings WL (any of WL01 to WL06). Furthermore, these wirings WL are electrically connected to the first gates of the transistors 200a and the first gates of the transistors 200b which are included in the cells arranged in the column direction.

For example, in the cell connected to the BL02, the WL03, and the WL04 in FIG. 25, the conductor 240 is electrically connected to the BL02, the conductor 260a is electrically connected to the WL03, and the conductor 260b is electrically connected to the WL04.

In addition, the transistor 200a and the transistor 200b which are included in the cell may each be provided with a second gate BG. The threshold voltage of the transistor can be controlled by a potential applied to the BG. The BG is connected to a transistor 400 and the potential applied to the BG can be controlled by the transistor 400. Furthermore, the conductor 120a of the capacitor 100a and the conductor 120b of the capacitor 100b which are included in the cell are electrically connected to different wirings PL.

Figure 26:
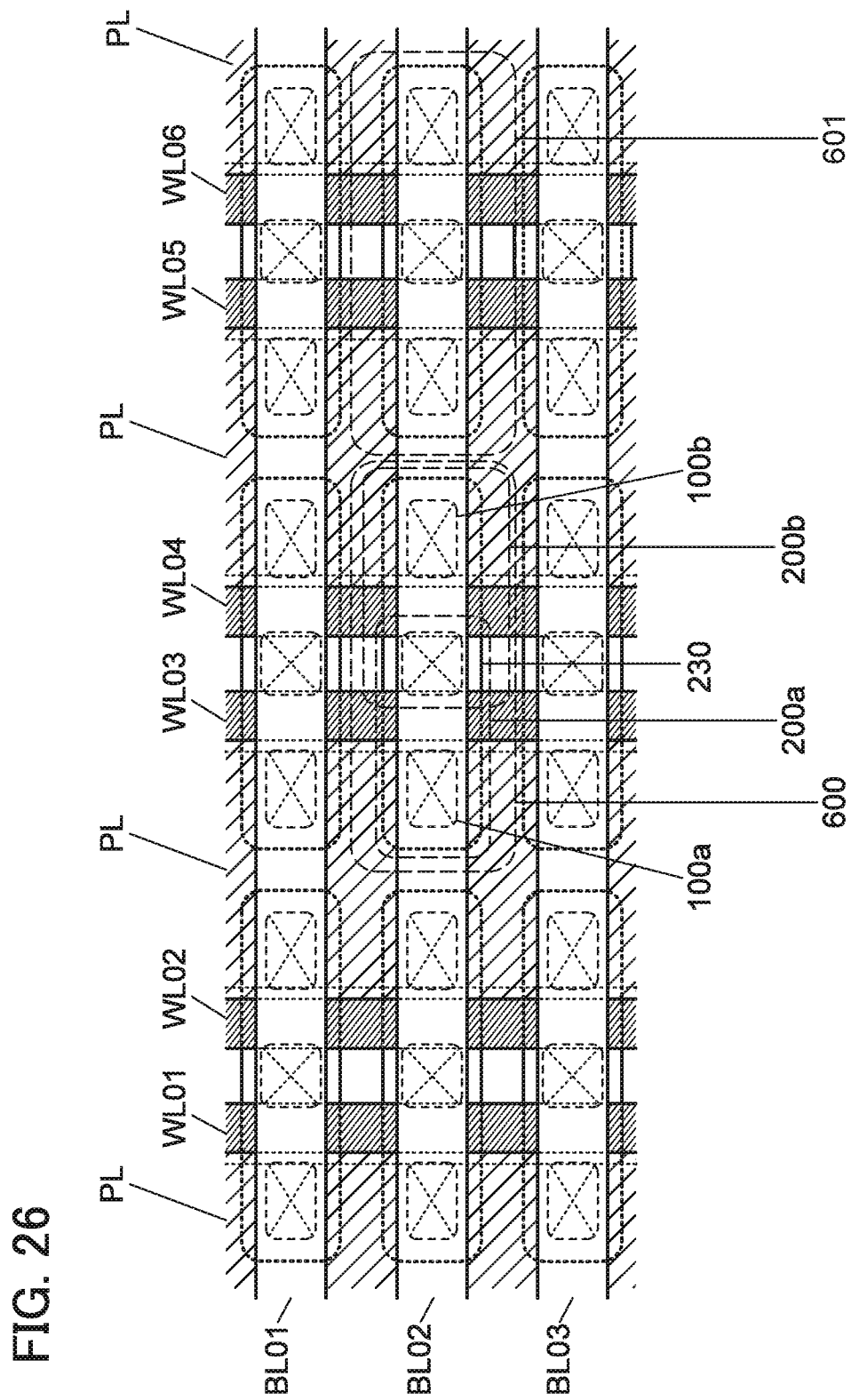
FIG. 26 is a top view of a semiconductor device according to one embodiment of the present invention.

FIG. 26 is a schematic view showing a layout of the wirings WL and the oxides 230 of the circuit diagram shown in FIG. 25. As shown in FIG. 26, the oxides 230 and the wirings WL are arranged in a matrix, whereby the semiconductor device of the circuit diagram shown in FIG. 25 can be formed. Here, the wirings BL are preferably provided in a layer different from those for the wirings WL and the oxides 230. In particular, when the capacitors 100a and 100b are provided in a layer lower than that for the wirings BL, the wirings BL and the long-side direction of the oxides 230 can be substantially parallel to each other. Accordingly, the layout of the cell can be simplified, the design flexibility is improved, and the manufacturing cost can be reduced.

The oxides 230 and the wirings WL are provided such that the long sides of the oxides 230 are substantially perpendicular to the extending direction of the wirings WL in FIG. 26; however, the layout is not limited thereto.

Figure 27:
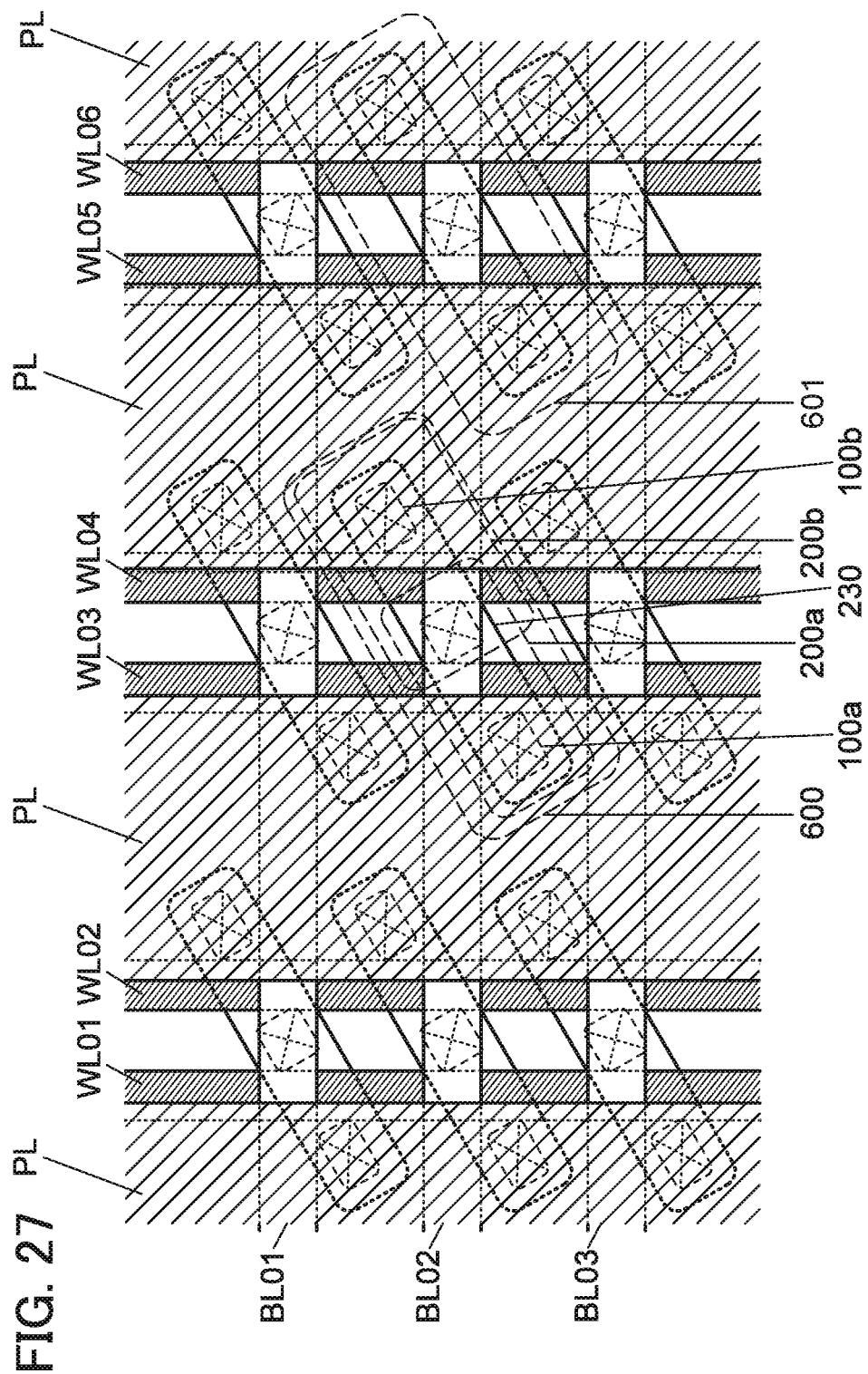
FIG. 27 is a top view of a semiconductor device according to one embodiment of the present invention.

For example, as shown in FIG. 27, the long side of the oxide 230 is not necessarily perpendicular to the extending direction of the wirings WL and the long side of the oxide 230 may be inclined with respect to the extending direction of the wirings WL. The oxide 230 and the wiring WL are preferably provided such that an angle formed between the long side of the oxide 230 and the extending direction of the wiring WL is more than or equal to 200 and less than or equal to 70°, preferably more than or equal to 300 and less than or equal to 600. By arranging the oxides 230 obliquely, an area occupied by the cell array can be made small.

Furthermore, stacked cell arrays may be used instead of the single-layer cell array. When a plurality of cell arrays are stacked, cells can be integrated without increasing the area occupied by the cell arrays. That is, a 3D cell array can be formed.

As described above, according to one embodiment of the present invention, a semiconductor device that can be miniaturized or highly integrated can be provided. According to one embodiment of the present invention, a semiconductor device having favorable electrical characteristics can be provided. According to one embodiment of the present invention, a semiconductor device with low off-state current can be provided. According to one embodiment of the present invention, a transistor with high on-state current can be provided. According to one embodiment of the present invention, a semiconductor device with high reliability can be provided. According to one embodiment of the present invention, a semiconductor device with low power consumption can be provided. According to one embodiment of the present invention, a semiconductor device with high productivity can be provided.

The structures, methods, and the like described in this embodiment can be combined as appropriate with any of the structures, methods, and the like described in the other embodiments.

Embodiment 2

In this embodiment, one embodiment of a semiconductor device will be described with reference to FIG. 28.

[Memory Device 1]

Figure 28:
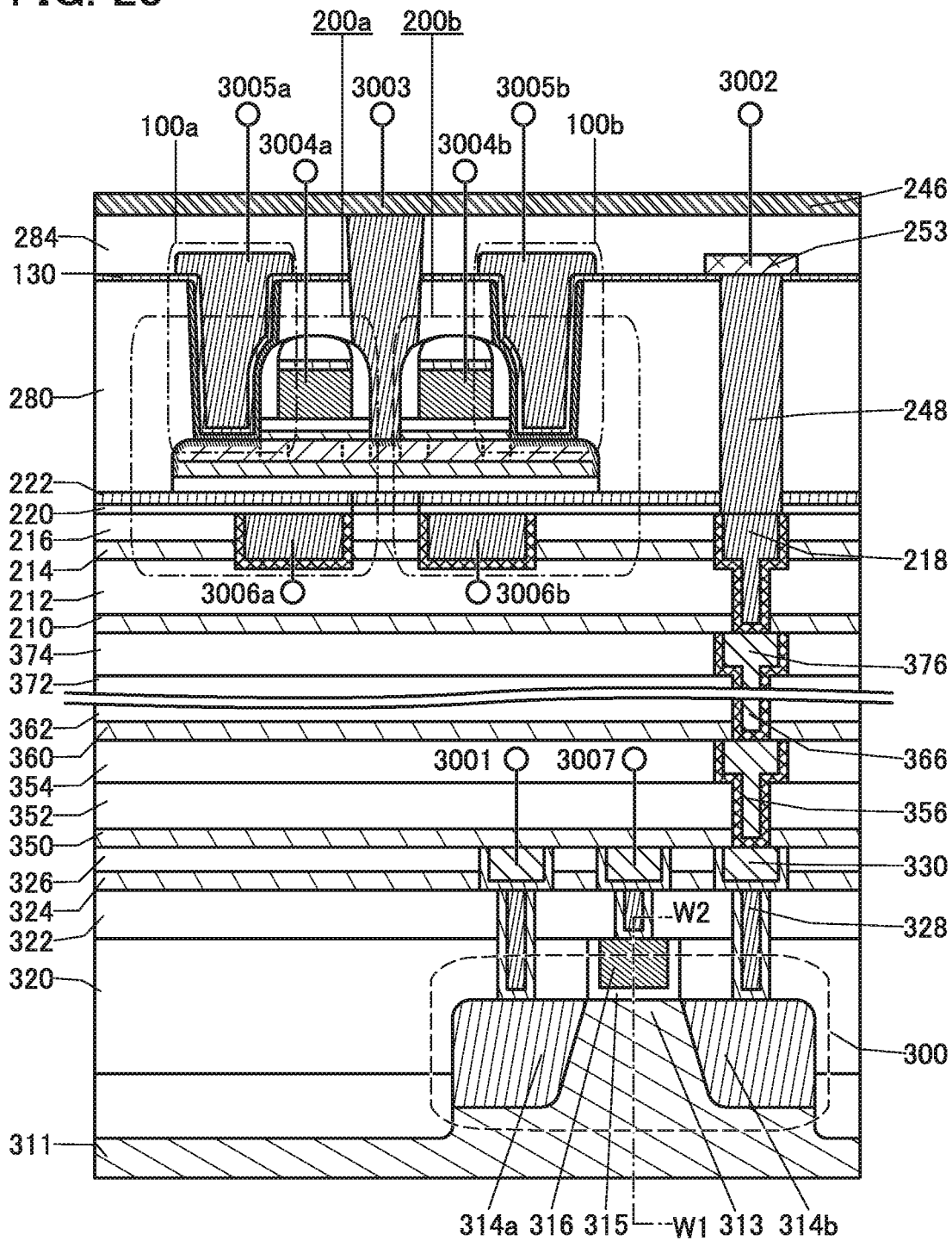
FIG. 28 is a cross section illustrating a structure of a memory device according to one embodiment of the present invention.
Figure 29:
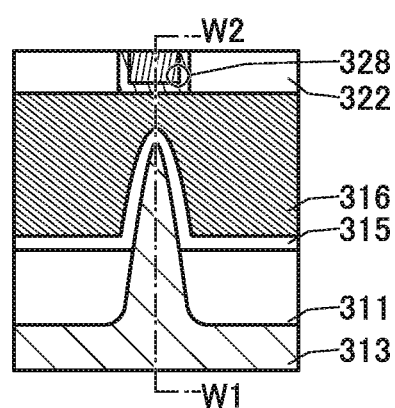
FIG. 29 is a cross section illustrating a structure of a memory device according to one embodiment of the present invention.

The memory device shown in FIG. 28 includes the transistor 200a, the capacitor 100a, the transistor 200b, the capacitor 100b, and the transistor 300. FIG. 28 is a cross section of the transistor 200a, the transistor 200b, and the transistor 300 in the channel length direction. FIG. 29 is a cross section taken along dashed-dotted line W1-W2 in FIG. 28. Thus, FIG. 29 is a cross section of the transistor 300 and the vicinity thereof in the channel width direction.

The transistor 200a and the transistor 200b are transistors in which a channel is formed in a semiconductor layer including an oxide semiconductor. Since the off-state current of the transistor 200a and the transistor 200b are small, by using the transistor 200a and the transistor 200b in a memory device, stored data can be retained for a long time. In other words, such a memory device does not require refresh operation or has an extremely low frequency of the refresh operation, which leads to a sufficient reduction in power consumption.

In the memory device of FIG. 28, a wiring 3001 is electrically connected to one of the source and the drain of the transistor 300. A wiring 3002 is electrically connected to the other of the source and the drain of the transistor 300. A wiring 3007 is electrically connected to the gate of the transistor 300. Furthermore, a wiring 3003 is electrically connected to one of the source and the drain of the transistor 200a and one of the source and the drain of the transistor 200b. A wiring 3004a is electrically connected to the first gate of the transistor 200a, a wiring 3004b is electrically connected to the first gate of the transistor 200b, a wiring 3006a is electrically connected to the second gate of the transistor 200a, and a wiring 3006b is electrically connected to the second gate of the transistor 200b. Furthermore, a wiring 3005a is electrically connected to one electrode of the capacitor 100a and a wiring 3005b is electrically connected to one electrode of the capacitor 100b.

The semiconductor device illustrated in FIG. 28 can be used for a memory device including an oxide transistor, such as a DOSRAM described later. Since the potential of the other of the source and the drain (also referred to the other electrode of the capacitor 100a and the capacitor 100b) can be retained owing to the low off-state current of the transistor 200a and the transistor 200b, data can be written, retained, and read.

<Structure of Memory Device 1>

The semiconductor device of one embodiment of the present invention includes the transistor 300, the transistor 200a, the transistor 200b, the capacitor 100a, and the capacitor 100b as illustrated in FIG. 28. The transistor 200a and the transistor 200b are provided above the transistor 300, and the transistor 200a, the transistor 200b, the capacitor 100a, and the capacitor 100b are positioned in the same layer. Note that the above embodiment can be referred to for the structure of the transistor 200a, the transistor 200b, the capacitor 100a, and the capacitor 100b.

The transistor 300 is provided over a substrate 311 and includes a conductor 316, an insulator 315, a semiconductor region 313 that is a part of the substrate 311, and low-resistance regions 314a and 314b functioning as a source and a drain.

As shown in FIG. 29, the top surface and the side surface in the channel width direction of the semiconductor region 313 of the transistor 300 are covered with the conductor 316 with the insulator 315 provided therebetween. The effective channel width is increased in the FIN-type transistor 300, whereby the on-state characteristics of the transistor 300 can be improved. In addition, since contribution of the electric field of the gate electrode can be increased, the off-state characteristics of the transistor 300 can be improved.

The transistor 300 may be a p-channel transistor or an n-channel transistor.

It is preferable that a region of the semiconductor region 313 where a channel is formed, a region in the vicinity thereof, the low-resistance regions 314a and 314b functioning as a source and a drain, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs or the like.

The low-resistance regions 314a and 314b contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a material used for a conductor determines the work function, whereby a threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistor 300 illustrated in FIG. 28 is only an example and the structure of the transistor 300 is not limited to that illustrated therein; an appropriate transistor may be used in accordance with a circuit configuration or a driving method.

An insulator 320, an insulator 322, an insulator 324, and an insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen and impurities from diffusing from the substrate 311, the transistor 300, or the like into regions where the transistor 200a and the transistor 200b are provided.

As an example of the film having a barrier property with respect to hydrogen, silicon nitride formed by a CVD method can be given. Here, diffusion of hydrogen into a semiconductor element including an oxide semiconductor, such as the transistor 200a and the transistor 200b, degrades the characteristics of the semiconductor element in some cases. Therefore, a film that prevents hydrogen diffusion is preferably provided between the transistor 200a, the transistor 200b, and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of higher than or equal to 50° C. and lower than or equal to 500° C., for example.

Note that the permittivity of the insulator 326 is preferably lower than that of the insulator 324. For example, the relative permittivity of the insulator 326 is preferably lower than 4, further preferably lower than 3. For example, the relative permittivity of the insulator 326 is preferably 0.7 times or less that of the insulator 324, further preferably 0.6 times or less that of the insulator 324. In the case where a material with a low permittivity is used as an interlayer film, the parasitic capacitance between wirings can be reduced.

The conductor 328, the conductor 330, and the like that are electrically connected to the transistor 300 are provided in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a layered structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, an insulator 350, an insulator 352, and an insulator 354 are sequentially stacked in FIG. 28. Furthermore, a conductor 356 is formed in the insulator 350, the insulator 352, and the insulator 354. The conductor 356 functions as a plug or a wiring. Note that the conductor 356 can be formed using a material similar to that used for forming the conductor 328 and the conductor 330.

Note that for example, the insulator 350 is preferably formed using an insulator having a barrier property with respect to hydrogen, like the insulator 324. Furthermore, the conductor 356 preferably includes a conductor having a barrier property with respect to hydrogen. The conductor having a barrier property with respect to hydrogen is formed particularly in an opening portion of the insulator 350 having a barrier property with respect to hydrogen. In such a structure, the transistor 300 can be separated from the transistors 200a and 200b by a barrier layer, so that the diffusion of hydrogen from the transistor 300 into the transistors 200a and 200b can be inhibited.

Note that as the conductor having a barrier property with respect to hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property with respect to hydrogen is preferably in contact with the insulator 350 having a barrier property with respect to hydrogen.

In the above, a wiring layer including the conductor 356 is described; however, the memory device of this embodiment is not limited thereto. The memory device may have three or less wiring layers which are similar to the wiring layer including the conductor 356 or may have five or more wiring layers which are similar to the wiring layer including the conductor 356.

Furthermore, a wiring layer may be provided over the insulator 354 and the conductor 356. For example, a wiring layer including an insulator 360, an insulator 362, and a conductor 366 and a wiring layer including an insulator 372, an insulator 374, and a conductor 376 are stacked in this order in FIG. 28. Furthermore, a plurality of wiring layers may be provided between a wiring layer including the insulator 360, the insulator 362, and the conductor 366 and a wiring layer including the insulator 372, the insulator 374, and the conductor 376. Note that the conductor 366 and the conductor 376 function as plugs or wirings. Furthermore, the insulator 360 to the insulator 374 can be formed using a material similar to that used for forming the above-described insulator.

The insulator 210 and the insulator 212 are stacked sequentially over the insulator 374. It is preferable to use a substance having a barrier property with respect to oxygen or hydrogen for either of the insulator 210 and the insulator 212.

The insulator 210 is preferably formed using, for example, a film having a barrier property that prevents hydrogen or impurities from the substrate 311, a region where the transistor 300 is formed, or the like from diffusing to a region where the transistor 200a and the transistor 200b are formed. Therefore, the insulator 210 can be formed using a material similar to that used for forming the insulator 324.

As an example of the film having a barrier property with respect to hydrogen, silicon nitride deposited by a CVD method can be given. Here, diffusion of hydrogen into the semiconductor element including an oxide semiconductor, such as the transistor 200a and the transistor 200b, degrades the characteristics of the semiconductor element in some cases. Therefore, a film that prevents hydrogen diffusion is preferably provided between the transistors 200a and 200b and the transistor 300. Specifically, the film that prevents hydrogen diffusion is a film from which hydrogen is less likely to be released.

For the film having a barrier property with respect to hydrogen used for the insulator 210, for example, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200a and the transistor 200b in and after a manufacturing process of the transistor. In addition, release of oxygen from the oxide in the transistor 200a and the transistor 200b can be prevented. Therefore, aluminum oxide is suitably used as a protective film for the transistor 200a and the transistor 200b.

The insulator 212 can be formed using a material similar to that for the insulator 320, for example. In the case where a material with a relatively low permittivity is used for an interlayer film, the parasitic capacitance between wirings can be reduced. A silicon oxide film or a silicon oxynitride film can be used as the insulator 212, for example.

A conductor 218, a conductor included in the transistor 200a and the transistor 200b, and the like are provided in the insulators 210, 212, 214, and 216. Note that the conductor 218 functions as a plug or a wiring that is electrically connected to the transistors 200a and 200b or the transistor 300. The conductor 218 can be formed using a material similar to that used for forming the conductor 328 and the conductor 330.

In particular, part of the conductor 218 which is in contact with the insulators 210 and 214 is preferably a conductor having a barrier property with respect to oxygen, hydrogen, and water. In such a structure, the transistors 300, 200a, and 200b can be separated by the layer having a barrier property with respect to oxygen, hydrogen, and water. As a result, the diffusion of hydrogen from the transistor 300 to the transistors 200a and 200b can be prevented.

The transistor 200a, the transistor 200b, the capacitor 100a, and the capacitor 100b are provided over the insulator 212. Note that the structures of the transistor 200a, the transistor 200b, the capacitor 100a, and the capacitor 100b described in the above embodiment can be used as the structures of the transistor 200a, the transistor 200b, the capacitor 100a, and the capacitor 100b. Note that the transistor 200a, the transistor 200b, the capacitor 100a, and the capacitor 100b in FIG. 28 are just an example and are not limited to the structures shown therein; appropriate transistors may be used in accordance with the circuit structure or the driving method.

Furthermore, a conductor 248 is provided in contact with the conductor 218, so that a conductor 253 which is connected to the transistor 300 can be extracted in a top direction of the transistor 200a and the transistor 200b. The wiring 3002 is extracted in a top direction of the transistor 200a and the transistor 200b in FIG. 28; however, one embodiment of the present invention is not limited thereto. The wiring 3001, the wiring 3007, and the like may be extracted in a top direction of the transistor 200a and the transistor 200b.

The above is the description of the structure example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

<Memory Device 2>

Figure 30A:
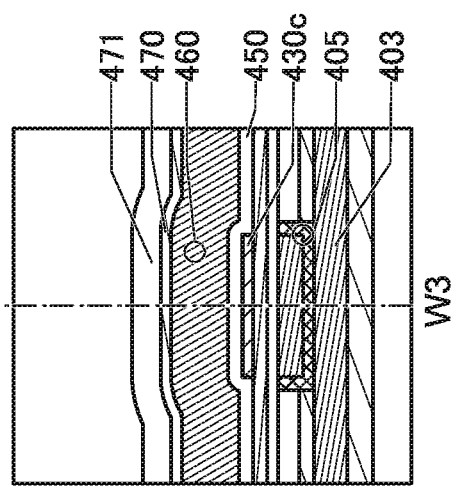
FIGS. 30A to 30C are a circuit diagram and cross sections illustrating a structure of a memory device according to one embodiment of the present invention.
Figure 30C:
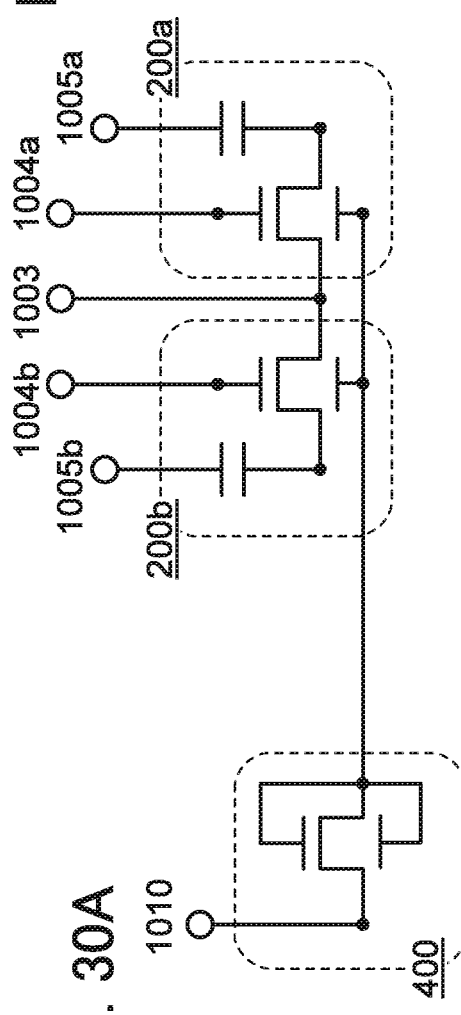
Figure 30B:
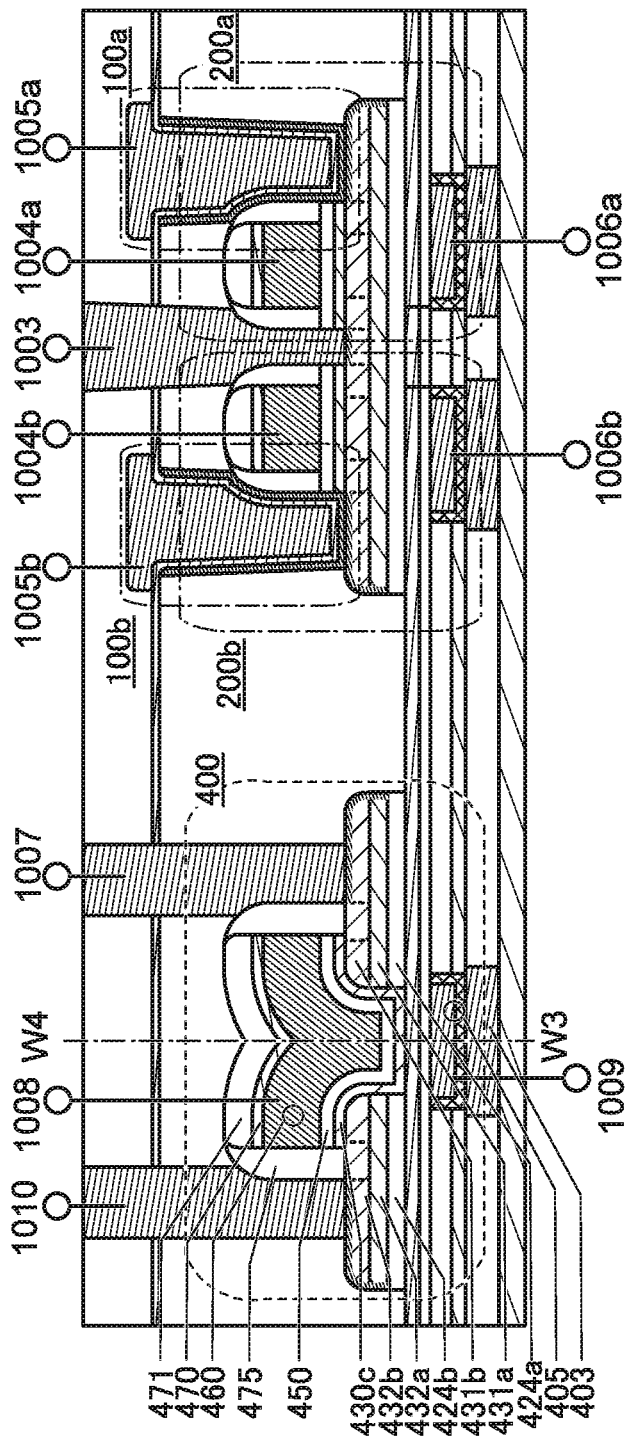

The semiconductor device illustrated in FIGS. 30A to 30C is a memory device including the transistor 400, the transistor 200a, the transistor 200b, the capacitor 100a, and the capacitor 100b. One embodiment of the memory device is described below with reference to FIGS. 30A to 30C.

FIG. 30A is a circuit diagram showing an example of the connection relation of the transistor 400, the transistor 200a, the transistor 200b, the capacitor 100a, and the capacitor 100b in the semiconductor device described in this embodiment. Furthermore, a cross section of the semiconductor device including a wiring 1003 to a wiring 1010 that correspond to those in FIG. 30A is shown in FIG. 30B. Furthermore, a cross section taken along dashed-dotted line W3-W4 in FIG. 30B is shown in FIG. 30C. FIG. 30C is a cross section in the channel width direction of a channel formation region of the transistor 400.

As shown in FIGS. 30A to 30C, a gate of the transistor 200a is electrically connected to a wiring 1004a and one of a source and a drain of the transistor 200a is electrically connected to the wiring 1003. Furthermore, the other of the source and the drain of the transistor 200a functions as one of the electrodes of the capacitor 100a. The other electrode of the capacitor 100a is electrically connected to the wiring 1005a. A gate of the transistor 200b is electrically connected to a wiring 1004b and one of a source and a drain of the transistor 200b is electrically connected to the wiring 1003. Furthermore, the other of the source and drain of the transistor 200b also functions as one of the electrodes of the capacitor 100b. The other electrode of the capacitor 100b is electrically connected to the wiring 1005b. The drain of the transistor 400 is electrically connected to the wiring 1010. As illustrated in FIG. 30B, the second gate of the transistor 200a, the second gate of the transistor 200b, and a source, a first gate, and a second gate of the transistor 400 are electrically connected through a wiring 1006a, a wiring 1006b, a wiring 1007, a wiring 1008, and a wiring 1009.

The on/off state of the transistor 200a can be controlled by application of a potential to the wiring 1004a. When the transistor 200a is on to apply a potential to the wiring 1003, charges can be supplied to the capacitor 100a through the transistor 200a. At this time, by making the transistor 200a off, the charges supplied to the capacitor 100a can be held. By application of a given potential to the wiring 1005a, the potential of a connection portion between the transistor 200a and the capacitor 100a can be controlled by capacitive coupling. For example, when a ground potential is applied to the wiring 1005a, the charges are held easily.

Similarly, the on/off states of the transistor 200b can be controlled by application of a potential to the wiring 1004b. When the transistor 200b is turned on to apply a potential to the wiring 1003, charges can be supplied to the capacitor 100b through the transistor 200b. At this time, by turning the transistor 200b off, the charges supplied to the capacitor 100b can be held. By application of a given potential to the wiring 1005b, the potential of a connection portion between the transistor 200b and the capacitor 100b can be controlled with use of capacitive coupling. For example, when a ground potential is applied to the wiring 1005b, the charges are held easily. Furthermore, by application of a negative potential to the wiring 1010, the negative potential is applied to the second gates of the transistor 200a and the transistor 200b through the transistor 400, whereby the threshold voltages of the transistor 200a and the transistor 200b can be higher than 0 V, the off-state current can be reduced, and the drain current when the first gate voltage is 0 V can be noticeably reduced.

With a structure in which the first gate and the second gate of the transistor 400 are diode-connected to the source thereof and the source of the transistor 400 is connected to the second gates of the transistor 200a and the transistor 200b, the second gate voltage of each of the transistor 200a and the transistor 200b can be controlled by the wiring 1010. When negative potentials of the second gates of the transistor 200a and the transistor 200b are held in this structure, a first gate-source voltage and a second gate-source voltage of the transistor 400 are 0 V. In the transistor 400, a drain current when the first gate voltage is 0 V is extremely low and the threshold voltage is higher than the threshold voltages of the transistor 200a and the transistor 200b; thus, with such a structure, the negative potentials of the second gates of the transistor 200a and the transistor 200b can be held for a long time even without power supply to the transistor 400.

Furthermore, the negative potentials of the second gates of the transistor 200a and the transistor 200b are held, so that the drain current at the time when the voltages of the first gates of the transistor 200a and the transistor 200b are 0 V can be extremely low even without supply of power to the transistor 200a and the transistor 200b. In other words, the charges can be held in the capacitor 100a and the capacitor 100b for a long time even without supply of power to the transistor 200a, the transistor 200b, and the transistor 400. For example, with use of the semiconductor device as a memory element, data can be retained for a long time without power supply. Therefore, a memory device with a low refresh frequency or a memory device that does not need refresh operation can be provided.

Note that the connection relation of the transistor 200a, the transistor 200b, the transistor 400, the capacitor 100a, and the capacitor 100b is not limited to that illustrated in FIGS. 30A and 30B. The connection relation can be modified as appropriate in accordance with a necessary circuit configuration.

<Structure of Memory Device 2>

FIG. 30B is a cross section of the memory device including the capacitor 100a, the capacitor 100b, the transistor 200a, the transistor 200b, and the transistor 400. Note that in the memory device illustrated in FIGS. 30A to 30C, components having the same functions as the components in the semiconductor device and the memory device described in the above embodiment and <Structure of memory device 1> are denoted by the same reference numerals.

The memory device of one embodiment of the present invention includes the transistor 400, the transistor 200a, the transistor 200b, the capacitor 100a, and the capacitor 100b as illustrated in FIGS. 30A to 30C. The transistor 400, the transistor 200a, the transistor 200b, the capacitor 100a, and the capacitor 100b are provided in the same layer.

Note that the capacitors and the transistors included in the semiconductor device described in the above embodiment and with reference to FIGS. 1A to 1C may be used as the transistor 200a, the transistor 200b, the capacitor 100a, and the capacitor 100b. Note that the capacitor 100a, the capacitor 100b, the transistor 200a, the transistor 200b, and the transistor 400 illustrated in FIGS. 30A to 30C are only an example and are not limited to the structures shown therein; appropriate transistors may be used in accordance with the circuit configuration or the driving method.

The transistor 400 and the transistors 200 are formed in the same layer and thus can be fabricated in parallel. The transistor 400 includes a conductor 460 functioning as a first gate electrode, a conductor 405 functioning as a second gate electrode, an insulator 470 over the conductor 460, an insulator 471 over the insulator 470, an insulator 475 in contact with a side surface of the conductor 460, the insulator 220, the insulator 222, an insulator 424 (an insulator 424a and an insulator 424b), and an insulator 450 functioning as the gate insulating layers, an oxide 430c including a region where a channel is formed, an oxide 431a and an oxide 431b functioning as one of a source and a drain, and an oxide 432a and an oxide 432b functioning as the other of the source and the drain. Furthermore, the conductor 405 functioning as the second gate electrode is electrically connected to a conductor 403 functioning as a wiring.

In the transistor 400, the conductor 405 is in the same layer as the conductor 205. The insulator 424 is in the same layer as the insulator 224. The oxides 431a and 432a are in the same layer as the oxide 230a, and the oxides 431b and 432b are in the same layer as the oxide 230b. The oxide 430c is in the same layer as the oxides 230_1c and 230_2c. The insulator 450 is in the same layer as the insulator 250a and the insulator 250b. The conductor 460 is in the same layer as the conductor 260a and the conductor 260b). Furthermore, the insulator 470 is in the same layer as the insulator 270a and the insulator 270b. Furthermore, the insulator 471 is in the same layer as the insulator 271a and the insulator 271b. The insulator 475 is in the same layer as the insulator 275a and the insulator 275b.

In the oxide 430c functioning as an active layer of the transistor 400, oxygen vacancies and impurities such as hydrogen or water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

With the use of the structure, a change in electrical characteristics can be suppressed and reliability can be improved in a semiconductor device including a transistor including an oxide semiconductor. The power consumption of a semiconductor device using a transistor including an oxide semiconductor can be reduced. A semiconductor device using a transistor including an oxide semiconductor can be miniaturized or highly integrated. Alternatively, a miniaturized or highly integrated semiconductor device can be provided with high productivity.

As described above, the structures, methods, and the like described in this embodiment can be combined with any of the structures, methods, and the like described in the other embodiments as appropriate.

Embodiment 3

In this embodiment, a DOSRAM (registered trademark) is described as an example of a memory device including a transistor in which an oxide is used for a semiconductor (hereinafter referred to as an OS transistor) and a capacitor, which is one embodiment of the present invention, with reference to FIG. 31 and FIGS. 32A and 32B. The term "DOSRAM" is an abbreviation of "dynamic oxide semiconductor RAM", which indicates a RAM including one transistor (1T) and one capacitor (1C).

A memory device in which OS transistors are used in memory cells (hereinafter referred to as an OS memory) is applied to the DOSRAM. The OS memory is a memory including at least a capacitor and an OS transistor that controls the charging and discharging of the capacitor. The OS memory has excellent retention characteristics because the OS transistor has an extremely low off-state current, and thus can function as a nonvolatile memory.

<DOSRAM 1400>

Figure 31:
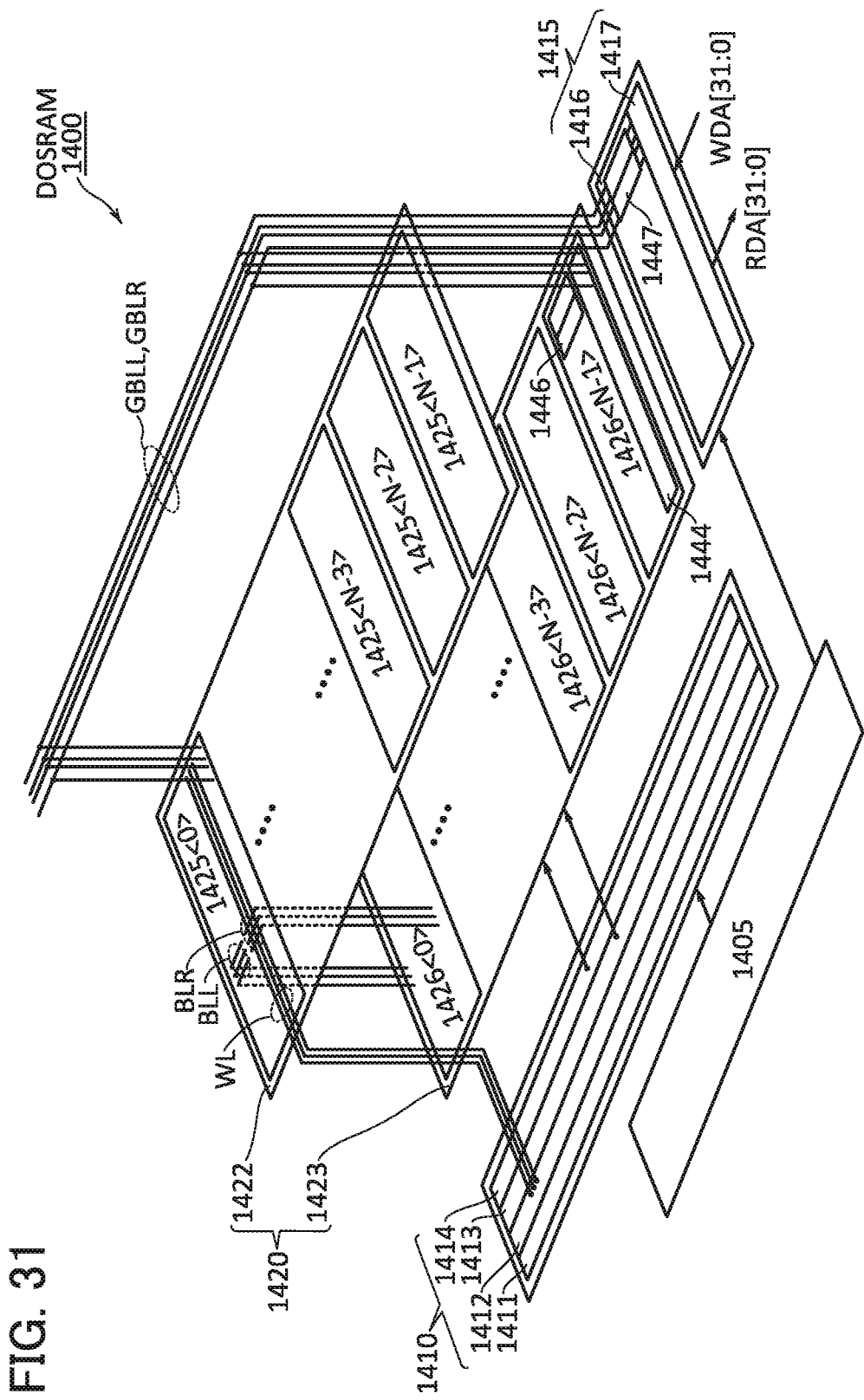
FIG. 31 is a block diagram illustrating a configuration example of a memory device according to one embodiment of the present invention.
Figure 32A:
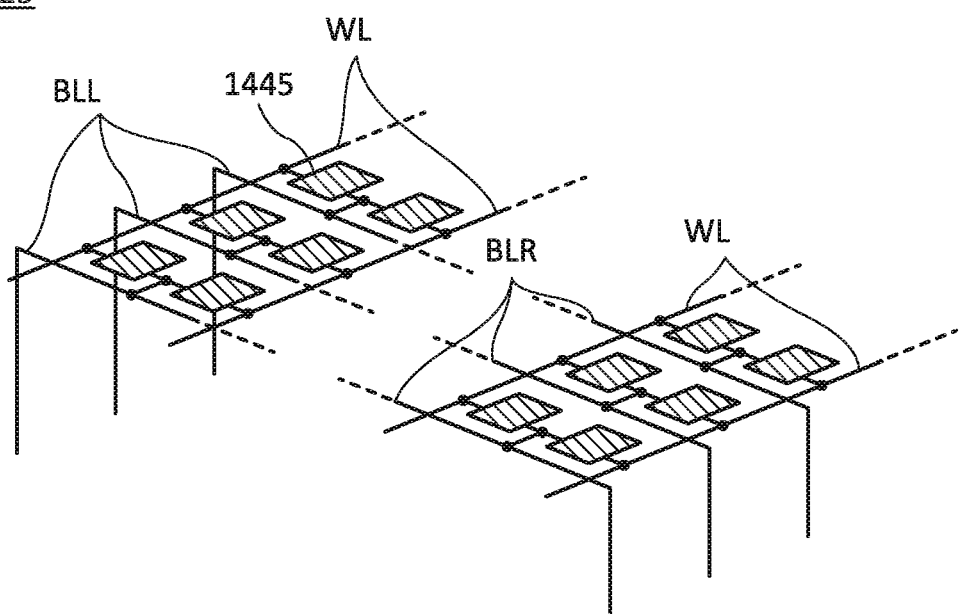
FIGS. 32A and 32B are a block diagram and a circuit diagram each illustrating a structure example of a memory device according to one embodiment of the present invention.

FIG. 31 illustrates a configuration example of the DOSRAM. As illustrated in FIG. 31, a DOSRAM 1400 includes a controller 1405, a row circuit 1410, a column circuit 1415, and a memory cell and sense amplifier array 1420 (hereinafter referred to as the MC-SA array 1420).

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts a hierarchical bit line structure, where the bit lines are layered into local and global bit lines.

The memory cell array 1422 includes N local memory cell arrays 1425<0> to 1425<N-1>, where N is an integer greater than or equal to 2. FIG. 32A illustrates a configuration example of the local memory cell array 1425. The local memory cell array 1425 includes a plurality of memory cells 1445, a plurality of word lines WL, and a plurality of bit lines BLL and BLR. In the example in FIG. 32A, the local memory cell array 1425 has an open bit-line architecture but may have a folded bit-line architecture.

Figure 32B:
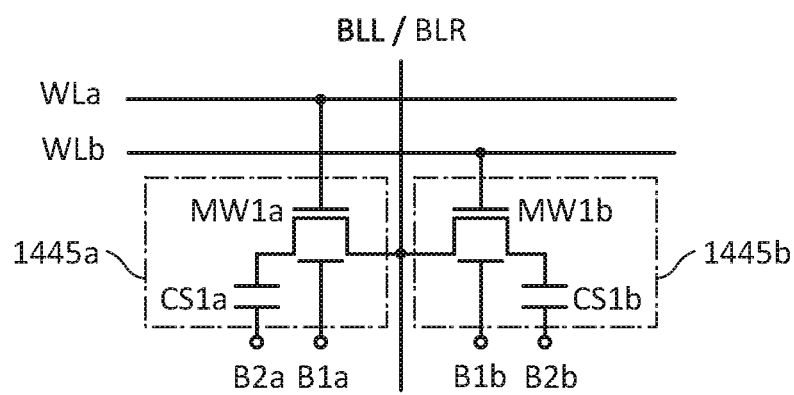

FIG. 32B illustrates a circuit configuration example of a pair of memory cells 1445a and 1445b connected to the same bit line BLL (BLR). The memory cell 1445a includes a transistor MW1a, a capacitor CS1a, and terminals B1a and B2a. The memory cell 1445a is connected to a word line WLa and the bit line BLL (BLR). The memory cell 1445b includes a transistor MW1b, a capacitor CS1b, and terminals Bib and B2b. The memory cell 1445b is connected to a word line WLb and the bit line BLL (BLR). Hereinafter, in the case where the description applies to both the memory cell 1445a and the memory cell 1445b, the memory cell 1445 and its components are described without using the letter "a" or "b", in some cases.

The transistor MW1a has a function of controlling the charging and discharging of the capacitor CS1a, and the transistor MW1b has a function of controlling the charging and discharging of the capacitor CS1b. A gate of the transistor MW1a is electrically connected to the word line WLa, a first terminal of the transistor MW1a is electrically connected to the bit line BLL (BLR), and a second terminal of the transistor MW1a is electrically connected to a first terminal of the capacitor CS1a. A gate of the transistor MW1b is electrically connected to the word line WLb, a first terminal of the transistor MW1b is electrically connected to the bit line BLL (BLR), and a second terminal of the transistor MW1b is electrically connected to a first terminal of the capacitor CS_1b.

The transistor MW1 has a function of controlling the charging and discharging of the capacitor CS1. A second terminal of the capacitor CS1 is electrically connected to the terminal B2. A constant voltage (e.g., low power supply voltage) is applied to the terminal B2.

In the case where the semiconductor device described in any of the above embodiments is used for the memory cells 1445a and 1445b, the transistor 200a can be used as the transistor MW1a, the transistor 200b can be used as the transistor MW1b, the capacitor 100a can be used as the capacitor CS1a, and the capacitor 100b can be used as the capacitor CS1b. In that case, the area occupied by each set consisting of one transistor and one capacitor in the top view can be reduced; accordingly, the memory device of this embodiment can be highly integrated. As a result, storage capacity per unit area of the memory device of this embodiment can be increased.

The transistor MW1 includes a back gate, and the back gate is electrically connected to the terminal B1. This makes it possible to change the threshold voltage of the transistor MW1 with a voltage applied to the terminal B1. For example, a fixed voltage (e.g., negative constant voltage) may be applied to the terminal B1; alternatively, the voltage applied to the terminal B1 may be changed in response to the operation of the DOSRAM 1400.

The back gate of the transistor MW1 may be electrically connected to the gate, the first terminal, or the second terminal of the transistor MW1. The transistor MW1 does not necessarily include the back gate.

The sense amplifier array 1423 includes N local sense amplifier arrays 1426<0> to 1426<N−1>. The local sense amplifier arrays 1426 each include one switch array 1444 and a plurality of sense amplifiers 1446. Each of the sense amplifiers 1446 is electrically connected to a bit line pair. The sense amplifiers 1446 each have a function of precharging the corresponding bit line pair, a function of amplifying a voltage difference of the bit line pair, and a function of retaining the voltage difference. The switch array 1444 has a function of selecting a bit line pair and electrically connecting the selected bit line pair and a global bit line pair to each other.

Here, two bit lines that are compared simultaneously by the sense amplifier are collectively referred to as the bit line pair, and two global bit lines that are compared simultaneously by the global sense amplifier are collectively referred to as the global bit line pair. The bit line pair can be referred to as a pair of bit lines, and the global bit line pair can be referred to as a pair of global bit lines. Here, the bit line BLL and the bit line BLR form one bit line pair, and the global bit line GBLL and the global bit line GBLR form one global bit line pair. In the following description, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. With the selection signal from the column selector 1413, the switch array 1444 of each local sense amplifier array 1426 is controlled. With the control signal from the sense amplifier driver circuit 1414, each of the plurality of local sense amplifier arrays 1426 is driven independently.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

Each of the global sense amplifiers 1447 is electrically connected to the global bit line pair (GBLL, GBLR). The global sense amplifiers 1447 each have a function of amplifying a voltage difference of the global bit line pair (GBLL, GBLR), and a function of retaining the voltage difference. Data is written to and read from the global bit line pair (GBLL, GBLR) by the input/output circuit 1417.

The write operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address signal, the data of the global bit line pair is written to the bit line pair of a column where data is to be written. The local sense amplifier array 1426 amplifies the written data, and then retains the amplified data. In the specified local memory cell array 1425, the word line WL of the row where data is to be written is selected by the row circuit 1410, and the data retained at the local sense amplifier array 1426 is written to the memory cell 1445 of the selected row.

The read operation of the DOSRAM 1400 is briefly described. One row of the local memory cell array 1425 is specified with an address signal. In the specified local memory cell array 1425, the word line WL of a row where data is to be read is selected, and data of the memory cell 1445 is written to the bit line. The local sense amplifier array 1426 detects a voltage difference of the bit line pair of each column as data, and retains the data. The switch array 1444 writes the data of a column specified by the address signal to the global bit line pair; the data is chosen from the data retained at the local sense amplifier array 1426. The global sense amplifier array 1416 determines and retains the data of the global bit line pair. The data retained at the global sense amplifier array 1416 is output to the input/output circuit 1417. Thus, the read operation is completed.

The DOSRAM 1400 has no limitations on the number of rewrites in principle and data can be read and written with low energy consumption, because data is rewritten by charging and discharging the capacitor CS1. A simple circuit configuration of the memory cell 1445 allows a high memory capacity.

The transistor MW1 is an OS transistor. The extremely low off-state current of the OS transistor can inhibit charge leakage from the capacitor CS1. Therefore, the retention time of the DOSRAM 1400 is considerably longer than that of a DRAM. This allows less frequent refresh, which can reduce power needed for refresh operations. Thus, the DOSRAM 1400 is suitably used for a memory device that can rewrite a large volume of data with a high frequency, for example, a frame memory used for image processing.

Since the MC-SA array 1420 has a stacked-layer structure, the bit line can be shortened to a length that is close to the length of the local sense amplifier array 1426. A shorter bit line results in smaller bit line capacitance, which allows the storage capacitance of the memory cell 1445 to be reduced. In addition, providing the switch array 1444 in the local sense amplifier array 1426 allows the number of long bit lines to be reduced. For the reasons described above, a load to be driven during access to the DOSRAM 1400 is reduced, enabling a reduction in power consumption.

Therefore, a DOSRAM including OS transistors can have a large capacity. In addition, the DOSRAM including OS transistors can retain data for a long time, which makes the refresh penalty substantially negligible. Furthermore, the DOSRAM including OS transistors can perform power gating of a peripheral circuit by utilizing the potential of the backgates.

Figure 33:
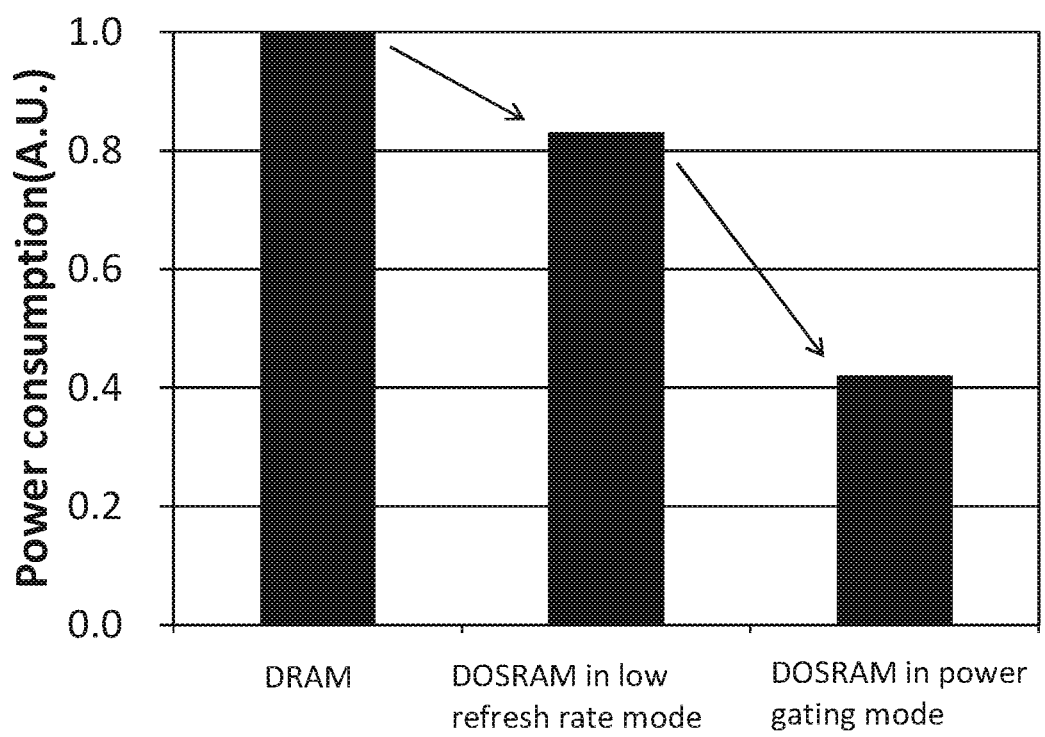
FIG. 33 illustrates the power consumption of a memory device according to one embodiment of the present invention.

FIG. 33 is a graph showing the power consumption of the DOSRAM including OS transistors relative to the power consumption of a general DRAM. The vertical axis represents the estimated power consumption in actual use when the power consumption of the general DRAM is assumed to be 1 (arbitrary unit: A.U.). The "actual use" herein is that the DOSRAM or DRAM is active for 10% of a day and on standby or in a self-refresh mode for 90% of the day. According to the graph, the power consumption of the DOSRAM including OS transistors in a low refresh rate mode is lower than the power consumption of the general DRAM by approximately 20%. Furthermore, the power consumption of the DOSRAM including OS transistors in a power gating mode is lower than the power consumption of the general DRAM by approximately 60%.

The structure described in this embodiment can be used in appropriate combination with any of the structures described in the other embodiments.

Embodiment 4

In this embodiment, an AI system in which the semiconductor device of any of the above-described embodiments is used will be described with reference to FIG. 34.

Figure 34:
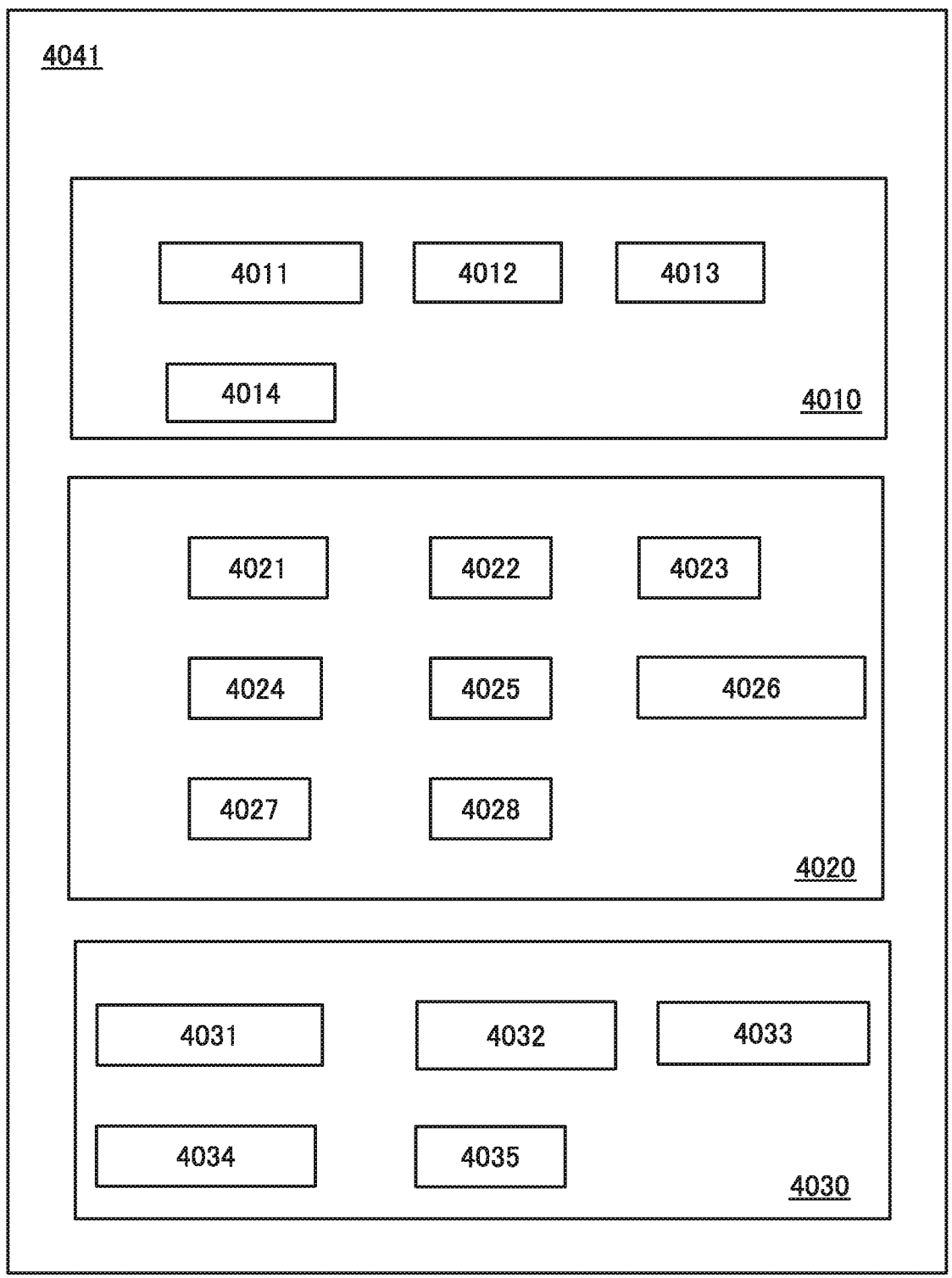
FIG. 34 is a block diagram illustrating a structure example of an AI system according to one embodiment of the present invention.

FIG. 34 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and an FPGA 4014. The DOSRAM 1400 described in the above embodiment can be used as the DOSRAM 4012.

The control portion 4020 includes a central processing unit (CPU) 4021, a graphics processing unit (GPU) 4022, a phase locked loop (PLL) 4023, a static random access memory (SRAM) 4024, a programmable read only memory (PROM) 4025, a memory controller 4026, a power supply circuit 4027, and a power management unit (PMU) 4028.

The input/output portion 4030 includes an external memory control circuit 4031, an audio codec 4032, a video codec 4033, a general-purpose input/output module 4034, and a communication module 4035.

The arithmetic portion 4010 can perform neural network learning or neural network inference.

The analog arithmetic circuit 4011 includes an analog/digital (A/D) converter circuit, a digital/analog (D/A) converter circuit, and a product-sum operation circuit.

The analog arithmetic circuit 4011 is preferably formed using an OS transistor. The analog arithmetic circuit 4011 formed using an OS transistor includes an analog memory and can execute a product-sum operation necessary for the learning and the inference with low power consumption.

The DOSRAM 4012 is a DRAM including an OS transistor. The DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in the SRAM 4024, the input data has to be stored piece by piece because of the circuit area limitation and small storage capacity of the SRAM 4024. The DOSRAM 4012 has a larger storage capacity than the SRAM 4024 because memory cells of the DOSRAM can be highly integrated even in a limited circuit area. Therefore, the DOSRAM 4012 can efficiently store the input data.

The NOSRAM 4013 is a nonvolatile memory including an OS transistor. NOSRAM (registered trademark) is an abbreviation of "nonvolatile oxide semiconductor RAM", which indicates RAM including a gain cell (2T or 3T) memory cell. As in the DOSRAM, an OS memory can be used in the NOSRAM of this embodiment.

The NOSRAM 4013 consumes less power in writing data than the other nonvolatile memories such as a flash memory, a resistive random access memory (ReRAM), and a magnetoresistive random access memory (MRAM). Furthermore, unlike a flash memory and a ReRAM which deteriorate by data writing, the NOSRAM does not have a limit on the number of times of data writing.

Furthermore, the NOSRAM 4013 can store multilevel data of two or more bits as well as one-bit binary data. The multilevel data storage in the NOSRAM 4013 leads to a reduction of the memory cell area per bit.

Because the NOSRAM 4013 can store analog data as well as digital data, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data might be included in the analog data.

Data and parameters used in the neural network calculation can be once stored in the NOSRAM 4013. The data and parameters may be stored in a memory provided outside the AI system 4041 via the CPU 4021. However, the NOSRAM 4013 provided inside the AI system 4041 can store the data and parameters more quickly with lower power consumption. Furthermore, the NOSRAM 4013 enables a longer bit line than the DOSRAM 4012 and thus can have an increased storage capacity.

The FPGA 4014 is an FPGA including an OS transistor. In the FPGA of this embodiment, an OS memory can be used for a configuration memory and a register. Here, such an FPGA is referred to as an "OS-FPGA". By including the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), a deep belief network (DBN), or the like described later, with a hardware. The connection of the neural network with a hardware enables higher speed performance.

The FPGA 4014 is an OS-FPGA. An OS-FPGA can have a smaller memory area than an FPGA formed using an SRAM. Thus, adding a context switching function only causes a small increase in area. Moreover, an OS-FPGA can transmit data and parameters at high speed by utilizing the boosting.

In the AI system 4041, the analog arithmetic circuit 4011, the DOSRAM 4012, the NOSRAM 4013, and the FPGA 4014 can be provided on one die (chip). Thus, the AI system 4041 can perform calculation of the neural network quickly with low power consumption. The analog arithmetic circuit 4011, the DOSRAM 4012, the NOSRAM 4013, and the FPGA 4014 can be manufactured through the same manufacturing process. This enables the AI system 4041 to be manufactured at low cost.

Note that the arithmetic portion 4010 does not need to include all of the following: the DOSRAM 4012, the NOSRAM 4013, and the FPGA 4014. One or more memories are selected from the DOSRAM 4012, the NOSRAM 4013, and the FPGA 4014 in accordance with a problem that is desired to be solved in the AI system 4041.

The AI system 4041 can implement a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for implementing at least one of the methods. Part or the whole of the program may be stored in the NOSRAM 4013.

Most of the existing programs used as libraries are designed on the premise that the programs are processed by a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, the learning and inference can be performed at high speed.

The power supply circuit 4027 generates not only a low power supply potential for a logic circuit but also a potential for an analog operation. The power supply circuit 4027 may include an OS memory. In that case, storing a reference potential in the OS memory can reduce the power consumption of the power supply circuit 4027.

The PMU 4028 is configured to temporarily stop the power supply to the AI system 4041.

As a register in each of the CPU 4021 and the GPU 4022, an OS memory is preferably included. By including the OS memory, each of the CPU 4021 and the GPU 4022 can retain data (logic value) in the OS memory even when power supply is stopped. As a result, the AI system 4041 can save the power.

The PLL 4023 is configured to generate a clock. The AI system 4041 performs an operation on the basis of the clock generated by the PLL 4023. The PLL 4023 preferably includes an OS memory. When an OS memory is included in the PLL 4023, an analog potential with which the clock oscillation frequency is controlled can be held.

The AI system 4041 may store data in an external memory such as a DRAM. For this reason, the AI system 4041 preferably includes the memory controller 4026 functioning as an interface with the external DRAM. Furthermore, the memory controller 4026 is preferably provided near the CPU 4021 or the GPU 4022. Thus, quick data transmission can be achieved.

Some or all of the circuits illustrated in the control portion 4020 can be formed on the same die as the arithmetic portion 4010. Thus, the AI system 4041 can execute neural network calculation at high speed with low power consumption.

Data used for neural network calculation is stored in an external storage device such as a hard disk drive (HDD) or a solid state drive (SSD) in many cases. Therefore, the AI system 4041 preferably includes the external memory control circuit 4031 functioning as an interface with the external storage device.

Because audio and video are often subjects of the learning and inference using the neural network, the AI system 4041 includes the audio codec 4032 and the video codec 4033. The audio codec 4032 encodes and decodes audio data, and the video codec 4033 encodes and decodes video data.

The AI system 4041 can perform learning or make an inference using data obtained from an external sensor. For this reason, the AI system 4041 includes the general-purpose input/output module 4034. The general-purpose input/output module 4034 includes a universal serial bus (USB), an inter-integrated circuit (I2C), or the like, for example.

The AI system 4041 can perform learning or make an inference using data obtained via the Internet. For this reason, the AI system 4041 preferably includes the communication module 4035.

The analog arithmetic circuit 4011 may include a multilevel flash memory as an analog memory. However, the flash memory has a limit on the number of rewriting times. In addition, the multi-level flash memory is extremely difficult to embed; in other words, the arithmetic circuit and the memory are difficult to form on the same die.

Alternatively, the analog arithmetic circuit 4011 may include a ReRAM as an analog memory. However, the ReRAM has a limit on the number of rewriting times and also has a problem in storage accuracy. Moreover, because the ReRAM is a two-terminal element, the complicated circuit design is necessary for separating data writing and data reading.

Further alternatively, the analog arithmetic circuit 4011 may include an MRAM as an analog memory. However, the MRAM has a problem in storage accuracy because of its low magnetoresistive ratio.

In consideration of the above, an OS memory is preferably used as an analog memory in the analog arithmetic circuit 4011.

The structure described in this embodiment can be used in appropriate combination with any of the structures described in the other embodiments.

Embodiment 5

<Application Example of AI System>

In this embodiment, application examples of the AI system described in the above embodiment will be described with reference to FIGS. 35A and 35B.

Figure 35A:
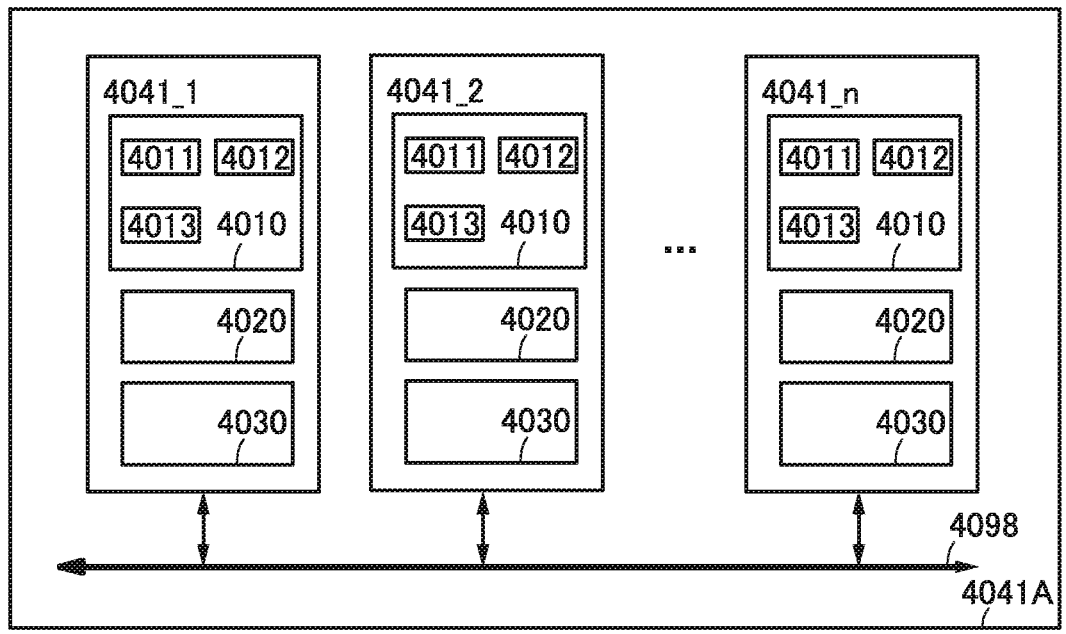
FIGS. 35A and 35B are block diagrams each illustrating an application example of an AI system according to one embodiment of the present invention.

FIG. 35A illustrates an AI system 4041A in which the AI systems 4041 described with FIG. 34 are arranged parallel to each other and a signal can be transmitted between the systems via a bus line.

The AI system 4041A illustrated in FIG. 35A includes AI systems 4041_1 to 4041_n (n is a natural number). The AI systems 4041_1 to 4041_n are connected to each other via a bus line 4098.

Figure 35B:
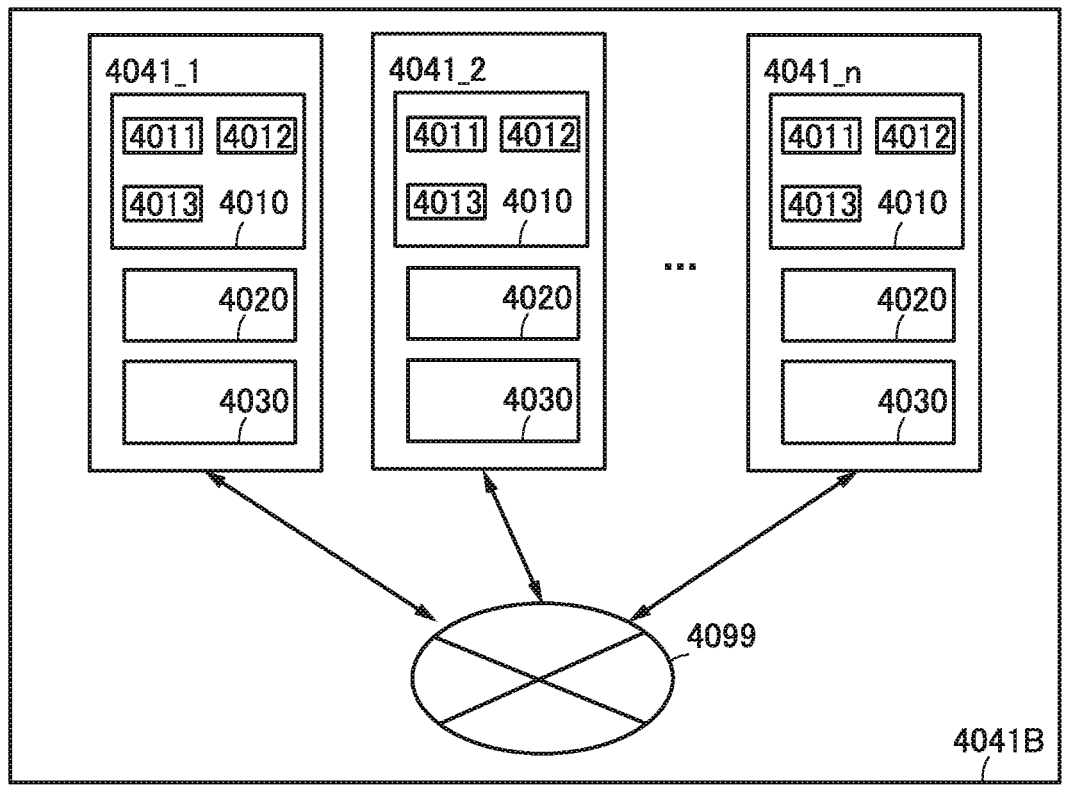

FIG. 35B illustrates an AI system 4041B in which the AI systems 4041 described with FIG. 34 are arranged parallel to each other as in FIG. 35A and a signal can be transmitted between the systems via a network.

The AI system 4041B illustrated in FIG. 35B includes the AI systems 4041_1 to 4041_n. The AI systems 4041_1 to 4041_n are connected to each other via a network 4099.

A communication module is provided in each of the AI systems 4041_1 to 4041_n; such a configuration enables wireless or wired communication via the network 4099. A communication module can communicate via an antenna. Communication can be performed when an electronic device is connected to a computer network such as the Internet (infrastructure of the World Wide Web, WWW), an intranet, an extranet, a personal area network (PAN), a local area network (LAN), a campus area network (CAN), a metropolitan area network (MAN), a wide area network (WAN), or a global area network (GAN), for example. In the case of performing wireless communication, it is possible to use, as a communication protocol or a communication technology, a communications standard such as Long-Term Evolution (LTE), Global System for Mobile Communication (GSM: registered trademark), Enhanced Data Rates for GSM Evolution (EDGE), Code Division Multiple Access 2000 (CDMA2000), or W-CDMA (registered trademark), or a communications standard developed by IEEE such as Wi-Fi (registered trademark), Bluetooth (registered trademark), or ZigBee (registered trademark).

With the configuration illustrated in FIG. 35A or FIG. 35B, analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. Since each of the AI systems performs signal processing or learning, the amount of information processed by each AI system can be reduced. Accordingly, the signal processing or learning requires a smaller amount of arithmetic processing. As a result, recognition accuracy can be increased. With the use of data obtained with each AI system, biological information that irregularly changes should be able to be collectively grasped instantly.

The structure described in this embodiment can be used in appropriate combination with any of the structures described in the other embodiments.

Embodiment 6

In this embodiment, an example of an IC incorporating the AI system described in the above embodiment will be described.

In the AI system described in the above embodiment, a digital processing circuit (e.g., a CPU) that includes a Si transistor, an analog arithmetic circuit that includes an OS transistor, an OS-FPGA, and an OS memory (e.g., a DOSRAM or a NOSRAM) can be integrated into one die.

Figure 36:
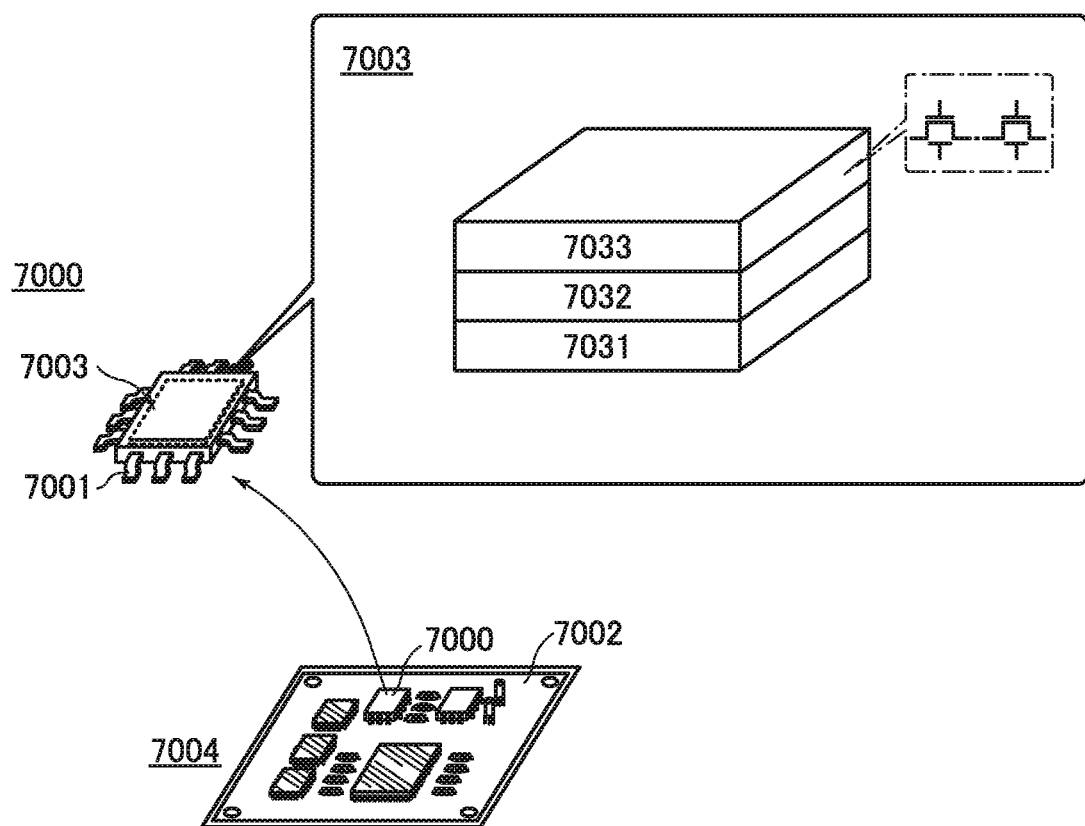
FIG. 36 is a schematic perspective view illustrating a structure example of an IC including an AI system according to one embodiment of the present invention.

FIG. 36 illustrates the example of the IC incorporating the AI system. An AI system IC 7000 illustrated in FIG. 36 includes a lead 7001 and a circuit portion 7003. The AI system IC 7000 is mounted on a printed circuit board 7002, for example. A plurality of such IC chips are combined and electrically connected to each other on the printed circuit board 7002; thus, a circuit board on which electronic components are mounted (a circuit board 7004) is formed. In the circuit portion 7003, the circuits described in the above embodiment are provided on one die. The circuit portion 7003 has a stacked-layer structure that is broadly divided into a Si transistor layer 7031, a wiring layer 7032, and an OS transistor layer 7033. Since the OS transistor layer 7033 can be stacked over the Si transistor layer 7031, the size of the AI system IC 7000 can be easily reduced.

Although a Quad Flat Package (QFP) is used as a package of the AI system IC 7000 in FIG. 36, the package is not limited thereto.

The digital processing circuit (e.g., a CPU), the analog arithmetic circuit that includes an OS transistor, the OS-FPGA, and the OS memory (e.g., a DOSRAM or a NOSRAM) can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly the AI system can be incorporated into the IC at low cost.

The structure described in this embodiment can be used in appropriate combination with any of the structures described in the other embodiments.

Embodiment 7

<Electronic Device>

The semiconductor device of one embodiment of the present invention can be used for a variety of electronic devices. FIGS. 37A to 37F each illustrate a specific example of an electronic device including the semiconductor device of one embodiment of the present invention.

Figure 37A:
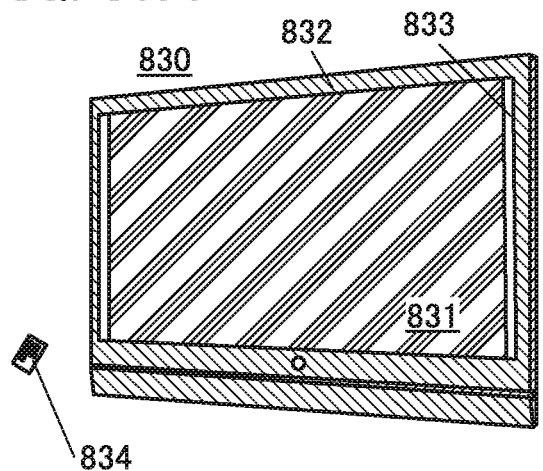
FIGS. 37A to 37F each illustrate an electronic device according to one embodiment of the present invention.

FIG. 37A illustrates a monitor 830. The monitor 830 includes a display portion 831, a housing 832, a speaker 833, and the like. The monitor 830 can also include an LED lamp, operation keys (including a power switch or an operation switch), a connection terminal, a variety of sensors, a microphone, and the like. The monitor 830 can be controlled with a remote controller 834.

The monitor 830 can function as a television device by receiving airwaves.

The monitor 830 can receive airwaves such as a ground wave or a satellite wave, airwaves for analog broadcasting or digital broadcasting, airwaves for image-and-sound broadcasting or sound-only broadcasting, or the like. For example, the monitor 830 can receive airwaves transmitted in a certain frequency band in a UHF band (higher than or equal to 300 MHz and lower than or equal to 3 GHz) or a VHF band (higher than or equal to 30 MHz and lower than or equal to 300 MHz). With the use of a plurality of pieces of data received in a plurality of frequency bands, the transfer rate can be increased and more information can thus be obtained. Accordingly, the display portion 831 can display an image with a resolution higher than the full high definition, such as 4K2K, 8K4K, 16K8K, or more.

An image to be displayed on the display portion 831 may be generated using broadcasting data transmitted with a technology for transmitting data via a computer network such as the Internet, a local area network (LAN), or Wi-Fi (registered trademark). In that case, the monitor 830 does not need to include a tuner.

The monitor 830 can be used as a computer monitor when connected to a computer. Several people can see the monitor 830 connected to a computer at the same time; thus, the monitor 830 is suitably used for a conference system. The monitor 830 can also be used for a videoconference system by displaying data in a computer via a network or being connected to a network.

Alternatively, the monitor 830 can be used as a digital signage.

The semiconductor device of one embodiment of the present invention can be used for, for example, a driver circuit or an image processing portion of the display portion, in which case high-speed operation or high-speed signal processing can be achieved with low power consumption.

When an AI system including the semiconductor device of one embodiment of the present invention is used for the image processing portion of the monitor 830, image processing such as noise removal, grayscale conversion, color tone correction, or luminance correction can be performed. Furthermore, pixel interpolation due to resolution up-conversion, frame interpolation due to frame frequency up-conversion, or the like can be performed. In the grayscale conversion, the number of grayscale levels of an image can be changed, and interpolation of the gray value in the case of increasing the number of grayscale levels can be performed. In addition, high-dynamic range (HDR) processing for increasing a dynamic range is also included in the grayscale conversion.

Figure 37B:
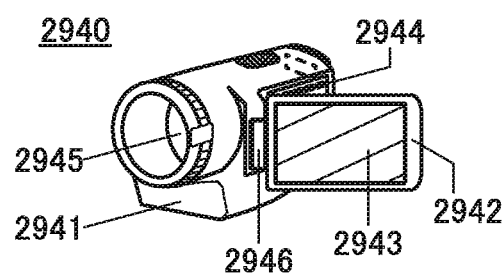

A video camera 2940 illustrated in FIG. 37B includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. The housing 2941 and the housing 2942 are connected to each other with the joint 2946, and the angle between the housings 2941 and 2942 can be changed with the joint 2946. Depending on the angle between the housings 2941 and 2942, the orientation of an image displayed on the display portion 2943 can be changed or an image can be displayed or undisplayed.

The semiconductor device of one embodiment of the present invention can be used for, for example, a driver circuit or an image processing portion of the display portion, in which case high-speed operation or high-speed signal processing can be achieved with low power consumption.

When an AI system including the semiconductor device of one embodiment of the present invention is used for the image processing portion of the video camera 2940, imaging appropriate for the surroundings of the video camera 2940 can be performed. Specifically, imaging can be performed with optimal exposure for the surrounding brightness. In the case of performing imaging with backlighting or imaging under mixed brightness conditions (e.g., indoors and outdoors), high-dynamic-range (HDR) imaging can be performed.

Furthermore, the AI system can learn user's habit and assist the user in performing imaging. Specifically, the AI system can learn user's camera shaking habit and cancel the camera shaking during imaging, so that blurring of the obtained image associated with camera shaking can be reduced as much as possible. In the case of using a zoom function during imaging, the orientation of a lens or the like can be controlled such that a subject is positioned at the center of an image all the time.

Figure 37C:
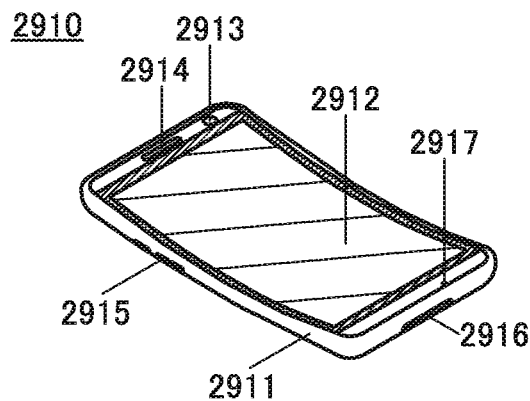

An information terminal 2910 illustrated in FIG. 37C includes a housing 2911, a display portion 2912, a microphone 2917, a speaker portion 2914, a camera 2913, an external connection portion 2916, operation switches 2915, and the like. A touch screen and a display panel formed using flexible substrates are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

A memory device including the semiconductor device of one embodiment of the present invention can hold control data, a control program, or the like of the information terminal 2910 for a long time, for example.

When an AI system including the semiconductor device of one embodiment of the present invention is used for the image processing portion of the information terminal 2910, image processing such as noise removal, grayscale conversion, tone correction, or luminance correction can be performed. Furthermore, pixel interpolation due to resolution up-conversion, frame interpolation due to frame frequency up-conversion, or the like can be performed. In the grayscale conversion, the number of grayscale levels of an image can be changed, and interpolation of the gray value in the case of increasing the number of grayscale levels can be performed. In addition, high-dynamic range (HDR) processing for increasing a dynamic range is also included in the grayscale conversion.

Furthermore, the AI system can learn user's habit and assist the user in operating the information terminal 2910. The information terminal 2910 incorporating the AI system can predict touch input from the motion of user's fingers, eyes, or the like.

Figure 37D:
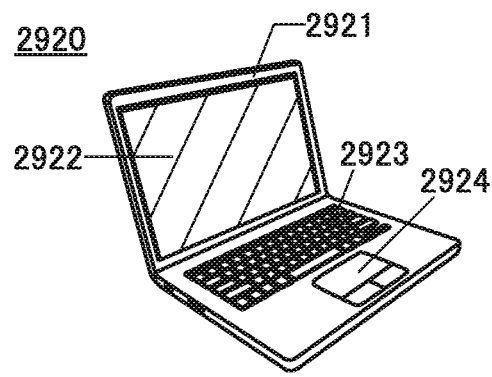

A notebook personal computer 2920 illustrated in FIG. 37D includes a housing 2921, a display portion 2922, a keyboard 2923, a pointing device 2924, and the like. The notebook personal computer 2920 also includes an antenna, a battery, and the like inside the housing 2921.

A memory device including the semiconductor device of one embodiment of the present invention can hold control data, a control program, or the like of the notebook personal computer 2920 for a long time, for example.

When an AI system including the semiconductor device of one embodiment of the present invention is used for the image processing portion of the notebook personal computer 2920, image processing such as noise removal, grayscale conversion, tone correction, or luminance correction can be performed. Furthermore, pixel interpolation due to resolution up-conversion, frame interpolation due to frame frequency up-conversion, or the like can be performed. In the grayscale conversion, the number of grayscale levels of an image can be changed, and interpolation of the gray value in the case of increasing the number of grayscale levels can be performed. In addition, high-dynamic range (HDR) processing for increasing a dynamic range is also included in the grayscale conversion.

Furthermore, the AI system can learn user's habit and assist the user in operating the notebook personal computer 2920. The notebook personal computer 2920 incorporating the AI system can predict touch input to the display portion 2922, from the motion of user's finger, eyes, or the like. In texting, the AI system predicts input from the past input text or a text or a diagram (e.g., a photograph) around the text to be input, to assist conversion. Accordingly, input mistakes and conversion mistakes can be reduced as much as possible.

Figure 37E:
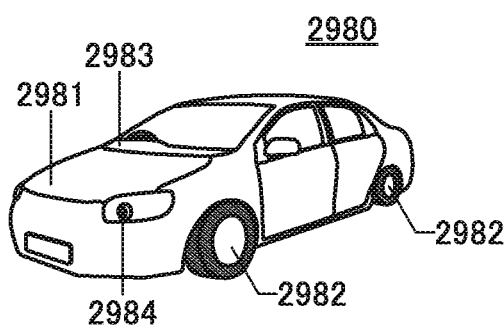
Figure 37F:
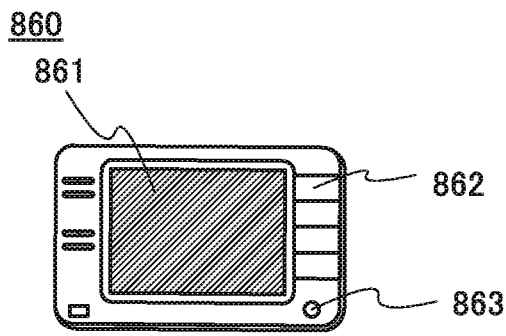

FIG. 37E is an external view illustrating an example of an automobile. FIG. 37F illustrates a navigation device 860. An automobile 2980 includes a car body 2981, wheels 2982, a dashboard 2983, lights 2984, and the like. The automobile 2980 also includes an antenna, a battery, and the like. The navigation device 860 includes a display portion 861, operation buttons 862, and an external input terminal 863. The automobile 2980 and the navigation device 860 can be independent of each other; however, it is preferable that the navigation device 860 be incorporated into and linked to the automobile 2980.

A memory device including the semiconductor device of one embodiment of the present invention can hold control data, a control program, or the like of the automobile 2980 or the navigation device 860 for a long time, for example. When an AI system including the semiconductor device of one embodiment of the present invention is used for a control device or the like of the automobile 2980, the AI system can learn driver's driving skill and habit and assist the driver in safe driving or driving involving efficient use of fuel such as gasoline or a battery. To assist the driver in safe driving, the AI system learns not only driver's driving skill and habit, but also learns the behavior of the automobile 2980 such as the speed and movement, road information saved in the navigation device 860, and the like complexly; thus, lane departure and collision with other automobiles, pedestrians, objects, and the like can be prevented. Specifically, when there is a sharp curve ahead, the navigation device 860 transmits the road information to the automobile 2980 so that the speed of the automobile 2980 can be controlled and steering can be assisted.

This embodiment can be implemented in an appropriate combination with any of the structures described in the other embodiments and the like.

REFERENCE NUMERALS

100: capacitor, 100*a*: capacitor, 100*b*: capacitor, 110: conductor, 110*a*: conductor, 110*b*: conductor, 120*a*: conductor, 120*b*: conductor, 130: insulator, 200: transistor, 200*a*: transistor, 200*b*: transistor, 203*a*: conductor, 203*b*: conductor, 205: conductor, 205_1: conductor, 205_1*a*: conductor, 205_1*b*: conductor, 205_2: conductor, 205_2*a*: conductor, 205_2*b*: conductor, 210: insulator, 212: insulator, 214: insulator, 216: insulator, 218: conductor, 220: insulator, 222: insulator, 224: insulator, 230: oxide, 230_1*c*: oxide, 230_2*c*: oxide, 230*a*: oxide, 230A: oxide film, 230*b*: oxide, 230B: oxide film, 230*c*: oxide, 230C: oxide film, 231: region, 231*a*: region, 231*b*: region, 232: region, 232*a*: region, 232*b*: region, 234: region, 240: conductor, 240*a*: conductor, 240*b*: conductor, 240*c*: conductor, 242: region, 242A: film, 246: conductor, 248: conductor, 250: insulating film, 250*a*: insulator, 250*b*: insulator, 253: conductor, 260: conductive film, 260*a*: conductor, 260*b*: conductor, 270: insulating film, 270*a*: insulator, 270*b*: insulator, 271: insulating film, 271*a*: insulator, 271*b*: insulator, 274: insulator, 275: insulating film, 275*a*: insulator, 275*b*: insulator, 280: insulator, 284: insulator, 286: insulator, 288: insulator, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 366: conductor, 372: insulator, 374: insulator, 376: conductor, 400: transistor, 403: conductor, 405: conductor, 405*a*: conductor, 405*b*: conductor, 424: insulator, 430*c*: oxide, 431*a*: oxide, 431*b*: oxide, 432*a*: oxide, 432*b*: oxide, 450: insulator, 452: insulator, 460: conductor, 460*a*: conductor, 460*b*: conductor, 470: insulator, 471: insulator, 472: insulator, 474: insulator, 475: insulator, 600: cell, 601: cell, 830: monitor, 831: display portion, 832: housing, 833: speaker, 834: remote controller, 860: navigation device, 861: display portion, 862: operation buttons, 863: external input terminal, 1003: wiring, 1004*a*: wiring, 1004*b*: wiring, 1005*a*: wiring, 1005*b*: wiring, 1006*a*: wiring, 1006*b*: wiring, 1007: wiring, 1008: wiring, 1009: wiring, 1010: wiring, 1400: DOSRAM, 1405: controller, 1410: row circuit, 1411: decoder, 1412: word line driver circuit, 1413: column selector, 1414: sense amplifier driver circuit, 1415: column circuit, 1416: global sense amplifier array, 1417: input/output circuit, 1420: MC-SA array, 1422: memory cell array, 1423: sense amplifier array, 1425: local memory cell array, 1426: local sense amplifier array, 1444: switch array, 1445: memory cell, 1445*a*: memory cell, 1445*b*: memory cell, 1446: sense amplifier, 1447: global sense amplifier, 2000: CDMA, 2910: information terminal, 2911: housing, 2912: display portion, 2913: camera, 2914: speaker portion, 2915: operation switches, 2916: external connection portion, 2917: microphone, 2920: notebook personal computer, 2921: housing, 2922: display portion, 2923: keyboard, 2924: pointing device, 2940: video camera, 2941: housing, 2942: housing, 2943: display portion, 2944: operation switches, 2945: lens, 2946: joint, 2980: automobile, 2981: car body, 2982: wheels, 2983: dashboard, 2984: lights, 3001: wiring, 3002: wiring, 3003: wiring, 3004*a*: wiring, 3004*b*: wiring, 3005*a*: wiring, 3005*b*: wiring, 3006*a*: wiring, 3006*b*: wiring, 3007: wiring, 3564: conductor, 4010: arithmetic portion, 4011: analog arithmetic circuit, 4012: DOSRAM, 4013: NOSRAM, 4014: FPGA, 4020: control portion, 4021: CPU, 4022: GPU, 4023: PLL, 4025: PROM, 4026: memory controller, 4027: power supply circuit, 4028: PMU, 4030: input/output portion, 4031: external memory control circuit, 4032: audio codec, 4033: video codec, 4034: general-purpose input/output module, 4035: communication module, 4041: AI system, 4041_*n*: AI system, 4041_1: AI system, 4041A: AI system, 4041B: AI system, 4098: bus line, 4099: network, 7000: AI system IC, 7001: lead, 7003: circuit portion, 7031: Si transistor layer, 7032: wiring layer, and 7033: OS transistor layer.

This application is based on Japanese Patent Application Serial No. 2017-144764 filed with Japan Patent Office on Jul. 26, 2017, the entire contents of which are hereby incorporated by reference.

The invention claimed is:

1. A semiconductor device comprising:
a first transistor;
a second transistor;
a first capacitor;
a second capacitor; and
a plug,
wherein the first transistor comprises:
an oxide semiconductor;
a first insulator over the oxide semiconductor;
a first conductor over the first insulator; and
a second insulator in contact with a side surface of the first conductor,
wherein the second transistor comprises:
the oxide semiconductor;
a third insulator over the oxide semiconductor;
a second conductor over the third insulator; and a fourth insulator in contact with a side surface of the second conductor, wherein the first capacitor comprises:
- a third conductor over the oxide semiconductor and in contact with the second insulator;
- a fifth insulator over the third conductor; and
- a fourth conductor over the fifth insulator, wherein the second capacitor comprises:
- a fifth conductor over the oxide semiconductor and in contact with the fourth insulator;
- the fifth insulator over the fifth conductor; and
- a sixth conductor over the fifth insulator, wherein the plug is in contact with the oxide semiconductor, the second insulator, and the fourth insulator, wherein a side surface area of the first capacitor is larger than a projected area of the first capacitor, and wherein a side surface area of the second capacitor is larger than a projected area of the second capacitor.

2. The semiconductor device according to claim 1,
wherein the oxide semiconductor comprises a first channel formation region and a second channel formation region,
wherein the first conductor overlaps with the first channel formation region, and
wherein the second conductor overlaps with the second channel formation region.

3. The semiconductor device according to claim 2,
wherein the oxide semiconductor further comprises a first region and a second region,
wherein the plug overlaps with the first region,
wherein the second region is between the first region and the first channel formation region,
wherein the first region has a higher carrier density than the second region, and
wherein the second region has a higher carrier density than the first channel formation region.

4. The semiconductor device according to claim 1, further comprising:
- a sixth insulator over the first transistor and the second transistor; and
- a seventh insulator over the first capacitor, the second capacitor, and the sixth insulator, wherein the sixth insulator comprises a first opening exposing the first insulator and a second opening exposing the third insulator,
wherein the first capacitor is in the first opening,
wherein the second capacitor is in the second opening,
wherein the sixth insulator and the seventh insulator comprise a third opening exposing the first insulator and the second insulator, and
wherein the plug is in the third opening.

5. The semiconductor device according to claim 4, further comprising a seventh conductor over the seventh insulator and the plug,
wherein the seventh conductor is electrically connected to the plug.

6. The semiconductor device according to claim 5,
wherein the first conductor and the second conductor extend in a direction substantially perpendicular to a channel length direction of the first transistor, and
wherein the seventh conductor extends in a direction substantially parallel to the channel length direction of the first transistor.

7. The semiconductor device according to claim 1,
wherein the oxide semiconductor comprises In, an element M, and Zn, and
wherein the element M is Al, Ga, Y, or Sn.

* * * * *